US012660326B2

(12) United States Patent
Or-Bach et al.

(10) Patent No.: US 12,660,326 B2
(45) Date of Patent: *Jun. 16, 2026

(54) METHODS TO PROCESS 3D SEMICONDUCTOR DEVICES AND STRUCTURES WHICH HAVE METAL LAYERS

(71) Applicant: Monolithic 3D Inc., Klamath Falls, OR (US)

(72) Inventors: Zvi Or-Bach, Haifa (IL); Brian Cronquist, Klamath Falls, OR (US)

(73) Assignee: Monolithic 3D Inc., Allen, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/247,934

(22) Filed: Jun. 24, 2025

(65) Prior Publication Data

US 2026/0075952 A1 Mar. 12, 2026

Related U.S. Application Data

(63) Continuation-in-part of application No. 18/959,033, filed on Nov. 25, 2024, now Pat. No. 12,376,382,
(Continued)

(51) Int. Cl.
H10D 88/00 (2026.01)
G03F 9/00 (2006.01)
(Continued)

(52) U.S. Cl.
CPC ........... H10D 88/00 (2025.01); G03F 9/7076 (2013.01); G03F 9/7084 (2013.01); H10B 10/00 (2023.02);
(Continued)

(58) Field of Classification Search
CPC ...... H10D 88/00; H10D 10/051; H10D 10/40; H10D 30/0512; H10D 30/061;
(Continued)

(56) References Cited

U.S. PATENT DOCUMENTS 8,679,977 B2 * 3/2014 Wells ..................... H10B 63/10
365/163
11,869,965 B2 * 1/2024 Or-Bach ................ H10B 63/10
(Continued)

*Primary Examiner* — Tan N Tran
(74) *Attorney, Agent, or Firm* — PatentPC PowerPatent; Bao Tran

(57) ABSTRACT

A method to process a semiconductor device: processing the substrate forming a first level with a first single-crystal silicon-layer, first transistors, input-and-output ("IO") circuits; forming a first metal-layer; forming a second metal-layer including a power-delivery network, where interconnection of the first transistors includes the first metal-layer and the second metal-layer; processing a second level including second transistors with metal gates and a first array of memory-cells; processing a third level including a plurality of third transistors with metal gates and a second array of memory-cells; third level disposed over the second level; forming a fourth metal-layer over a third metal-layer over the third-level; processing a fourth level including a second single-crystal silicon-layer, fourth level is disposed over the fourth metal-layer; forming a via disposed through the second and third levels, connections of the device to external devices includes the "IO"-circuits; the second level is disposed over the first level.

16 Claims, 76 Drawing Sheets

Related U.S. Application Data which is a continuation-in-part of application No. 18/668,218, filed on May 19, 2024, now Pat. No. 12,199,093, which is a continuation-in-part of application No. 18/603,526, filed on Mar. 13, 2024, now Pat. No. 12,027,518, which is a continuation-in-part of application No. 18/128,505, filed on Mar. 30, 2023, now Pat. No. 11,984,445, which is a continuation-in-part of application No. 17/827,705, filed on May 28, 2022, now Pat. No. 11,646,309, which is a continuation-in-part of application No. 16/936,352, filed on Jul. 22, 2020, now Pat. No. 11,374,118, which is a continuation-in-part of application No. 16/242,300, filed on Jan. 8, 2019, now Pat. No. 10,910,364, which is a continuation-in-part of application No. 15/922,913, filed on Mar. 16, 2018, now Pat. No. 10,354,995, which is a continuation-in-part of application No. 15/409,740, filed on Jan. 19, 2017, now Pat. No. 9,941,332, which is a continuation-in-part of application No. 15/224,929, filed on Aug. 1, 2016, now Pat. No. 9,853,089, which is a continuation-in-part of application No. 14/514,386, filed on Oct. 15, 2014, now Pat. No. 9,406,670, which is a continuation of application No. 13/492,382, filed on Jun. 8, 2012, now Pat. No. 8,907,442, which is a continuation of application No. 13/246,384, filed on Sep. 27, 2011, now Pat. No. 8,237,228, which is a continuation of application No. 12/900,379, filed on Oct. 7, 2010, now Pat. No. 8,395,191, which is a continuation-in-part of application No. 12/859,665, filed on Aug. 19, 2010, now Pat. No. 8,405,420, which is a continuation-in-part of application No. 12/849,272, filed on Aug. 3, 2010, now Pat. No. 7,986,042, and a continuation-in-part of application No. 12/847,911, filed on Jul. 30, 2010, now Pat. No. 7,960,242, which is a continuation-in-part of application No. 12/797,493, filed on Jun. 9, 2010, now Pat. No. 8,115,511, and a continuation-in-part of application No. 12/792,673, filed on Jun. 2, 2010, now Pat. No. 7,964,916, and a continuation-in-part of application No. 12/706,520, filed on Feb. 16, 2010, now abandoned, said application No. 12/797,493 is a continuation-in-part of application No. 12/577,532, filed on Oct. 12, 2009, now abandoned, said application No. 12/792,673 is a continuation-in-part of application No. 12/577,532, filed on Oct. 12, 2009, now abandoned.

(51) Int. Cl.

| | |
|---|---|
| H10B 10/00 | (2023.01) |
| H10B 12/00 | (2023.01) |
| H10B 20/00 | (2023.01) |
| H10B 41/20 | (2023.01) |
| H10B 43/20 | (2023.01) |
| H10D 10/01 | (2025.01) |
| H10D 10/40 | (2025.01) |
| H10D 30/01 | (2025.01) |
| H10D 30/67 | (2025.01) |
| H10D 30/83 | (2025.01) |
| H10D 30/87 | (2025.01) |
| H10D 62/83 | (2025.01) |
| H10D 64/01 | (2025.01) |
| H10D 84/01 | (2025.01) |
| H10D 84/03 | (2025.01) |
| H10D 84/85 | (2025.01) |
| H10D 84/90 | (2025.01) |
| H10D 86/00 | (2025.01) |
| H10D 86/01 | (2025.01) |
| H10D 89/10 | (2025.01) |
| H10P 90/00 | (2026.01) |
| H10W 10/10 | (2026.01) |
| H10W 20/00 | (2026.01) |
| H10W 20/20 | (2026.01) |
| H10W 20/42 | (2026.01) |
| H10W 20/43 | (2026.01) |
| H10W 20/44 | (2026.01) |
| H10W 40/22 | (2026.01) |
| H10W 46/00 | (2026.01) |
| H10D 84/83 | (2025.01) |
| H10P 34/42 | (2026.01) |
| H10W 72/00 | (2026.01) |
| H10W 72/50 | (2026.01) |
| H10W 74/00 | (2026.01) |
| H10W 74/15 | (2026.01) |
| H10W 90/00 | (2026.01) |

(52) U.S. Cl.
CPC ......... H10B 10/125 (2023.02); H10B 12/053 (2023.02); H10B 12/09 (2023.02); H10B 12/50 (2023.02); H10B 20/00 (2023.02); H10B 41/20 (2023.02); H10B 43/20 (2023.02); H10D 10/051 (2025.01); H10D 10/40 (2025.01); H10D 30/0512 (2025.01); H10D 30/061 (2025.01); H10D 30/6727 (2025.01); H10D 30/6728 (2025.01); H10D 30/6733 (2025.01); H10D 30/6735 (2025.01); H10D 30/6737 (2025.01); H10D 30/6743 (2025.01); H10D 30/83 (2025.01); H10D 30/87 (2025.01); H10D 62/83 (2025.01); H10D 64/027 (2025.01); H10D 84/0186 (2025.01); H10D 84/038 (2025.01); H10D 84/85 (2025.01); H10D 84/907 (2025.01); H10D 84/998 (2025.01); H10D 86/01 (2025.01); H10D 86/201 (2025.01); H10D 88/01 (2025.01); H10D 89/10 (2025.01); H10P 90/1916 (2026.01); H10W 10/181 (2026.01); H10W 20/023 (2026.01); H10W 20/20 (2026.01); H10W 20/42 (2026.01); H10W 20/43 (2026.01); H10W 20/4405 (2026.01); H10W 20/4421 (2026.01); H10W 40/22 (2026.01); H10W 46/00 (2026.01); H10D 64/017 (2025.01); H10D 84/83 (2025.01); H10P 34/42 (2026.01); H10W 46/101 (2026.01); H10W 46/301 (2026.01); H10W 46/501 (2026.01); H10W 72/5524 (2026.01); H10W 72/5525 (2026.01); H10W 72/877 (2026.01); H10W 72/884 (2026.01); H10W 74/00 (2026.01); H10W 74/15 (2026.01); H10W 90/722 (2026.01); H10W 90/724 (2026.01); H10W 90/732 (2026.01); H10W 90/734 (2026.01); H10W 90/754 (2026.01)

(58) Field of Classification Search
CPC .......... H10D 30/6727; H10D 30/6728; H10D 30/6733; H10D 30/6735; H10D 30/6737; H10D 30/6743; H10D 30/83; H10D 30/87; H10D 62/83; H10D 64/027; H10D 84/0186; H10D 84/038; H10D 84/85; H10D 84/907; H10D 84/998; H10D 86/01; H10D 86/201; H10D 88/01; H10D 89/10; H10D 64/017; H10D 84/83; G03F 9/7076; G03F 9/7084; H10B 10/00;

H10B 10/125; H10B 12/053; H10B
12/09; H10B 12/50; H10B 20/00; H10B
41/20; H10B 43/20; H10P 90/1916; H10P
34/42; H10W 10/181; H10W 20/023;
H10W 20/20; H10W 20/42; H10W 20/43;
H10W 20/4405; H10W 20/4421; H10W
40/22; H10W 46/00; H10W 46/101;
H10W 46/301; H10W 46/501; H10W
72/5524; H10W 72/5525; H10W 72/877;
H10W 72/884; H10W 74/00; H10W
74/15; H10W 90/722; H10W 90/724;
H10W 90/732; H10W 90/734; H10W
90/754

See application file for complete search history.

(56) References Cited

U.S. PATENT DOCUMENTS

| | | | | |
|---|---|---|---|---|
| 11,935,949 B1 * | 3/2024 | Or-Bach | ................. | H10B 43/20 |
| 12,051,674 B2 * | 7/2024 | Or-Bach | ................. | H10D 88/01 |
| 12,094,965 B2 * | 9/2024 | Or-Bach | ................. | H10B 63/30 |
| 12,278,216 B2 * | 4/2025 | Or-Bach | ................. | H10D 88/01 |
| 12,376,382 B2 * | 7/2025 | Or-Bach | ............... | G03F 9/7076 |

* cited by examiner

Silicon Oxide 320

N+ Silicon 306'

Silicon Oxide 308

Silicon Oxide 304

Peripheral circuits 302

323

314

N+ Si
326

Oxide
322

Silicon Oxide

Peripheral circuits 302

Symbols

N+ Silicon 326

Silicon oxide 322

N+ Si
326

330

Oxide
322

Silicon Oxide

Peripheral circuits 302

Symbols

Gate electrode 330

Gate dielectric 328 n+ Silicon 326

Silicon oxide 322

Gate dielectric 328

BL contact 334

Resistance change material 338

Silicon oxide

Gate electrode 330 n+ Silicon 326

Silicon oxide

BL 336

N+ Si
426

430

Oxide
422

Silicon Oxide

Peripheral circuits 402

Symbols

Gate electrode 430

Gate dielectric 428 n+ Silicon 426

Silicon oxide 422

View along II plane

Symbols

Gate dielectric  428

BL contact  434

Resistance change
material 438

Silicon oxide

Gate electrode 430 n+ Silicon  426

Silicon oxide

BL 436

Silicon Oxide 504

Silicon Substrate 502

N+ Si
526

530

Oxide
522

Silicon Oxide

Silicon Substrate 502

Symbols n+ Silicon 526          Gate electrode 530

Silicon oxide 522          Gate dielectric 528

812 — Connection to the outside

910 — TFT layer (or SOI layers) + Programming Transistors

907 — Configurable Interconnect + second Antifuse layer

906 — Long Routing tracks, CK Distribution, Power Distribution

904 — Logic cell Fabric + M1,M2 + first Antifuse layer

902 — Silicon substrate

908 — Preprocessed wafer

Fig. 9B

909 — Transfer layer

908 — Preprocessed wafer

909

908A

908

909A — Transfer layer

908A — Preprocessed wafer

909B

Transfer layer

908B

Preprocessed wafer

1001

1002

1000A

1002

| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |

| | | | | |
|---|---|---|---|---|
| STRUCTURED ASIC | STRUCTURED ASIC | STRUCTURED ASIC | STRUCTURED ASIC | STRUCTURED ASIC |
| STRUCTURED ASIC | STRUCTURED ASIC | STRUCTURED ASIC | STRUCTURED ASIC | STRUCTURED ASIC |
| STRUCTURED ASIC | STRUCTURED ASIC | STRUCTURED ASIC | STRUCTURED ASIC | STRUCTURED ASIC |
| STRUCTURED ASIC | STRUCTURED ASIC | STRUCTURED ASIC | STRUCTURED ASIC | STRUCTURED ASIC |
| STRUCTURED ASIC | STRUCTURED ASIC | STRUCTURED ASIC | STRUCTURED ASIC | STRUCTURED ASIC |

| RAM | RAM | RAM | RAM | RAM | RAM | RAM | RAM | RAM | RAM |
|-----|-----|-----|-----|-----|-----|-----|-----|-----|-----|
| RAM | RAM | RAM | RAM | RAM | RAM | RAM | RAM | RAM | RAM |
| RAM | RAM | RAM | RAM | RAM | RAM | RAM | RAM | RAM | RAM |
| RAM | RAM | RAM | RAM | RAM | RAM | RAM | RAM | RAM | RAM |
| RAM | RAM | RAM | RAM | RAM | RAM | RAM | RAM | RAM | RAM |
| RAM | RAM | RAM | RAM | RAM | RAM | RAM | RAM | RAM | RAM |
| RAM | RAM | RAM | RAM | RAM | RAM | RAM | RAM | RAM | RAM |
| RAM | RAM | RAM | RAM | RAM | RAM | RAM | RAM | RAM | RAM |
| RAM | RAM | RAM | RAM | RAM | RAM | RAM | RAM | RAM | RAM |
| RAM | RAM | RAM | RAM | RAM | RAM | RAM | RAM | RAM | RAM |

| DRAM | DRAM | DRAM | DRAM | DRAM | DRAM | DRAM | DRAM | DRAM | DRAM |
|------|------|------|------|------|------|------|------|------|------|
| DRAM | DRAM | DRAM | DRAM | DRAM | DRAM | DRAM | DRAM | DRAM | DRAM |
| DRAM | DRAM | DRAM | DRAM | DRAM | DRAM | DRAM | DRAM | DRAM | DRAM |
| DRAM | DRAM | DRAM | DRAM | DRAM | DRAM | DRAM | DRAM | DRAM | DRAM |
| DRAM | DRAM | DRAM | DRAM | DRAM | DRAM | DRAM | DRAM | DRAM | DRAM |
| DRAM | DRAM | DRAM | DRAM | DRAM | DRAM | DRAM | DRAM | DRAM | DRAM |
| DRAM | DRAM | DRAM | DRAM | DRAM | DRAM | DRAM | DRAM | DRAM | DRAM |
| DRAM | DRAM | DRAM | DRAM | DRAM | DRAM | DRAM | DRAM | DRAM | DRAM |
| DRAM | DRAM | DRAM | DRAM | DRAM | DRAM | DRAM | DRAM | DRAM | DRAM |
| DRAM | DRAM | DRAM | DRAM | DRAM | DRAM | DRAM | DRAM | DRAM | DRAM |

| Micro Processor | Micro Processor | Micro Processor | Micro Processor | Micro Processor | Micro Processor |
|---|---|---|---|---|---|
| Micro Processor | Micro Processor | Micro Processor | Micro Processor | Micro Processor | Micro Processor |
| Micro Processor | Micro Processor | Micro Processor | Micro Processor | Micro Processor | Micro Processor |
| Micro Processor | Micro Processor | Micro Processor | Micro Processor | Micro Processor | Micro Processor |
| Micro Processor | Micro Processor | Micro Processor | Micro Processor | Micro Processor | Micro Processor |
| Micro Processor | Micro Processor | Micro Processor | Micro Processor | Micro Processor | Micro Processor |

| I/Os SERDES | I/Os SERDES | I/Os SERDES | I/Os SERDES | I/Os SERDES | I/Os SERDES | I/Os SERDES | I/Os SERDES | I/Os SERDES | I/Os SERDES |
|---|---|---|---|---|---|---|---|---|---|
| I/Os SERDES | I/Os SERDES | I/Os SERDES | I/Os SERDES | I/Os SERDES | I/Os SERDES | I/Os SERDES | I/Os SERDES | I/Os SERDES | I/Os SERDES |
| I/Os SERDES | I/Os SERDES | I/Os SERDES | I/Os SERDES | I/Os SERDES | I/Os SERDES | I/Os SERDES | I/Os SERDES | I/Os SERDES | I/Os SERDES |
| I/Os SERDES | I/Os SERDES | I/Os SERDES | I/Os SERDES | I/Os SERDES | I/Os SERDES | I/Os SERDES | I/Os SERDES | I/Os SERDES | I/Os SERDES |
| I/Os SERDES | I/Os SERDES | I/Os SERDES | I/Os SERDES | I/Os SERDES | I/Os SERDES | I/Os SERDES | I/Os SERDES | I/Os SERDES | I/Os SERDES |
| I/Os SERDES | I/Os SERDES | I/Os SERDES | I/Os SERDES | I/Os SERDES | I/Os SERDES | I/Os SERDES | I/Os SERDES | I/Os SERDES | I/Os SERDES |
| I/Os SERDES | I/Os SERDES | I/Os SERDES | I/Os SERDES | I/Os SERDES | I/Os SERDES | I/Os SERDES | I/Os SERDES | I/Os SERDES | I/Os SERDES |
| I/Os SERDES | I/Os SERDES | I/Os SERDES | I/Os SERDES | I/Os SERDES | I/Os SERDES | I/Os SERDES | I/Os SERDES | I/Os SERDES | I/Os SERDES |
| I/Os SERDES | I/Os SERDES | I/Os SERDES | I/Os SERDES | I/Os SERDES | I/Os SERDES | I/Os SERDES | I/Os SERDES | I/Os SERDES | I/Os SERDES |
| I/Os SERDES | I/Os SERDES | I/Os SERDES | I/Os SERDES | I/Os SERDES | I/Os SERDES | I/Os SERDES | I/Os SERDES | I/Os SERDES | I/Os SERDES |

Flow for '3D Partition' (To two dies connected by TSV):

18F01

18F02

Contacting
the NuVias

18F04

18F03    18F05

18F00

Bulk silicon wafers

Make TSVs,
thin wafer

18G02

18G00

18I09

18I11

18I14

18I10

18I13

18I12

18F01

18J02

18J01

18F00

METHODS TO PROCESS 3D SEMICONDUCTOR DEVICES AND STRUCTURES WHICH HAVE METAL LAYERS

CROSS-REFERENCE OF RELATED APPLICATIONS

This application is a continuation-in-part of co-pending U.S. patent application Ser. No. 18/959,033 filed Nov. 25, 2024, which is a continuation-in-part of U.S. patent application Ser. No. 18/668,218 filed May 19, 2024, (now issued as U.S. Pat. No. 12,199,093 on Jan. 14, 2025), which is a continuation-in-part of U.S. patent application Ser. No. 18/603,526 filed Mar. 13, 2024, (now issued as U.S. Pat. No. 12,027,518 on Jul. 2, 2024), which is a continuation-in-part of U.S. patent application Ser. No. 18/128,505 filed Mar. 30, 2023, (now issued as U.S. Pat. No. 11,984,445 on May 14, 2024), which is a continuation-in-part of U.S. patent application Ser. No. 17/827,705 filed May 28, 2022, (now issued as U.S. Pat. No. 11,646,309 on May 9, 2023), which is a continuation-in-part of U.S. patent application Ser. No. 16/936,352 filed Jul. 22, 2020, (now issued as U.S. Pat. No. 11,374,118 on Jun. 28, 2022), which is a continuation-in-part of U.S. patent application Ser. No. 16/242,300 filed Jan. 8, 2019, (now issued as U.S. Pat. No. 10,910,364 on Feb. 2, 2021), which is a continuation-in-part of U.S. patent application Ser. No. 15/922,913 filed Mar. 16, 2018, (now issued as U.S. Pat. No. 10,354,995 on Jul. 16, 2019), which is a continuation-in-part of U.S. patent application Ser. No. 15/409,740 filed Jan. 19, 2017, (now issued as U.S. Pat. No. 9,941,332 on Apr. 10, 2018), which is a continuation-in-part of U.S. patent application Ser. No. 15/224,929 filed Aug. 1, 2016 (now issued as U.S. Pat. No. 9,853,089 on Dec. 26, 2017), which is a continuation-in-part of U.S. patent application Ser. No. 14/514,386 filed Oct. 15, 2014 (now issued as U.S. Pat. No. 9,406,670 on Aug. 2, 2016), which is a continuation of U.S. patent application Ser. No. 13/492,382 filed Jun. 8, 2012 (now issued as U.S. Pat. No. 8,907,442 on Dec. 9, 2014), which is a continuation of U.S. patent application Ser. No. 13/246,384 filed Sep. 27, 2011 (now issued as U.S. Pat. No. 8,237,228 on Aug. 7, 2012), which is a continuation U.S. patent application Ser. No. 12/900,379 filed Oct. 7, 2010 (now issued as U.S. Pat. No. 8,395,191 on Mar. 12, 2013), which is a continuation-in-part of U.S. patent application Ser. No. 12/859,665 filed Aug. 19, 2010 (now issued as U.S. Pat. No. 8,405,420 on Mar. 26, 2013), which is a continuation-in-part of U.S. patent application Ser. No. 12/849,272 filed Aug. 3, 2010 (now issued as U.S. Pat. No. 7,986,042 on Jul. 26, 2011) and U.S. patent application Ser. No. 12/847,911 filed Jul. 30, 2010 (now issued as U.S. Pat. No. 7,960,242 on Jun. 14, 2011); U.S. patent application Ser. No. 12/847,911 is a continuation-in-part of U.S. patent application Ser. No. 12/792,673 filed Jun. 2, 2010 (now issued as U.S. Pat. No. 7,964,916 on Jun. 21, 2011), U.S. patent application Ser. No. 12/797,493 filed Jun. 9, 2010 (now issued as U.S. Pat. No. 8,115,511 on Feb. 14, 2012), and U.S. patent application Ser. No. 12/706,520 filed Feb. 16, 2010; both U.S. patent application Ser. No. 12/792,673 and U.S. patent application Ser. No. 12/797,493 are continuation-in-part applications of U.S. patent application Ser. No. 12/577,532 filed Oct. 12, 2009, the entire contents of all of the foregoing are incorporated herein by reference. The entire contents of U.S. application Ser. No. 13/273,712, which was filed on Oct. 14, 2011, and is now U.S. Pat. No. 8,273,610 is incorporated herein by reference.

BACKGROUND OF THE INVENTION

1. Field of the Invention

The present invention relates to the general field of Integrated Circuit (IC) devices and fabrication methods, and more particularly to multilayer or Three Dimensional Integrated Circuit (3D IC) devices and fabrication methods.

2. Discussion of Background Art

Semiconductor manufacturing is known to improve device density in an exponential manner over time, but such improvements come with a price. The mask set cost required for each new process technology has also been increasing exponentially. While 20 years ago a mask set cost less than $20,000, it is now quite common to be charged more than $1M for today's state of the art device mask set.

These changes represent an increasing challenge primarily to custom products, which tend to target smaller volume and less diverse markets therefore making the increased cost of product development very hard to accommodate.

Over the past 40 years, there has been a dramatic increase in functionality and performance of Integrated Circuits (ICs). This has largely been due to the phenomenon of "scaling"; i.e., component sizes such as lateral and vertical dimensions within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450,804, 8,557,632, 8,574,929, 8,581,349, 8,642,416, 8,669,778, 8,674,470, 8,687,399, 8,742,476, 8,803,206, 8,836,073, 8,902,663, 8,994,404, 9,023,688, 9,029,173, 9,030,858, 9,117,749, 9,142,553, 9,219,005, 9,385,058, 9,406,670, 9,460,978, 9,509,313, 9,640,531, 9,691,760, 9,711,407, 9,721,927, 9,799,761, 9,871,034, 9,953,870, 9,953,994, 10,014,292, 10,014,318, 10,515,981, 10,892,016, 10,991,675, 11,121,121, 11,502,095, 10,892,016, 11,270,988; and pending U.S. Patent Application Publications and applications, Ser. No. 14/642,724, Ser. No. 15/150,395, Ser. No. 15/173,686, 62/651,722; 62/681,249, 62/713,345, 62/770,751, 62/952,222, 62/824,288, 63/075,067, 63/091,307, 63/115,000, 63/220,443, 2021/0242189, 2020/0013791; and PCT Applications (and Publications): PCT/US2010/052093, PCT/US2011/042071 (WO2012/015550), PCT/US2016/52726 (WO2017053329), PCT/US2017/052359 (WO2018/071143), PCT/US2018/016759 (WO2018144957), PCT/US2018/52332 (WO 2019/060798), PCT/US2021/44110, and PCT/US22/44165. The entire contents of all of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679,977, 10,943,934, 10,998,374, 11,063,071, and 11,133,344. The entire contents of all of the foregoing patents, publications, and applications are incorporated herein by reference.

In landmark papers at VLSI 2007 and IEDM 2007, Toshiba presented techniques to construct 3D memories which they called—BiCS. Many of the memory vendors followed that work by variation and alternatives mostly for non-volatile memory applications, such as now being referred to as 3D-NAND. They provide an important manufacturing advantage of being able to utilize one, usually 'critical', lithography step for the patterning of multiple layers. The vast majority of these 3D Memory schemes use poly-silicon for the active memory cell channel which suffers from higher cell to cell performance variations and lower drive than a cell with a monocrystalline channel. In at least our U.S. Pat. Nos. 8,026,521, 8,114,757, 8,687,399, 8,379,458, and 8,902,663, incorporated herein by reference, we presented multiple 3D memory structures generally constructed by successive layer transfers using ion cut techniques. In this work we are presenting methods and structures to construct 3D memory with monocrystalline channels constructed by successive layer transfers. This structure provides the benefit of multiple layers being processed by one lithography step with many of the benefits of a monocrystalline channel, and provides overall lower construction costs.

Additionally some embodiments of the invention may provide innovative alternatives for multi layer 3D IC technology. As on-chip interconnects are becoming the limiting factor for performance and power enhancement with device scaling, 3D IC may be an important technology for future generations of ICs. Currently the only viable technology for 3D IC is to finish the IC by the use of Through-Silicon-Via (TSV). The problem with TSVs is that they are relatively large (a few microns each in area) and therefore may lead to highly limited vertical connectivity. The current invention may provide multiple alternatives for 3D IC with at least an order of magnitude improvement in vertical connectivity.

Other techniques could also be used such as employing Silicon On Insulator (SOI) technology. In U.S. Pat. Nos. 6,355,501 and 6,821,826, both assigned to IBM, a multilayer three-dimensional Complementary Metal-Oxide-Semiconductor (CMOS) Integrated Circuit is proposed. It suggests bonding an additional thin SOI wafer on top of another SOI wafer forming an integrated circuit on top of another integrated circuit and connecting them by the use of a through-silicon-via, or thru layer via (TLV). Substrate supplier Soitec SA, of Bernin, France is now offering a technology for stacking of a thin layer of a processed wafer on top of a base wafer.

Integrating top layer transistors above an insulation layer is not common in an IC because the quality and density of prior art top layer transistors are inferior to those formed in the base (or substrate) layer. The substrate may be formed of mono-crystalline silicon and may be ideal for producing high density and high quality transistors, and hence preferable. There are some applications where it has been suggested to build memory cells using such transistors as in U.S. Pat. Nos. 6,815,781, 7,446,563 and a portion of an SRAM based FPGA such as in U.S. Pat. Nos. 6,515,511 and 7,265,421.

Embodiments of the current invention seek to take advantage of the top layer transistor to provide a much higher density antifuse-based programmable logic. An additional advantage for such use will be the option to further reduce cost in high volume production by utilizing custom mask(s) to replace the antifuse function, thereby eliminating the top layer(s) anti-fuse programming logic altogether.

Additionally some embodiments of the invention may provide innovative alternatives for multi layer 3D IC technology. As on-chip interconnects are becoming the limiting factor for performance and power enhancement with device scaling, 3D IC may be an important technology for future generations of ICs. Currently the only viable technology for 3D IC is to finish the IC by the use of Through-Silicon-Via (TSV). The problem with TSVs is that they are relatively large (a few microns each in area) and therefore may lead to highly limited vertical connectivity. The current invention may provide multiple alternatives for 3D IC with an order of magnitude improvement in vertical connectivity.

Constructing future 3D ICs will require new architectures and new ways of thinking. In particular, yield and reliability of extremely complex three dimensional systems will have to be addressed, particularly given the yield and reliability difficulties encountered in building complex Application Specific Integrated Circuits (ASIC) of recent deep submicron process generations.

Constructing future 3D ICs will require new architectures and new ways of thinking. In particular, yield and reliability of extremely complex three dimensional systems will have to be addressed, particularly given the yield and reliability difficulties encountered in building complex Application Specific Integrated Circuits (ASIC) of recent deep submicron process generations.

Additionally the 3D technology according to some embodiments of the current invention may enable some very innovative IC alternatives with reduced development costs, increased yield, and other important benefits.

SUMMARY

The invention relates to multilayer or Three Dimensional Integrated Circuit (3D IC) devices and fabrication methods.

In one aspect, a 3D device, the device comprising: a first level comprising first single crystal transistors; overlaid by a second level comprising second single crystal transistors, wherein said first level is overlaid by said second level; a third level comprising third single crystal transistors, wherein said second level is overlaid by said third level; a fourth level comprising fourth single crystal transistors, wherein said third level is overlaid by said fourth level; first bond regions comprising first oxide to oxide bonds, wherein said first bond regions are disposed between said first level and said second level; second bond regions comprising second oxide to oxide bonds, wherein said second bond regions are disposed between said second level and said third level; and third bond regions comprising third oxide to oxide bonds, wherein said third bond regions are disposed between said third level and said fourth level, wherein said second level, said third level, and said fourth level each comprise at least one array of memory cells, and wherein said at least one array of memory cells is a DRAM type memory.

In another aspect, a first 3D device, the device comprising: a first level comprising first single crystal transistors; a second level comprising second single crystal transistors, wherein said first level is overlaid by said second level; and a second 3D device comprising: a third level comprising third single crystal transistors; a fourth level comprising fourth single crystal transistors, wherein said third level is overlaid by said fourth level; and wherein said second level and said fourth level comprise at least a similar 20 levels of lithography based patterns, and wherein said first level and said third level comprise less than 4 similar levels of lithography based patterns.

In another aspect, a 3D device, the device comprising: a first level comprising first single crystal transistors; a second level comprising second single crystal transistors, wherein said first level is overlaid by said second level; and bond regions comprising hybrid bonds, said bond regions are disposed between said first level and said second level, wherein at least one of said second transistors comprises at least two side gates, and wherein said second level comprises an array of SRAM memory cells.

In another aspect, a 3D integrated circuit, the circuit comprising: a first level comprising a first wafer, said first wafer comprising a first crystalline substrate, a plurality of first transistors, and first copper interconnecting layers, wherein said first copper interconnecting layers at least interconnect said plurality of first transistors; a second level comprising a second wafer, said second wafer comprising a second crystalline substrate, a plurality of second transistors, and second copper interconnecting layers, wherein said second copper interconnecting layers at least interconnect said plurality of second transistors, wherein said second level is bonded to said first level, wherein said bonded comprises metal to metal bonding, wherein said bonded comprises oxide to oxide bonding; and a first metal layer, a second metal layer, and a third metal layer, wherein said first metal layer, said second metal layer, and said third metal layer are disposed between said first crystalline substrate and said second crystalline substrate, wherein said second metal layer is disposed between said first said metal layer and said third metal layer, wherein said second metal layer thickness is at least double that of said first metal thickness, and wherein said second metal layer thickness is at least double that of said third metal thickness.

In another aspect, a 3D integrated circuit, the circuit comprising: a first level comprising a first wafer, said first wafer comprising a first crystalline substrate, a plurality of first transistors, and first copper interconnecting layers, wherein said first copper interconnecting layers at least interconnect said plurality of first transistors; and a second level comprising a second wafer, said second wafer comprising a second crystalline substrate, a plurality of second transistors, and second copper interconnecting layers, wherein said second copper interconnecting layers at least interconnect said plurality of second transistors, wherein said second level is bonded to said first level, wherein said bonded comprises metal to metal bonding, wherein said bonded comprises oxide to oxide bonding, and wherein at least one of said second transistors comprise a replacement gate.

In another aspect, a 3D integrated circuit, the circuit comprising: a first level comprising a first wafer, said first wafer comprising a first crystalline substrate, a plurality of first transistors, and first copper interconnecting layers, wherein said first copper interconnecting layers at least interconnect said plurality of first transistors; and a second level comprising a second wafer, said second wafer comprising a second crystalline substrate, a plurality of second transistors, and second copper interconnecting layers, wherein said second copper interconnecting layers at least interconnect said plurality of second transistors, wherein said second level is bonded to said first level, wherein said bonded comprises metal to metal bonding, wherein said bonded comprises oxide to oxide bonding, and wherein said second level comprises DRAM memory.

In another aspect, a semiconductor device, the device including: a first silicon layer including a first single crystal silicon and a plurality of first transistors; a first metal layer disposed over the first silicon layer; a second metal layer disposed over the first metal layer; a third metal layer disposed over the second metal layer; a second level including a plurality of second transistors, the second level disposed over the third metal layer; a fourth metal layer disposed over the second level; a fifth metal layer disposed over the fourth metal layer, where the fourth metal layer is aligned to the first metal layer with a less than 40 nm alignment error; and a via disposed through the second level, where each of the second transistors includes a metal gate, and where a typical thickness of the second metal layer is greater than a typical thickness of the third metal layer by at least 50%.

In another aspect, a semiconductor device, the device including: a first silicon layer including a first single crystal silicon and a plurality of first transistors; a first metal layer disposed over the first silicon layer; a second metal layer disposed over the first metal layer; a third metal layer disposed over the second metal layer; a second level including a plurality of second transistors, the second level disposed over the third metal layer; a third level including a plurality of third transistors, the third level disposed over the second level; a fourth metal layer disposed over the third level; a fifth metal layer disposed over the fourth metal layer, where the fourth metal layer is aligned to the first metal layer with a less than 40 nm alignment error, where each of the second transistors includes a metal gate, where the second transistor formation includes a first lithography step, and where the third transistor formation includes a second lithography step.

In another aspect, a semiconductor device, the device including: a first silicon layer including a first single crystal silicon and a plurality of first transistors; a first metal layer disposed over the first silicon layer; a second metal layer disposed over the first metal layer; a third metal layer disposed over the second metal layer; a second level including a plurality of second transistors, the second level disposed over the third metal layer; a third level including a plurality of third transistors, the third level disposed over the second level; a fourth metal layer disposed over the third level; a fifth metal layer disposed over the fourth metal layer, where the fourth metal layer is aligned to the first metal layer with a less than 40 nm alignment error, and where each of the second transistors includes a metal gate; and a power delivery path to at least one of the plurality of second transistors, where the power delivery path includes at least a part of the second metal layer.

In another aspect, a semiconductor device, the device including: a first silicon level including a first single crystal silicon layer and a plurality of first transistors; a first metal layer disposed over the first silicon level; a second metal layer disposed over the first metal layer; a third metal layer disposed over the second metal layer; a second level including a plurality of second transistors, the second level disposed over the third metal layer; a fourth metal layer disposed over the second level; a fifth metal layer disposed over the fourth metal layer, where the fourth metal layer is aligned to the first metal layer with a less than 240 nm alignment error; where the fifth metal layer includes global power delivery; and a via disposed through the second level, where a typical thickness of the second metal layer is greater than a typical thickness of the third metal layer by at least 50%.

In another aspect, a semiconductor device, the device including: a first silicon level including a first single crystal silicon layer and a plurality of first transistors; a first metal layer disposed over the first silicon level; a second metal layer disposed over the first metal layer; a third metal layer disposed over the second metal layer; a second level including a plurality of second transistors, the second level disposed over the third metal layer; a third level including a plurality of third transistors, the third level disposed over the second level; a fourth metal layer disposed over the third level; a fifth metal layer disposed over the fourth metal layer, where the fourth metal layer is aligned to the first metal layer with a less than 240 nm alignment error, and a via disposed through the second level and through the third level as part of a connection path between the fourth metal layer to the second metal layer, where the plurality of second transistors formation includes a first lithography step, and where the plurality of third transistors formation includes a second lithography step.

In another aspect, a semiconductor device, the device including: a first silicon level including a first single crystal silicon layer and a plurality of first transistors; a first metal layer disposed over the first silicon level; a second metal layer disposed over the first metal layer; a third metal layer disposed over the second metal layer; a second level including a plurality of second transistors, the second level disposed over the third metal layer; a third level including a plurality of third transistors, the third level disposed over the second level; a via disposed through the second level and through the third level; fourth metal layer disposed over the third level; and a fifth metal layer disposed over the fourth metal layer, where the fourth metal layer is aligned to the first metal layer with a less than 240 nm alignment error, where each of the plurality of second transistors includes a metal gate; and where the via has a diameter of less than 450 nm.

In another aspect, a semiconductor device, the device including: a first silicon level including a first single crystal silicon layer and a plurality of first transistors; a first metal layer disposed over the first silicon level; a second metal layer disposed over the first metal layer; a third metal layer disposed over the second metal layer; a second level including a plurality of second transistors, the second level disposed over the third metal layer; a third level including a plurality of third transistors, the third level disposed over the second level; a fourth metal layer disposed over the third level; a fifth metal layer disposed over the fourth metal layer, where the fourth metal layer is aligned to the first metal layer with a less than 240 nm alignment error, where each of the plurality of second transistors includes a metal gate, where the fifth metal layer includes global power delivery; and a via disposed through the second level and through the third level, where each of the plurality of third transistors includes a metal gate, where the via has a diameter of less than 450 nm, and where a typical thickness of the second metal layer is greater than a typical thickness of the third metal layer by at least 50%.

In another aspect, a semiconductor device, the device including: a first silicon level including a first single crystal silicon layer and a plurality of first transistors; a first metal layer disposed over the first silicon level; a second metal layer disposed over the first metal layer; a third metal layer disposed over the second metal layer; a second level including a plurality of second transistors, the second level disposed over the third metal layer; a third level including a plurality of third transistors, the third level disposed over the second level; a fourth metal layer disposed over the third level; a fifth metal layer disposed over the fourth metal layer, where the fourth metal layer is aligned to the first metal layer with a less than 240 nm alignment error; and a via disposed through the second level and through the third level as part of a connection path between the fourth metal layer to the second metal layer, where each of the plurality of second transistors includes a metal gate, where formation of the plurality of second transistors includes a first lithography step, and where formation of the plurality of third transistors includes a second lithography step.

In another aspect, a semiconductor device, the device including: a first silicon level including a first single crystal silicon layer and a plurality of first transistors; a first metal layer disposed over the first silicon level; a second metal layer disposed over the first metal layer; a third metal layer disposed over the second metal layer; a second level including a plurality of second transistors, the second level disposed over the third metal layer; a third level including a plurality of third transistors, the third level disposed over the second level; a via disposed through the second level and through the third level; a fourth metal layer disposed over the third level; a fifth metal layer disposed over the fourth metal layer; and a fourth level including a second single crystal silicon layer, where the fourth level is disposed over the fifth metal layer, where the fourth metal layer is aligned to the first metal layer with a less than 240 nm alignment error, where each of the plurality of second transistors includes a metal gate, and where the via has a diameter of less than 450 nm.

In another aspect, a semiconductor device, the device including: a first silicon level including a first single crystal silicon layer and a plurality of first transistors; a first metal layer disposed over the first silicon level; a second metal layer disposed over the first metal layer; a third metal layer disposed over the second metal layer; a second level including a plurality of second transistors, the second level disposed over the third metal layer; a third level including a plurality of third transistors, the third level disposed over the second level; a fourth metal layer disposed over the third level; a fifth metal layer disposed over the fourth metal layer, a fourth level including a second single crystal silicon layer, where the fourth level is disposed over the fifth metal layer. where each of the plurality of second transistors includes a metal gate, where the fifth metal layer includes global power delivery; and a via disposed through the second level and through the third level, where each of the plurality of third transistors includes a metal gate, where the via has a diameter of less than 650 nm, and where a typical thickness of the second metal layer is greater than a typical thickness of the third metal layer by at least 50%.

In another aspect, a semiconductor device, the device including: a first silicon level including a first single crystal silicon layer and a plurality of first transistors; a first metal layer disposed over the first silicon level; a second metal layer disposed over the first silicon level; a second metal layer disposed over the first metal layer; a third metal layer disposed over the second metal layer; a second level including a plurality of second transistors, the second level disposed over the third metal layer; a third level including a plurality of third transistors, the third level disposed over the second level; a fourth metal layer disposed over the third level; a fifth metal layer disposed over the fourth metal layer; and a via disposed through the second level and through the third level as part of a connection path between the fourth metal layer to the second metal layer, where each of the plurality of second transistors includes a metal gate, where at least one of the metal gates includes tungsten, where formation of the plurality of second transistors includes a first lithography step, and where formation of the plurality of third transistors includes a second lithography step.

In another aspect, a semiconductor device, the device including: a first silicon level including a first single crystal silicon layer and a plurality of first transistors; a first metal layer disposed over the first silicon level; a second metal layer disposed over the first metal layer; a third metal layer disposed over the second metal layer; a second level including a plurality of second transistors, the second level disposed over the third metal layer; a third level including a plurality of third transistors, the third level disposed over the second level; a via disposed through the second level and through the third level; a fourth metal layer disposed over the third level; a fifth metal layer disposed over the fourth metal layer; and a fourth level including a second single crystal silicon layer, where the fourth level is disposed over the fifth metal layer, where each of the plurality of second transistors includes a metal gate, and where the via has a diameter of less than 650 nm.

In another aspect, a semiconductor device, the device including: a first level including a first single crystal silicon layer and a plurality of first transistors; a first metal layer; a second metal layer, where interconnection of the plurality of first transistors includes the first metal layer and the second metal layer; a second level including a plurality of second transistors, the second level disposed over the first level; a third level including a plurality of third transistors, the third level disposed over the second level; a third metal layer disposed over the third level; a fourth metal layer disposed over the third metal layer; a fourth level including a second single crystal silicon layer, where the fourth level is disposed over the fourth metal layer, where each of the plurality of second transistors includes a metal gate, where the second metal layer includes a power delivery network; and a via disposed through the second level and through the third level, where each of the plurality of third transistors includes a metal gate, where the second level includes a first array of memory cells, where the third level includes a second array of memory cells, and where the first level includes input and output ("IO") circuits as part of connections of the device to external devices.

In another aspect, a semiconductor device, the device including: a first level including a first single crystal silicon layer and a plurality of first transistors; a first metal layer; a second metal layer, where interconnection of the plurality of first transistors includes the first metal layer and the second metal layer; a second level including a plurality of second transistors, the second level disposed over the first level; a third level including a plurality of third transistors, the third level disposed over the second level; a third metal layer disposed over the third metal layer; and a via disposed through the second level and through the third level as part of a connection path between the third metal layer to the second metal layer, where each of the plurality of second transistors includes a metal gate, where at least one of the metal gates includes tungsten, where the second level includes a first array of memory cells, where the third level includes a second array of memory cells, where formation of the plurality of second transistors includes a first lithography step, and where formation of the plurality of third transistors includes a second lithography step.

In another aspect, a semiconductor device, the device including: a first level including a first single crystal silicon layer and a plurality of first transistors; a first metal layer; a second metal layer, where interconnection of the plurality of first transistors includes the first metal layer and the second metal layer; a second level including a plurality of second transistors, the second level disposed over the first level; a third level including a plurality of third transistors, the third level disposed over the second level; a third metal layer disposed over the third level; a fourth metal layer disposed over the third metal layer; a fourth level including a second single crystal silicon layer, where the fourth level is disposed over the fourth metal layer, where each of the plurality of second transistors includes a metal gate, where the second metal layer includes a power delivery network; and a via disposed through the second level and through the third level, where each of the plurality of third transistors includes a metal gate, where the second level includes a first array of memory cells, where the third level includes a second array of memory cells, where the first level includes power control circuits controlling power delivery to the second transistors, and where the power control circuits include a portion of the plurality of the first transistors.

In another aspect, a method to process a semiconductor device, the method including: providing a substrate; processing the substrate to form a first level including a first single crystal silicon layer and a plurality of first transistors; forming a first metal layer; forming a second metal layer, where interconnection of the plurality of first transistors includes the first metal layer and the second metal layer; processing a second level including a plurality of second transistors; processing a third level including a plurality of third transistors, where the third level is disposed over the second level; forming a third metal layer disposed over the third level; forming a fourth metal layer disposed over the third metal layer; processing a fourth level including a second single crystal silicon layer, where the fourth level is disposed over the fourth metal layer, where each of the plurality of second transistors includes a metal gate, and where the second metal layer includes a power delivery network; and forming a via disposed through the second level and through the third level, where each of the plurality of third transistors includes a metal gate, where the second level includes a first array of memory cells, where the third level includes a second array of memory cells, where the first level includes input and output ("IO") circuits, where connections of the device to external devices includes the input and output ("IO") circuits, and where the second level is disposed over the first level.

In another aspect, a method to process a semiconductor device, the method including: providing a substrate; processing the substrate to form a first level including a first single crystal silicon layer and a plurality of first transistors; forming a first metal layer; forming a second metal layer, where interconnection of the plurality of first transistors includes the first metal layer and the second metal layer; processing a second level including a plurality of second transistors; processing a third level including a plurality of third transistors, where the third level is disposed over the second level; forming a third metal layer disposed over the third level; forming a fourth metal layer disposed over the third metal layer; processing a fourth level including a second single crystal silicon layer, where the fourth level is disposed over the fourth metal layer, where each of the plurality of second transistors includes a metal gate, and where the second metal layer includes a power delivery network; and forming a via disposed through the second level and through the third level, where each of the plurality of third transistors includes a metal gate, where the second level includes a first array of memory cells, where the third level includes a second array of memory cells, where formation of the plurality of second transistors includes a first lithography step, where formation of the plurality of third transistors includes a second lithography step, where the first level includes input and output ("IO") circuits, where connections of the device to external devices includes the input and output ("IO") circuits, and where the second level is disposed over the first level.

In another aspect, a method to process a semiconductor device, the method including: providing a substrate; processing the substrate to form a first level including a first single crystal silicon layer and a plurality of first transistors; forming a first metal layer; forming a second metal layer, where interconnection of the plurality of first transistors includes the first metal layer and the second metal layer; processing a second level including a plurality of second transistors; processing a third level including a plurality of third transistors, where the third level is disposed over the second level; forming a third metal layer disposed over the third level; forming a fourth metal layer disposed over the third metal layer; processing a fourth level including a second single crystal silicon layer, where the fourth level is disposed over the fourth metal layer, where each of the plurality of second transistors includes a metal gate, and where the second metal layer includes a power delivery network; and forming a via disposed through the second level and through the third level, where each of the plurality of third transistors includes a metal gate, where the second level includes a first array of memory cells, where the third level includes a second array of memory cells, and where the first level includes power control circuits controlling power delivery to the second transistors, where the power control circuits include a portion of the plurality of the first transistors, and where the second level is disposed over the first level.

Additionally there is a growing need to reduce the impact of inter-chip interconnects. In fact, interconnects are now dominating IC performance and power. One solution to shorten interconnect may be to use a 3D IC. Currently, the only known way for general logic 3D IC is to integrate finished device one on top of the other by utilizing Through-Silicon-Vias as now called TSVs. The problem with TSVs is that their large size, usually a few microns each, may severely limit the number of connections that can be made. Some embodiments of the current invention may provide multiple alternatives to constructing a 3D IC wherein many connections may be made less than one micron in size, thus enabling the use of 3D IC technology for most device applications.

Additionally some embodiments of this invention may offer new device alternatives by utilizing the proposed 3D IC technology.

BRIEF DESCRIPTION OF THE DRAWINGS

Various embodiments of the present invention will be understood and appreciated more fully from the following detailed description, taken in conjunction with the drawings in which:

FIGS. 3A-3M are drawing illustrations of the formation of a resistive memory transistor;

FIGS. 9B-9I are drawing illustrations of the preprocessed wafers and layers and generalized layer transfer;

FIGS. 10A through 10F are a drawing illustration of one reticle site on a wafer;

DETAILED DESCRIPTION

Figure 1:
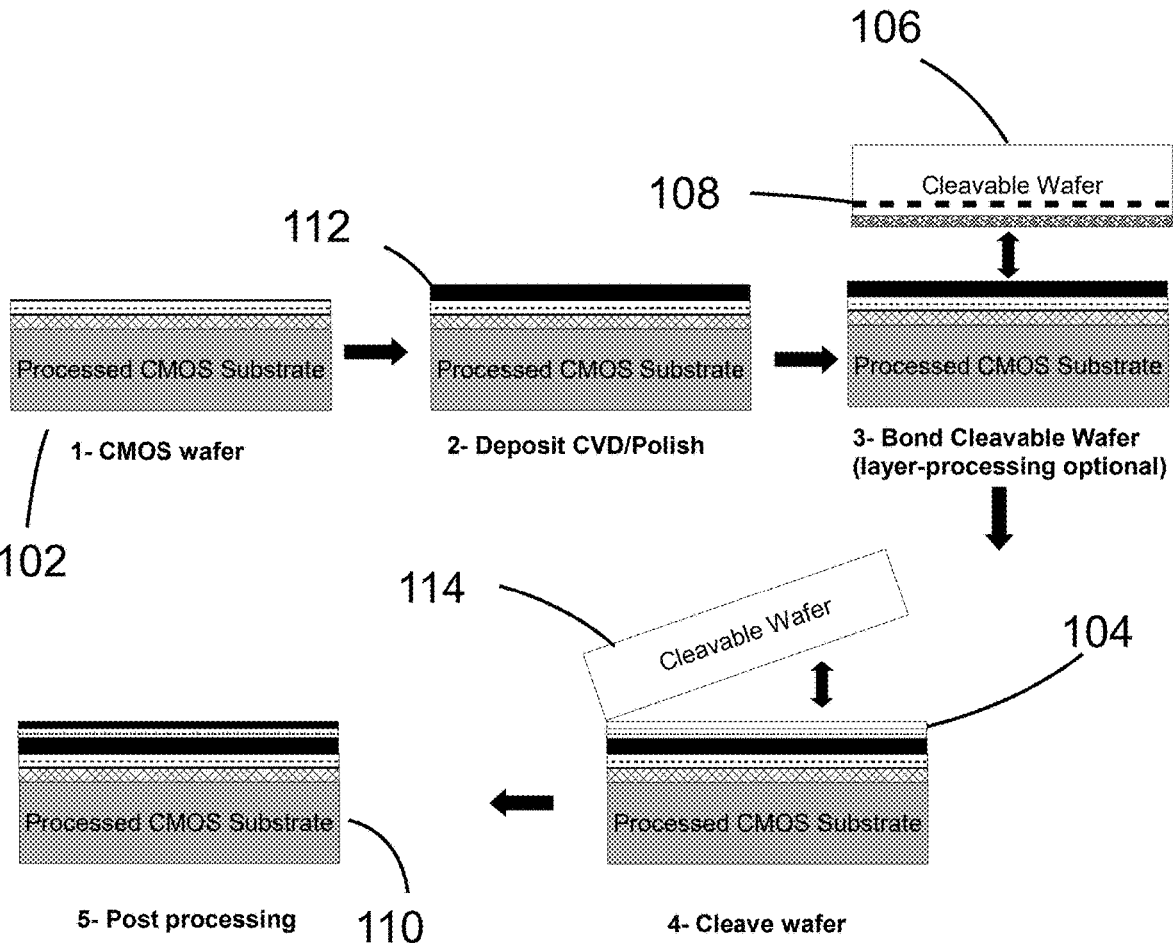
FIG. 1 is a drawing illustration of a layer transfer process flow.

Embodiments of the present invention are now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for fabricating devices. The process flows, which may be a sequence of steps for fabricating a device, may have many structures, numerals and labels that may be common between two or more successive steps. In such cases, some labels, numerals and structures used for a certain step's figure may have been described in the previous steps' figures.

A technology for creating layer stacks or overlying or underlying circuitry is to use the "SmartCut" process. The "SmartCut" process is a well understood technology used for fabrication of SOI wafers. The "SmartCut" process, together with wafer bonding technology, enables a "Layer Transfer" whereby a thin layer of a single or mono-crystalline silicon wafer is transferred from one wafer to another wafer. The "Layer Transfer" could be done at less than 400° C. and the resultant transferred layer could be even less than 100 nm thick. The process with some variations and under different names is commercially available by two companies, namely, Soitec (Crolles, France) and SiGen—Silicon Genesis Corporation (San Jose, CA). A room temperature wafer bonding process utilizing ion-beam preparation of the wafer surfaces in a vacuum has been recently demonstrated by Mitsubishi Heavy Industries Ltd., Tokyo, Japan. This process allows room temperature layer transfer.

Alternatively, other technology may be used. For example, other technologies may be utilized for layer transfer as described in, for example, IBM's layer transfer method shown at IEDM 2005 by A. W. Topol, et. al. The IBM's layer transfer method employs a SOI technology and utilizes glass handle wafers. The donor circuit may be high-temperature processed on an SOI wafer, temporarily bonded to a borosilicate glass handle wafer, backside thinned by chemical mechanical polishing of the silicon and then the Buried Oxide (BOX) is selectively etched off. The now thinned donor wafer is subsequently aligned and low-temperature oxide-to-oxide bonded to the acceptor wafer topside. A low temperature release of the glass handle wafer from the thinned donor wafer is performed, and then thru bond via connections are made. Additionally, epitaxial liftoff (ELO) technology as shown by P. Demeester, et. al, of IMEC in Semiconductor Science Technology 1993 may be utilized for layer transfer. ELO makes use of the selective removal of a very thin sacrificial layer between the substrate and the layer structure to be transferred. The to-be-transferred layer of GaAs or silicon may be adhesively 'rolled' up on a cylinder or removed from the substrate by utilizing a flexible carrier, such as, for example, black wax, to bow up the to-be-transferred layer structure when the selective etch, such as, for example, diluted Hydrofluoric (HF) Acid, etches the exposed release layer, such as, for example, silicon oxide in SOI or AlAs. After liftoff, the transferred layer is then aligned and bonded to the desired acceptor substrate or wafer. The manufacturability of the ELO process for multilayer layer transfer use was recently improved by J. Yoon, et. al., of the University of Illinois at Urbana-Champaign as described in Nature May 20, 2010.

Canon developed a layer transfer technology called ELTRAN—Epitaxial Layer TRANsfer from porous silicon.

ELTRAN may be utilized. The Electrochemical Society Meeting abstract No. 438 from year 2000 and the JSAP International July 2001 paper show a seed wafer being anodized in an HF/ethanol solution to create pores in the top layer of silicon, the pores are treated with a low temperature oxidation and then high temperature hydrogen annealed to seal the pores. Epitaxial silicon may then be deposited on top of the porous silicon and then oxidized to form the SOI BOX. The seed wafer may be bonded to a handle wafer and the seed wafer may be split off by high pressure water directed at the porous silicon layer. The porous silicon may then be selectively etched off leaving a uniform silicon layer.

FIG. 1 is a drawing illustration of a layer transfer process flow. In another alternative of the invention, "Layer-Transfer" is used for construction of the underlying circuitry 814. 102 is a wafer that was processed to construct the underlying circuitry. The wafer 102 could be of the most advanced process or more likely a few generations behind. It could comprise the programming circuits 814 and other useful structures and may be a preprocessed CMOS silicon wafer, or a partially processed CMOS, or other prepared silicon or semiconductor substrate. Wafer 102 may also be called an acceptor substrate or a target wafer. An oxide layer 112 is then deposited on top of the wafer 102 and then is polished for better planarization and surface preparation. A donor wafer 106 is then brought in to be bonded to 102. The surfaces of both donor wafer 106 and wafer 102 may be pre-processed for low temperature bonding by various surface treatments, such as an RCA pre-clean that may comprise dilute ammonium hydroxide or hydrochloric acid, and may include plasma surface preparations to lower the bonding energy and enhance the wafer to wafer bond strength. The donor wafer 106 is pre-prepared for "SmartCut" by an ion implant of an atomic species, such as H+ ions, at the desired depth to prepare the SmartCut line 108. SmartCut line 108 may also be called a layer transfer demarcation plane, shown as a dashed line. The SmartCut line 108 or layer transfer demarcation plane may be formed before or after other processing on the donor wafer 106. Donor wafer 106 may be bonded to wafer 102 by bringing the donor wafer 106 surface in physical contact with the wafer 102 surface, and then applying mechanical force and/or thermal annealing to strengthen the oxide to oxide bond. Alignment of the donor wafer 106 with the wafer 102 may be performed immediately prior to the wafer bonding. Acceptable bond strengths may be obtained with bonding thermal cycles that do not exceed approximately 400° C. After bonding the two wafers a SmartCut step is performed to cleave and remove the top portion 114 of the donor wafer 106 along the cut layer 108. The cleaving may be accomplished by various applications of energy to the SmartCut line 108, or layer transfer demarcation plane, such as a mechanical strike by a knife or jet of liquid or jet of air, or by local laser heating, or other suitable methods. The result is a 3D wafer 110 which comprises wafer 102 with an added layer 104 of mono-crystalline silicon, or multiple layers of materials. Layer 104 may be polished chemically and mechanically to provide a suitable surface for further processing. Layer 104 could be quite thin at the range of 50-200 nm as desired. The described flow is called "layer transfer". Layer transfer is commonly utilized in the fabrication of SOI—Silicon On Insulator—wafers. For SOI wafers the upper surface is oxidized so that after "layer transfer" a buried oxide—BOX—provides isolation between the top thin mono-crystalline silicon layer and the bulk of the wafer. The use of an implanted atomic species, such as Hydrogen or Helium or a combination, to create a cleaving plane as described above may be referred to in this document as "ion-cut" and is the preferred and illustrated layer transfer method utilized.

Persons of ordinary skill in the art will appreciate that the illustrations in FIG. 1 are exemplary only and are not drawn to scale. Such skilled persons will further appreciate that many variations are possible such as, for example, a heavily doped (greater than 1e20 atoms/cm3) boron layer or silicon germanium (SiGe) layer may be utilized as an etch stop either within the ion-cut process flow, wherein the layer transfer demarcation plane may be placed within the etch stop layer or into the substrate material below, or the etch stop layers may be utilized without a implant cleave process and the donor wafer may be preferentially etched away until the etch stop layer is reached. Such skilled persons will further appreciate that the oxide layer within an SOI or GeOI donor wafer may serve as the etch stop layer. Many other modifications within the scope of the invention will suggest themselves to such skilled persons after reading this specification. Thus the invention is to be limited only by the appended claims.

One alternative method is to have a thin layer transfer of single crystal silicon which will be used for epitaxial Ge crystal growth using the transferred layer as the seed for the germanium. Another alternative method is to use the thin layer transfer of mono-crystalline silicon for epitaxial growth of GexSi1−x. The percent Ge in Silicon of such layer would be determined by the transistor specifications of the circuitry. Prior art have presented approaches whereby the base silicon is used to crystallize the germanium on top of the oxide by using holes in the oxide to drive crystal or lattice seeding from the underlying silicon crystal. However, it is very hard to do such on top of multiple interconnection layers. By using layer transfer we can have a mono-crystalline layer of silicon crystal on top and make it relatively easy to seed and crystallize an overlying germanium layer. Amorphous germanium could be conformally deposited by CVD at 300° C. and pattern aligned to the underlying layer, such as a pre-processed wafer or layer, and then encapsulated by a low temperature oxide. A short microsecond-duration heat pulse melts the Ge layer while keeping the underlying structure below 400° C. The Ge/Si interface will start the crystal or lattice epitaxial growth to crystallize the germanium or GexSi1−x layer. Then implants are made to form Ge transistors and activated by laser pulses without damaging the underlying structure taking advantage of the low activation temperature of dopants in germanium.

Another class of devices that may be constructed partly at high temperature before layer transfer to a substrate with metal interconnects and then completed at low temperature after layer transfer is a junction-less transistor (JLT). For example, in deep sub micron processes copper metallization is utilized, so a high temperature would be above approximately 400° C., whereby a low temperature would be approximately 400° C. and below. The junction-less transistor structure avoids the sharply graded junctions needed as silicon technology scales, and provides the ability to have a thicker gate oxide for an equivalent performance when compared to a traditional MOSFET transistor. The junction-less transistor is also known as a nanowire transistor without junctions, or gated resistor, or nanowire transistor as described in a paper by Jean-Pierre Colinge, et. al., published in Nature Nanotechnology on Feb. 21, 2010. The junction-less transistors may be constructed whereby the transistor channel is a thin solid piece of evenly and heavily doped single crystal silicon. The doping concentration of the channel may be identical to that of the source and drain. The considerations may include the nanowire channel must be thin and narrow enough to allow for full depletion of the carriers when the device is turned off, and the channel doping must be high enough to allow a reasonable current to flow when the device is on. These considerations may lead to tight process variation boundaries for channel thickness, width, and doping for a reasonably obtainable gate work function and gate oxide thickness.

Figures 2A, 2B:
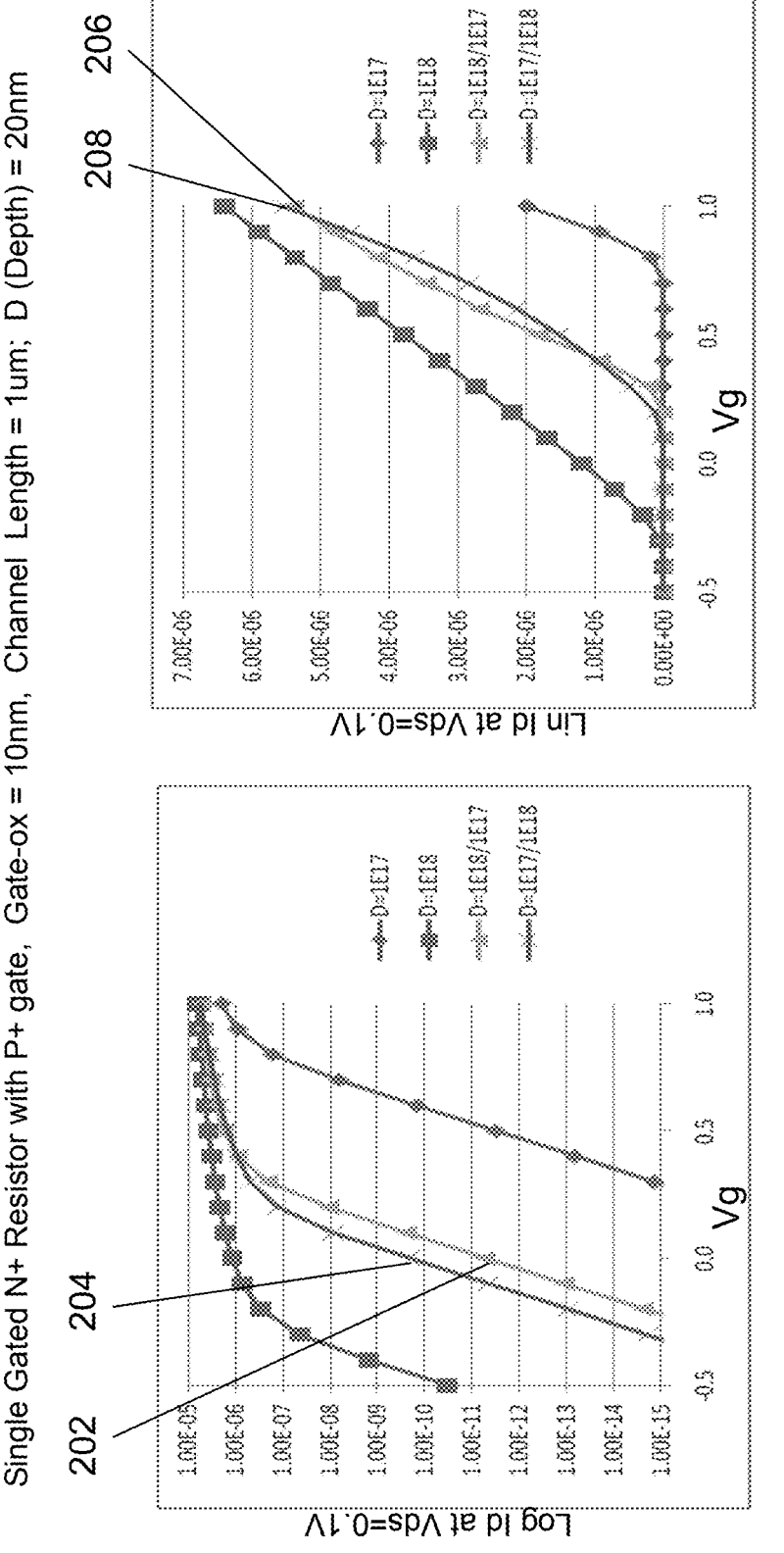
FIGS. 2A and 2B are device simulations of a junction-less transistor.

One of the challenges of a junction-less transistor device is turning the channel off with minimal leakage at a zero gate bias. To enhance gate control over the transistor channel, the channel may be doped unevenly; whereby the heaviest doping is closest to the gate or gates and the channel doping is lighter the farther away from the gate electrode. One example would be where the center of a 2, 3, or 4 gate sided junction-less transistor channel is more lightly doped than the edges. This may enable much lower off currents for the same gate work function and control. FIGS. 52A and 52B show, on logarithmic and linear scales respectively, simulated drain to source current Ids as a function of the gate voltage Vg for various junction-less transistor channel dopings where the total thickness of the n-channel is 20 nm. Two of the four curves in each figure correspond to evenly doping the 20 nm channel thickness to 1E17 and 1E18 atoms/cm3, respectively. The remaining two curves show simulation results where the 20 nm channel has two layers of 10 nm thickness each. In the legend denotations for the remaining two curves, the first number corresponds to the 10 nm portion of the channel that is the closest to the gate electrode. For example, the curve D=1E18/1E17 shows the simulated results where the 10 nm channel portion doped at 1E18 is closest to the gate electrode while the 10 nm channel portion doped at 1E17 is farthest away from the gate electrode. In FIG. 2A, curves 202 and 204 correspond to doping patterns of D=1E18/1E17 and D=1E17/1E18, respectively. According to FIG. 52A, at a Vg of 0 volts, the off current for the doping pattern of D=1E18/1E17 is approximately 50 times lower than that of the reversed doping pattern of D=1E17/1E18. Likewise, in FIG. 52B, curves 206 and 208 correspond to doping patterns of D=1E18/1E17 and D=1E17/1E18, respectively. FIG. 52B shows that at a Vg of 1 volt, the Ids of both doping patterns are within a few percent of each other.

The junction-less transistor channel may be constructed with even, graded, or discrete layers of doping. The channel may be constructed with materials other than doped mono-crystalline silicon, such as poly-crystalline silicon, or other semi-conducting, insulating, or conducting material, such as graphene or other graphitic material, and may be in combination with other layers of similar or different material. For example, the center of the channel may comprise a layer of oxide, or of lightly doped silicon, and the edges more heavily doped single crystal silicon. This may enhance the gate control effectiveness for the off state of the resistor, and may also increase the on-current due to strain effects on the other layer or layers in the channel. Strain techniques may also be employed from covering and insulator material above, below, and surrounding the transistor channel and gate. Lattice modifiers may also be employed to strain the silicon, such as an embedded SiGe implantation and anneal. The cross section of the transistor channel may be rectangular, circular, or oval shaped, to enhance the gate control of the channel. Alternatively, to optimize the mobility of the P-channel junction-less transistor in the 3D layer transfer method, the donor wafer may be rotated 90 degrees with respect to the acceptor wafer prior to bonding to facilitate the creation of the P-channel in the <110> silicon plane direction.

Novel monolithic 3D memory technologies utilizing material resistance changes may be constructed in a similar manner. There are many types of resistance-based memories including phase change memory, Metal Oxide memory, resistive RAM (RRAM), memristors, solid-electrolyte memory, ferroelectric RAM, MRAM, etc. Background information on these resistive-memory types is given in "Overview of candidate device technologies for storage-class memory," *IBM Journal of Research and Development*, vol. 52, no. 4.5, pp. 449-464, July 2008 by Burr, G. W., et. al. The contents of this document are incorporated in this specification by reference.

The monolithic 3D integration concepts described in this patent application can lead to novel embodiments of poly-crystalline silicon based memory architectures. While the below concepts in FIGS. 3 and 4 are explained by using resistive memory architectures as an example, it will be clear to one skilled in the art that similar concepts can be applied to the NAND flash, charge trap, and DRAM memory architectures and process flows described previously in this patent application's parent (U.S. application Ser. No. 12/900,379, issued as U.S. Pat. No. 8,395,191) or other of the incorporated by reference documents.

As illustrated in FIGS. 3A to 3K, a resistance-based zero additional masking steps per memory layer 3D memory may be constructed that is suitable for 3D IC manufacturing. This 3D memory utilizes junction-less transistors and has a resistance-based memory element in series with a select or access transistor.

Figure 3A:
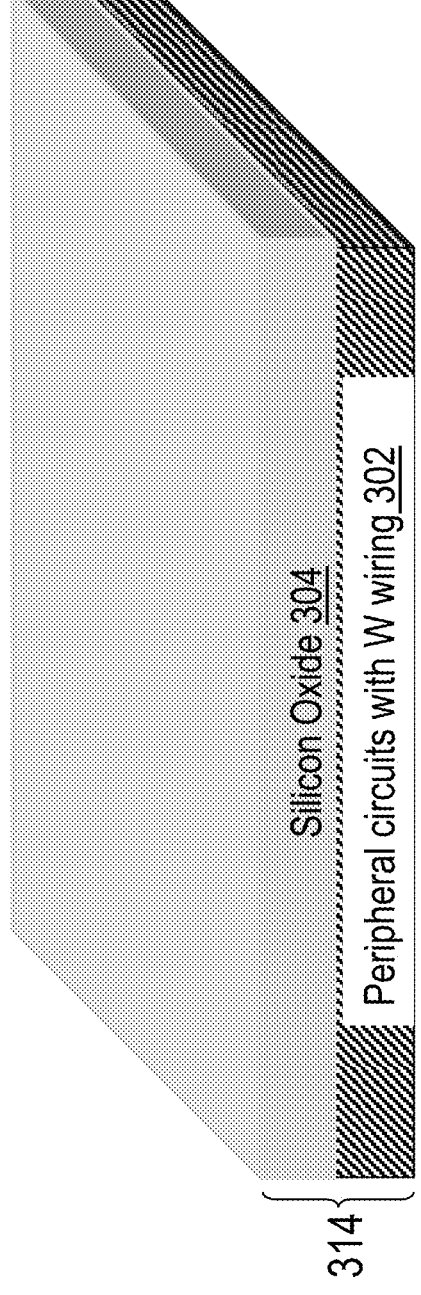

As illustrated in FIG. 3A, a silicon substrate with peripheral circuitry 302 may be constructed with high temperature (greater than approximately 400° C.) resistant wiring, such as, for example, Tungsten. The peripheral circuitry substrate 302 may include memory control circuits as well as circuitry for other purposes and of various types, such as, for example, analog, digital, RF, or memory. The peripheral circuitry substrate 302 may include peripheral circuits that can withstand an additional rapid-thermal-anneal (RTA) and still remain operational and retain good performance. For this purpose, the peripheral circuits may be formed such that they have had a weak RTA or no RTA for activating dopants. The top surface of the peripheral circuitry substrate 302 may be prepared for oxide wafer bonding with a deposition of a silicon oxide 304, thus forming acceptor wafer 314.

Figure 3B:
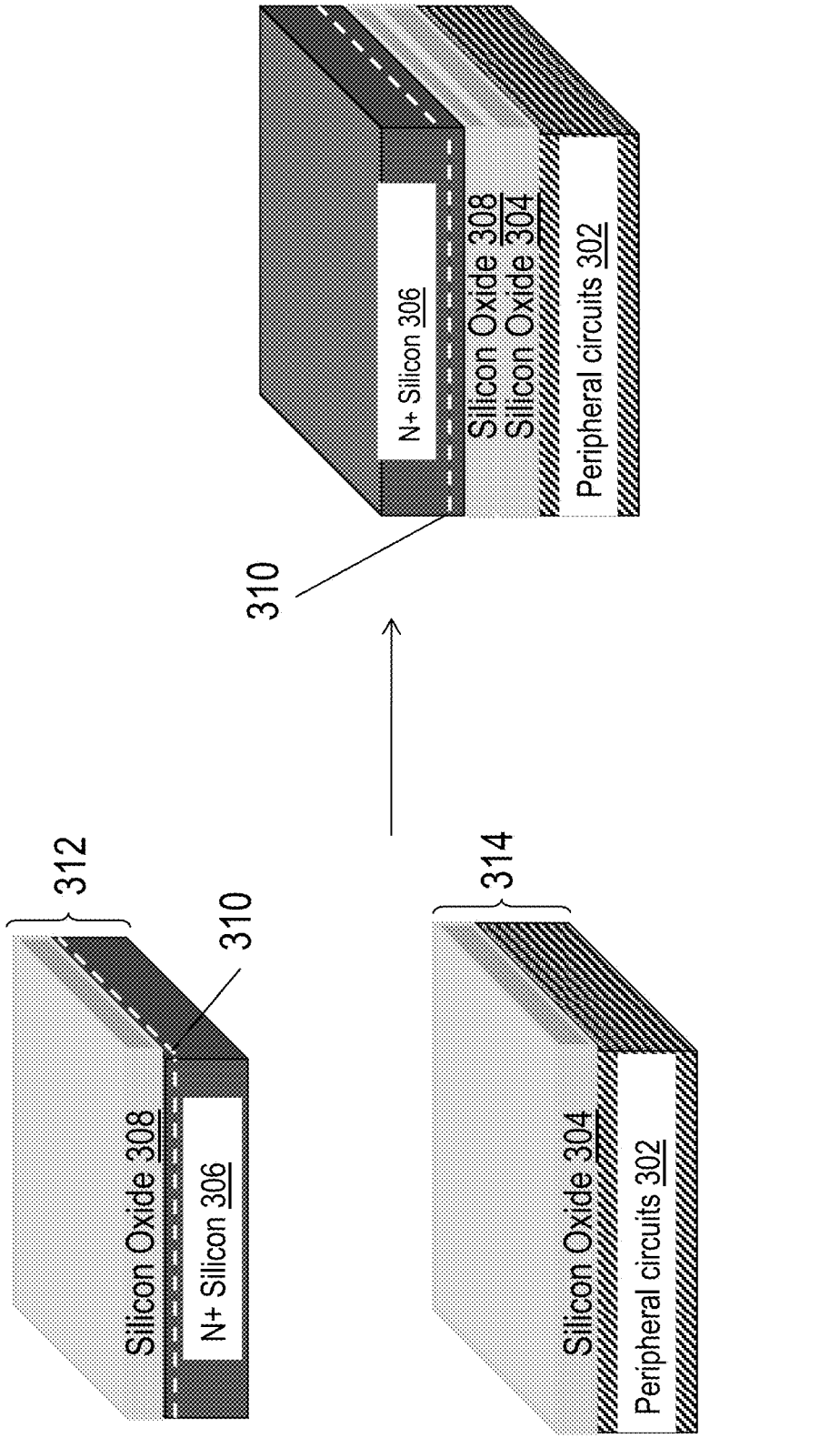

As illustrated in FIG. 3B, a mono-crystalline silicon donor wafer 312 may be optionally processed to include a wafer sized layer of N+ doping (not shown) which may have a different dopant concentration than the N+ substrate 306. The N+ doping layer may be formed by ion implantation and thermal anneal. A screen oxide 308 may be grown or deposited prior to the implant to protect the silicon from implant contamination and to provide an oxide surface for later wafer to wafer bonding. A layer transfer demarcation plane 310 (shown as a dashed line) may be formed in donor wafer 312 within the N+ substrate 306 or the N+ doping layer (not shown) by hydrogen implantation or other methods as previously described. Both the donor wafer 312 and acceptor wafer 314 may be prepared for wafer bonding as previously described and then bonded at the surfaces of oxide layer 304 and oxide layer 308, at a low temperature (less than approximately 400° C.) preferred for lowest stresses, or a moderate temperature (less than approximately 900° C.).

Figure 3C:
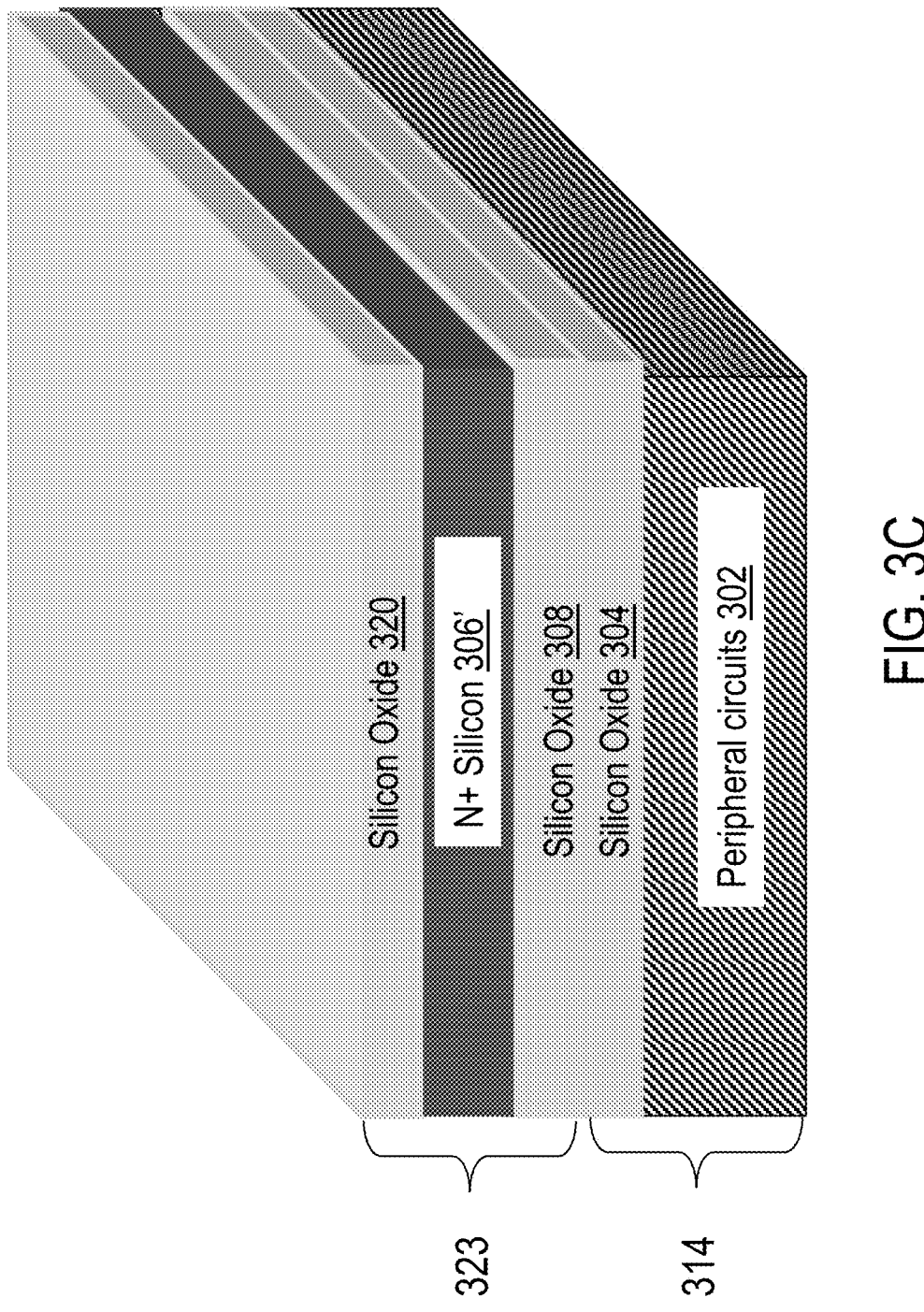

As illustrated in FIG. 3C, the portion of the N+ layer (not shown) and the N+ wafer substrate 306 that are above the layer transfer demarcation plane 310 may be removed by cleaving and polishing, or other processes as previously described, such as, for example, ion-cut or other methods, thus forming the remaining mono-crystalline silicon N+ layer 306'. Remaining N+ layer 306' and oxide layer 308 have been layer transferred to acceptor wafer 314. The top surface of N+ layer 306' may be chemically or mechanically polished smooth and flat. Now transistors or portions of transistors may be formed and aligned to the acceptor wafer 314 alignment marks (not shown). Oxide layer 320 may be deposited to prepare the surface for later oxide to oxide bonding, leading to the formation of the first Si/SiO2 layer 323 that includes silicon oxide layer 320, N+ silicon layer 306', and oxide layer 308.

Figure 3D:
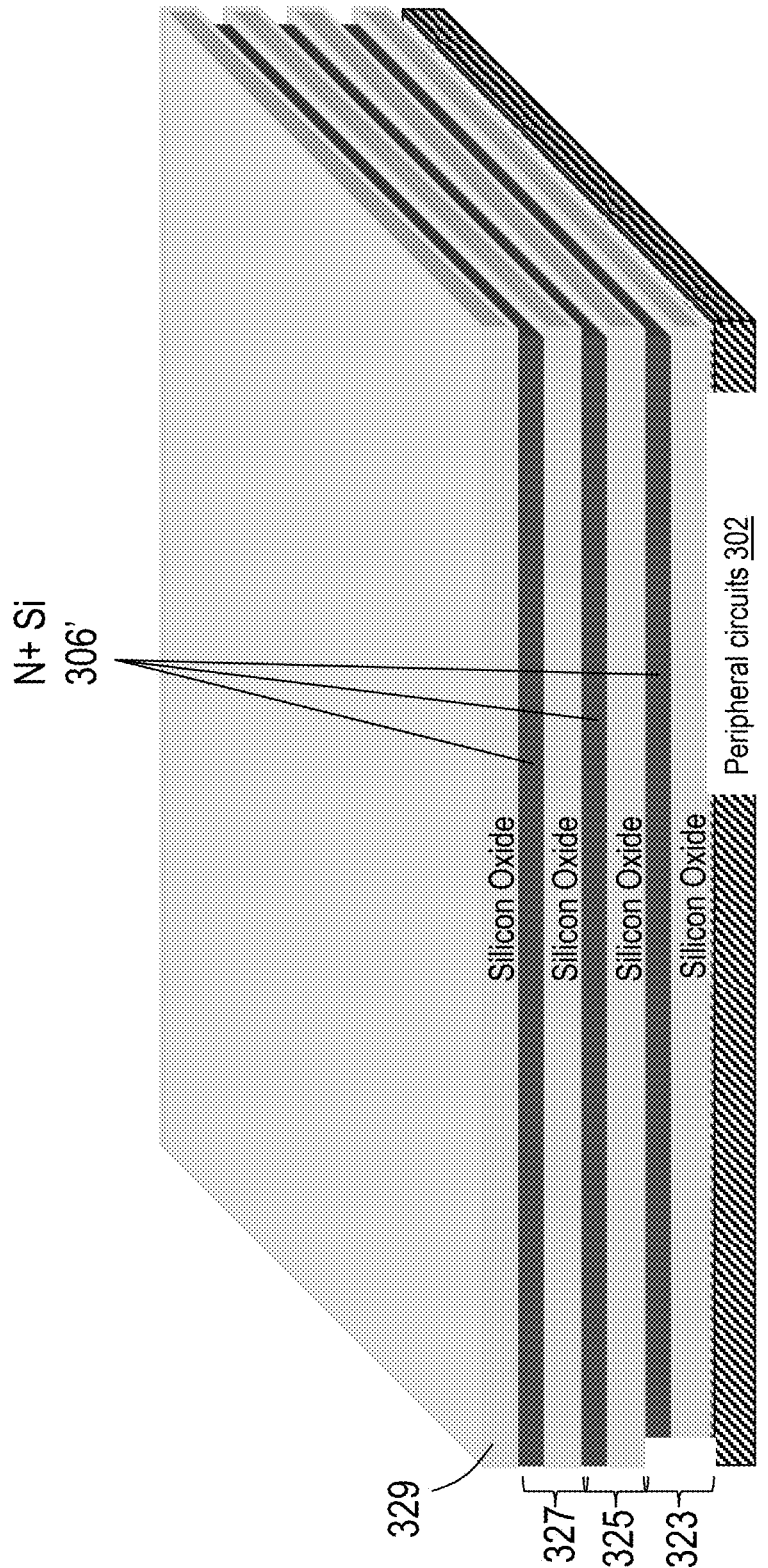

As illustrated in FIG. 3D, additional Si/SiO2 layers, such as, for example, second Si/SiO2 layer 325 and third Si/SiO2 layer 327, may each be formed as described in FIGS. 3A to 3C. Oxide layer 329 may be deposited to electrically isolate the top N+ silicon layer.

Figure 3E:
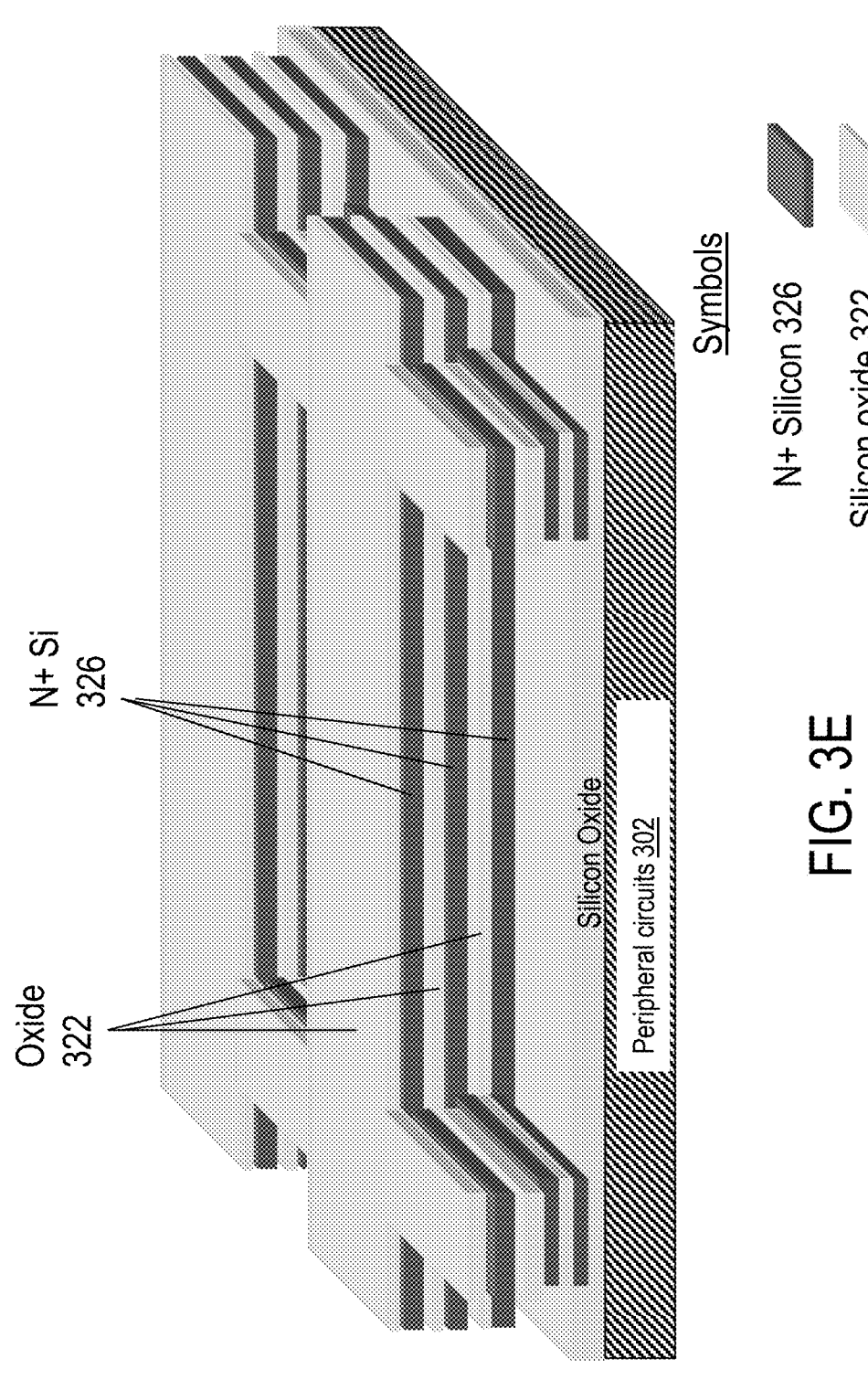

As illustrated in FIG. 3E, oxide 329, third Si/SiO2 layer 327, second Si/SiO2 layer 325 and first Si/SiO2 layer 323 may be lithographically defined and plasma/RIE etched to form a portion of the memory cell structure, which now includes regions of N+ silicon 326 and oxide 322.

Figure 3F:
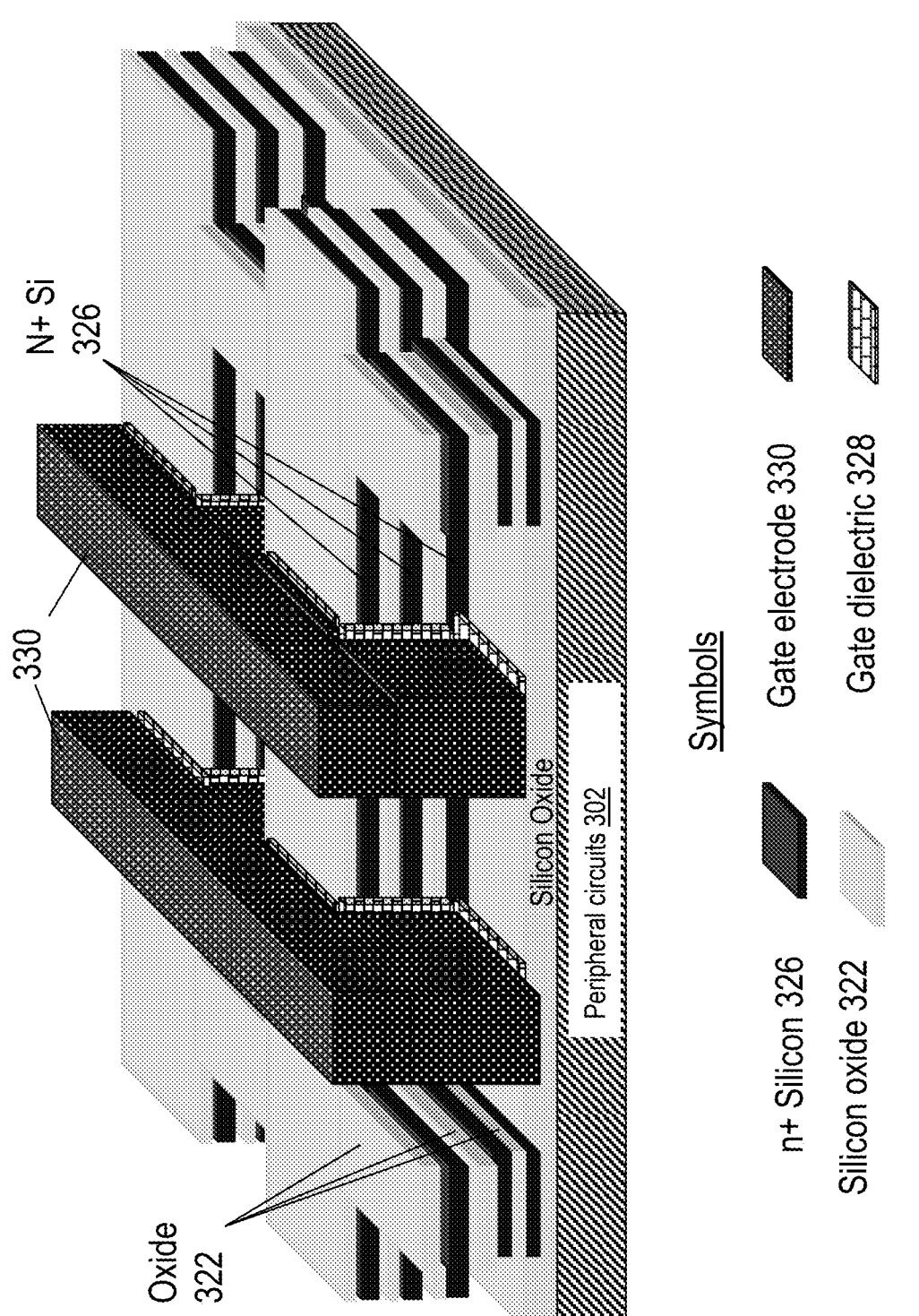

As illustrated in FIG. 3F, a gate dielectric and gate electrode material may be deposited, planarized with a chemical mechanical polish (CMP), and then lithographically defined and plasma/RIE etched to form gate dielectric regions 328 which may either be self aligned to and covered by gate electrodes 330 (shown), or cover the entire N+ silicon 326 and oxide 322 multi-layer structure. The gate stack including gate electrode 330 and gate dielectric 328 may be formed with a gate dielectric, such as, for example, thermal oxide, and a gate electrode material, such as, for example, poly-crystalline silicon. Alternatively, the gate dielectric may be an atomic layer deposited (ALD) material that is paired with a work function specific gate metal according to an industry standard of high k metal gate process schemes described previously. Moreover, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 3G:
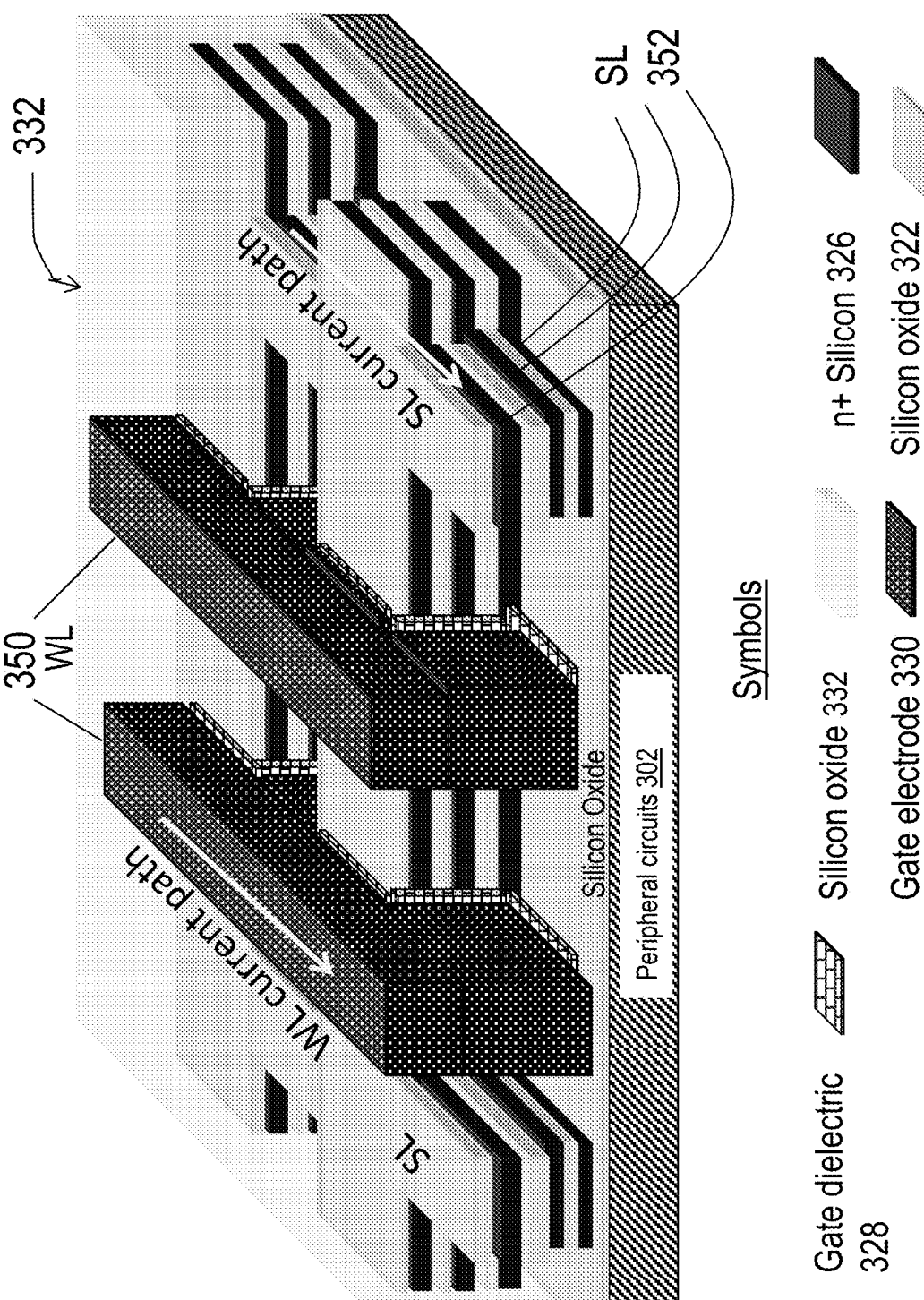

As illustrated in FIG. 3G, the entire structure may be covered with a gap fill oxide 332, which may be planarized with chemical mechanical polishing. The oxide 332 is shown transparent in the figure for clarity, along with word-line regions (WL) 350, coupled with and composed of gate electrodes 330, and source-line regions (SL) 352, composed of N+ silicon regions 326.

Figure 3H:
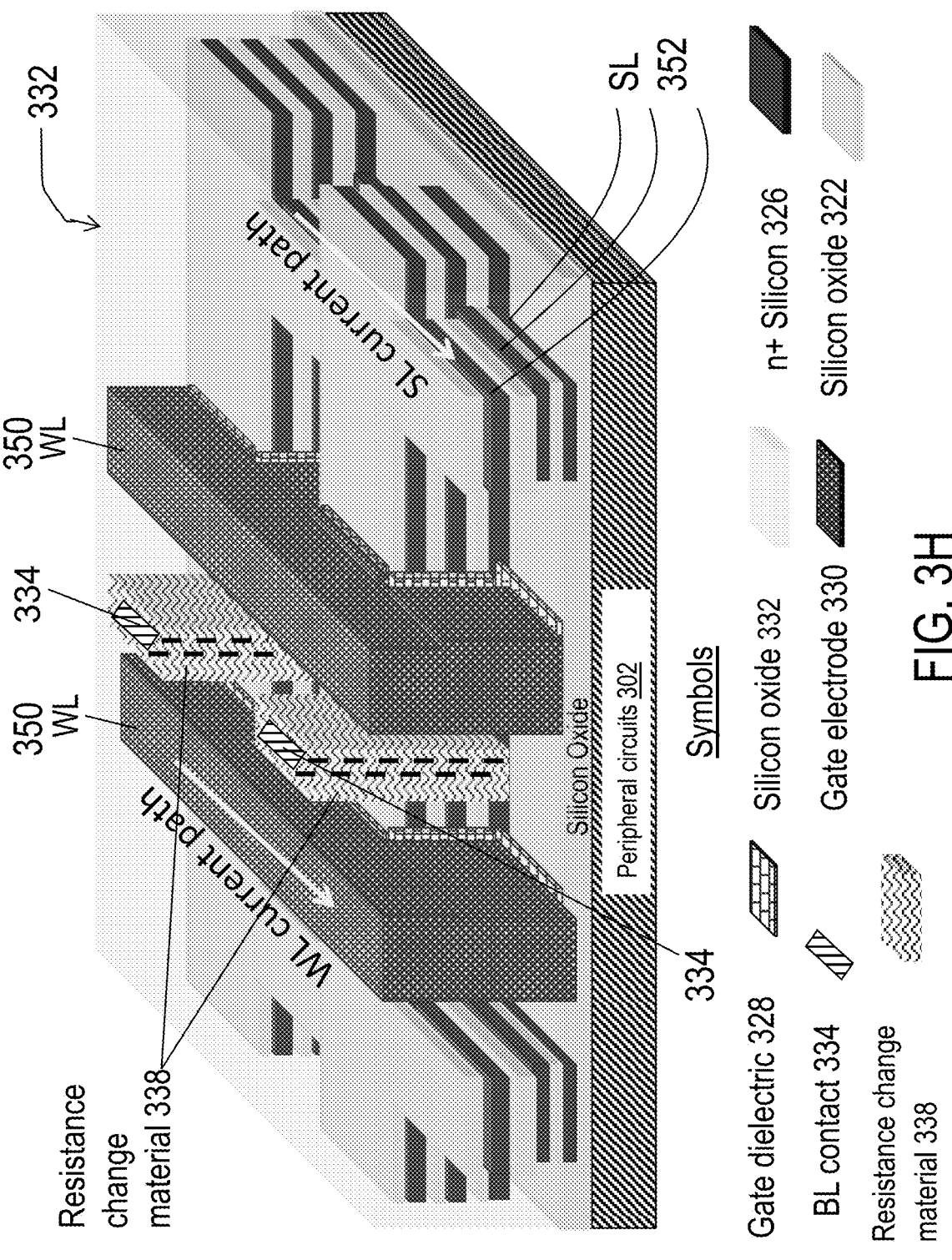
Figure 31:
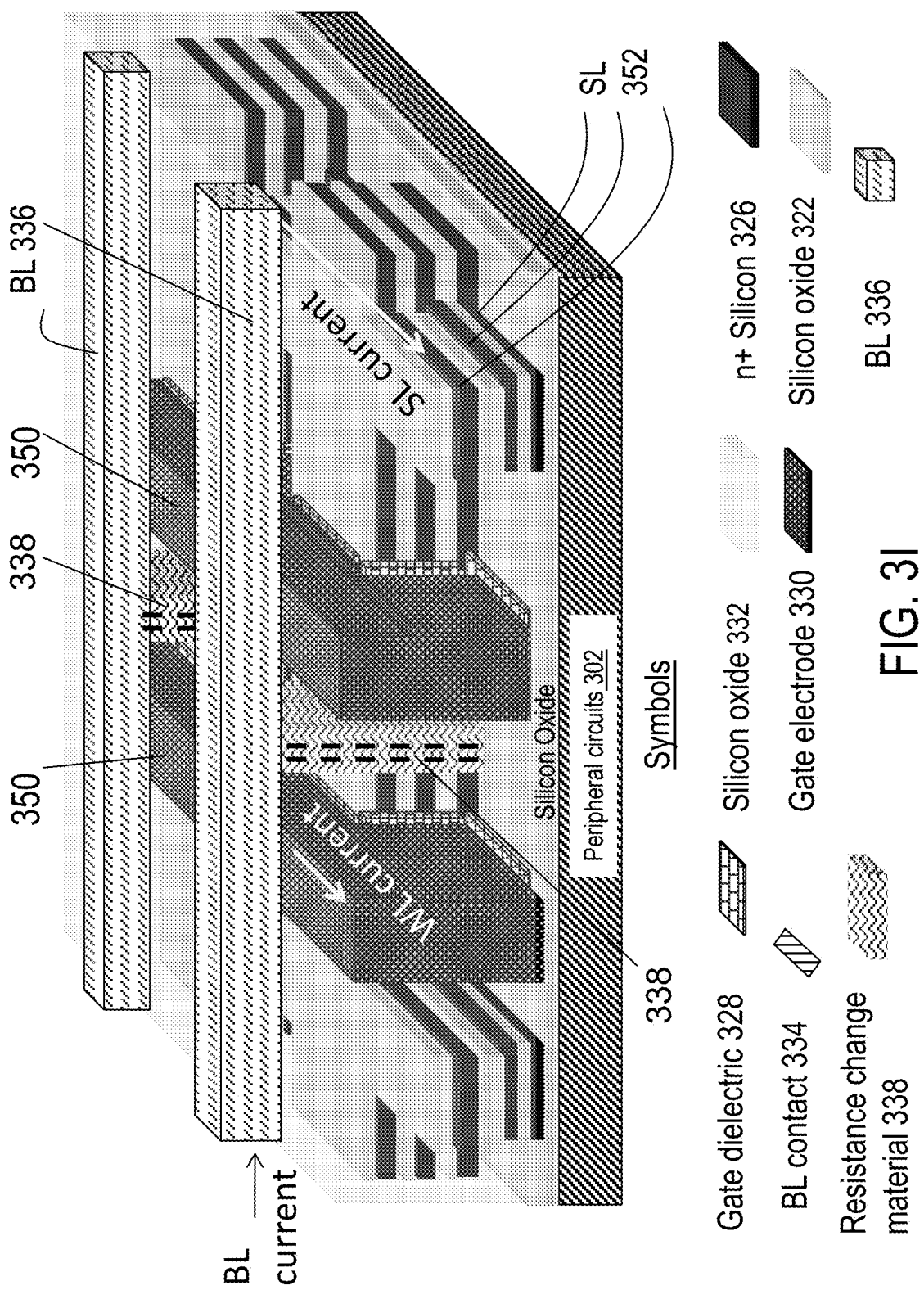

As illustrated in FIG. 3H, bit-line (BL) contacts 334 may be lithographically defined, etched along with plasma/RIE through oxide 332, the three N+ silicon regions 326, and associated oxide vertical isolation regions to connect all memory layers vertically. BL contacts 334 may then be processed by a photoresist removal. Resistance change memory material 338, such as, for example, hafnium oxide, may then be deposited, preferably with atomic layer deposition (ALD). The electrode for the resistance change memory element may then be deposited by ALD to form the electrode/BL contact 334. The excess deposited material may be polished to planarity at or below the top of oxide 332. Each BL contact 334 with resistive change material 338 may be shared among substantially all layers of memory, shown as three layers of memory in FIG. 3H.

As illustrated in FIG. 3I, BL metal lines 336 may be formed and connect to the associated BL contacts 334 with resistive change material 338. Contacts and associated metal interconnect lines (not shown) may be formed for the WL and SL at the memory array edges. A thru layer via 360 (not shown) may be formed to electrically couple the BL, SL, and WL metallization to the acceptor substrate 314 peripheral circuitry via an acceptor wafer metal connect pad 380 (not shown).

Figure 3J:
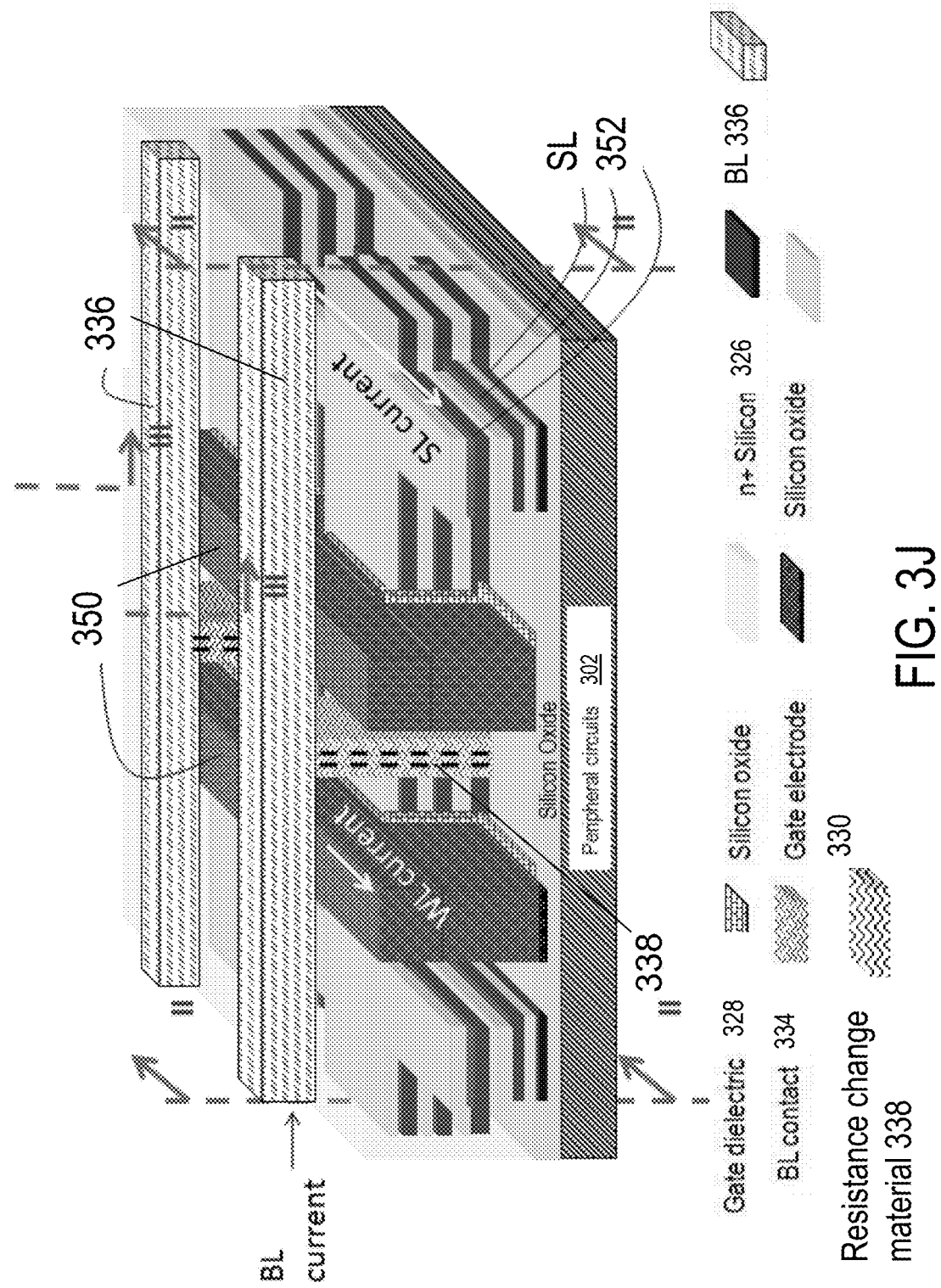
Figures 3K, 3M:
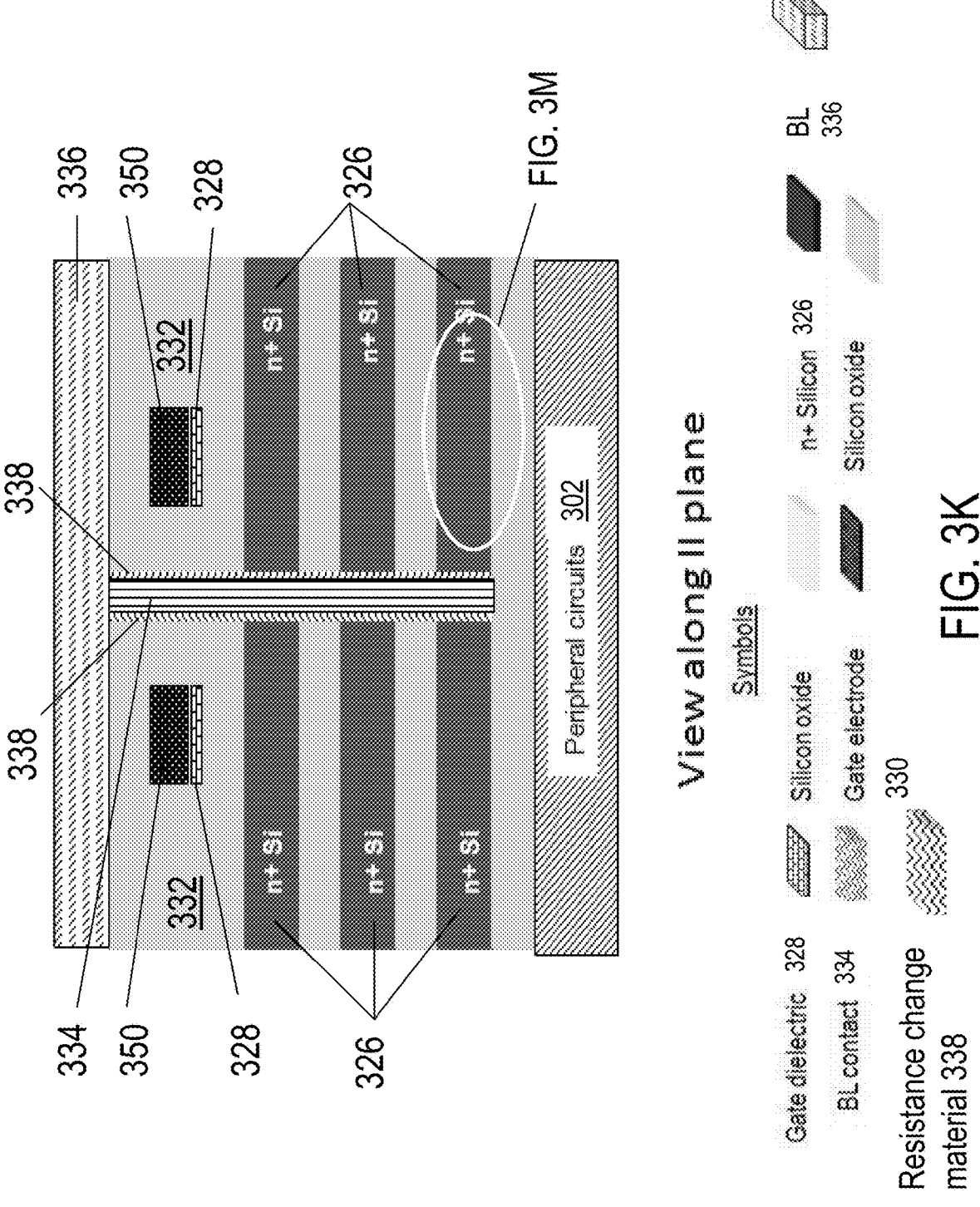
Figures 3L, 3M:
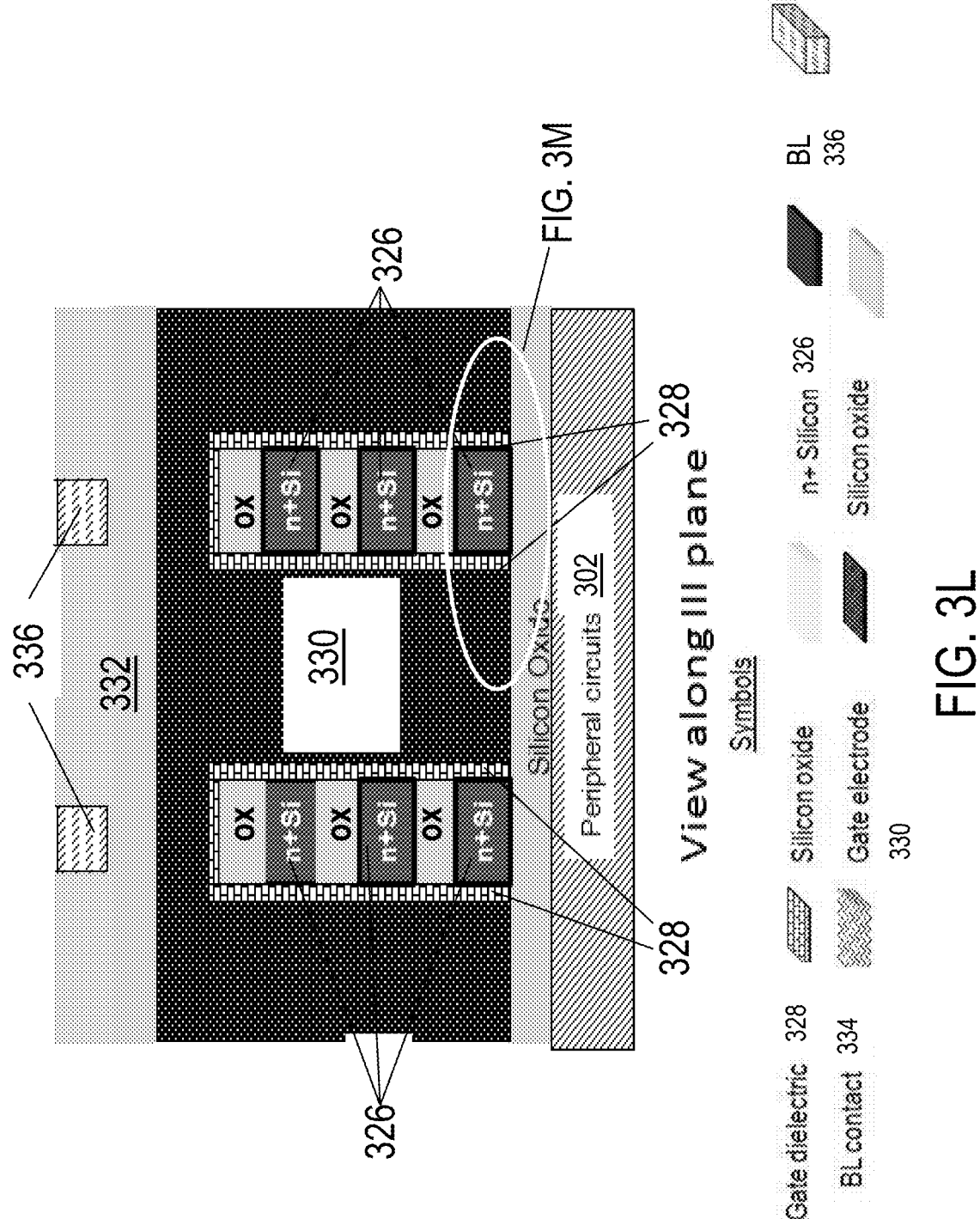
Figure 3M:
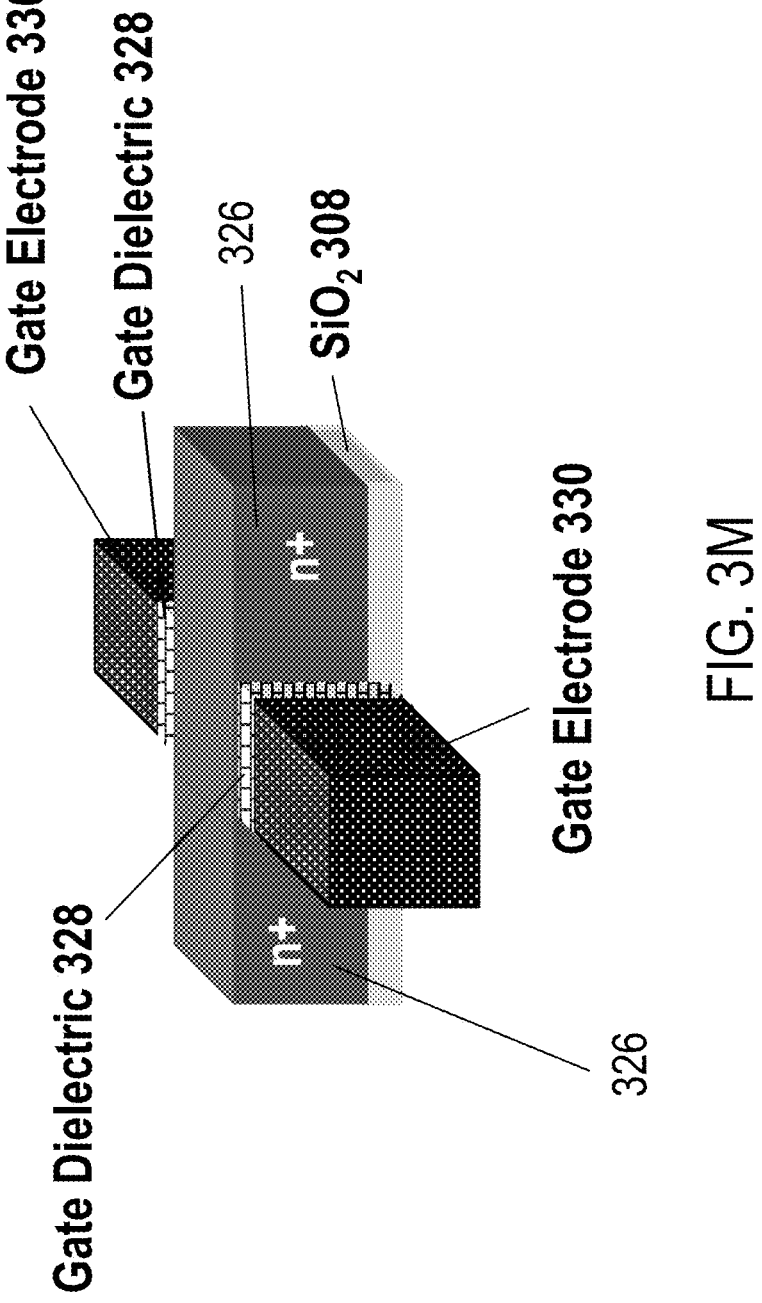

FIG. 3K shows a cross sectional cut II of FIG. 3J, while FIG. 3L shows a cross-sectional cut III of FIG. 3J. FIG. 3K shows BL metal line 336, oxide 332, BL contact/electrode 334, resistive change material 338, WL regions 350, gate dielectric 328, N+ silicon regions 326, and peripheral circuits substrate 302. The BL contact/electrode 334 couples to one side of the three levels of resistive change material 338. The other side of the resistive change material 338 is coupled to N+ regions 326. FIG. 3L shows BL metal lines 336, oxide 332, gate electrode 330, gate dielectric 328, N+ silicon regions 326, interlayer oxide region ('ox'), and peripheral circuits substrate 302. The gate electrode 330 is common to substantially all six N+ silicon regions 326 and forms six two-sided gated junction-less transistors as memory select transistors.

As illustrated in FIG. 3M, a single exemplary two-sided gate junction-less transistor on the first Si/SiO2 layer 323 may include N+ silicon region 326 (functioning as the source, drain, and transistor channel), and two gate electrodes 330 with associated gate dielectrics 328. The transistor is electrically isolated from beneath by oxide layer 308.

This flow may enable the formation of a resistance-based multi-layer or 3D memory array with zero additional masking steps per memory layer, which utilizes junction-less transistors and has a resistance-based memory element in series with a select transistor, and is constructed by layer transfers of wafer sized doped mono-crystalline silicon layers, and this 3D memory array may be connected to an underlying multi-metal layer semiconductor device.

Persons of ordinary skill in the art will appreciate that the illustrations in FIGS. 3A through 3M are exemplary only and are not drawn to scale. Such skilled persons will further appreciate that many variations are possible such as, for example, the transistors may be of another type such as RCATs. Additionally, doping of each N+ layer may be slightly different to compensate for interconnect resistances. Moreover, the stacked memory layer may be connected to a periphery circuit that is above the memory stack. Further, each gate of the double gate 3D resistance based memory can be independently controlled for better control of the memory cell. Many other modifications within the scope of the invention will suggest themselves to such skilled persons after reading this specification. Thus the invention is to be limited only by the appended claims.

The monolithic 3D integration concepts described in this patent application can lead to novel embodiments of poly-crystalline silicon based memory architectures. While the below concepts in FIGS. 4 and 5 are explained by using resistive memory architectures as an example, it will be clear to one skilled in the art that similar concepts can be applied to the NAND flash, charge trap, and DRAM memory architectures and process flows described previously in this patent application.

As illustrated in FIGS. 4A to 4K, a resistance-based 3D memory with zero additional masking steps per memory layer may be constructed with methods that are suitable for 3D IC manufacturing. This 3D memory utilizes poly-crystalline silicon junction-less transistors that may have either a positive or a negative threshold voltage and has a resistance-based memory element in series with a select or access transistor.

Figure 4A:
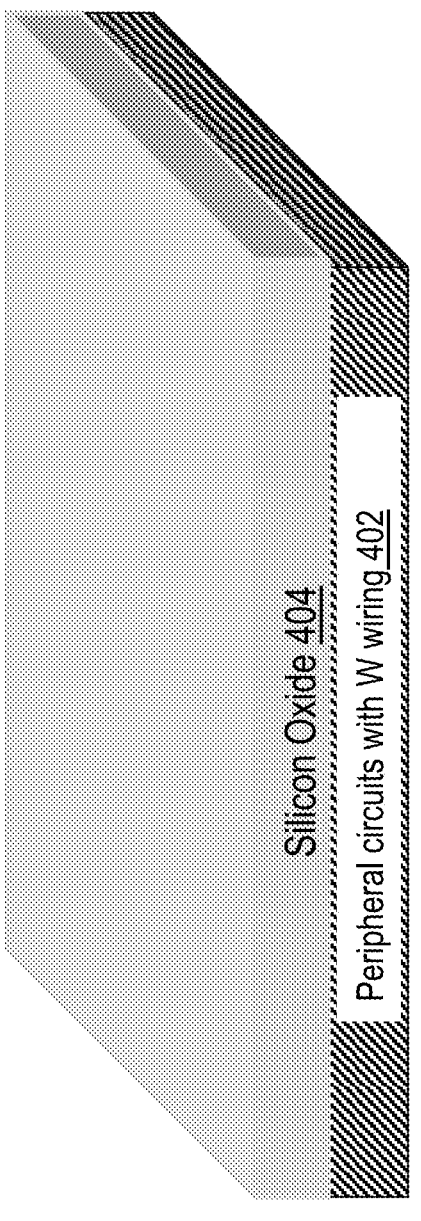
FIGS. 4A-4M are drawing illustrations of the formation of a resistive memory transistor.

As illustrated in FIG. 4A, a silicon substrate with peripheral circuitry 402 may be constructed with high temperature (greater than approximately 400° C.) resistant wiring, such as, for example, Tungsten. The peripheral circuitry substrate 402 may include memory control circuits as well as circuitry for other purposes and of various types, such as, for example, analog, digital, RF, or memory. The peripheral circuitry substrate 402 may include peripheral circuits that can withstand an additional rapid-thermal-anneal (RTA) and still remain operational and retain good performance. For this purpose, the peripheral circuits may be formed such that they have been subject to a partial or weak RTA or no RTA for activating dopants. Silicon oxide layer 404 is deposited on the top surface of the peripheral circuitry substrate.

Figure 4B:
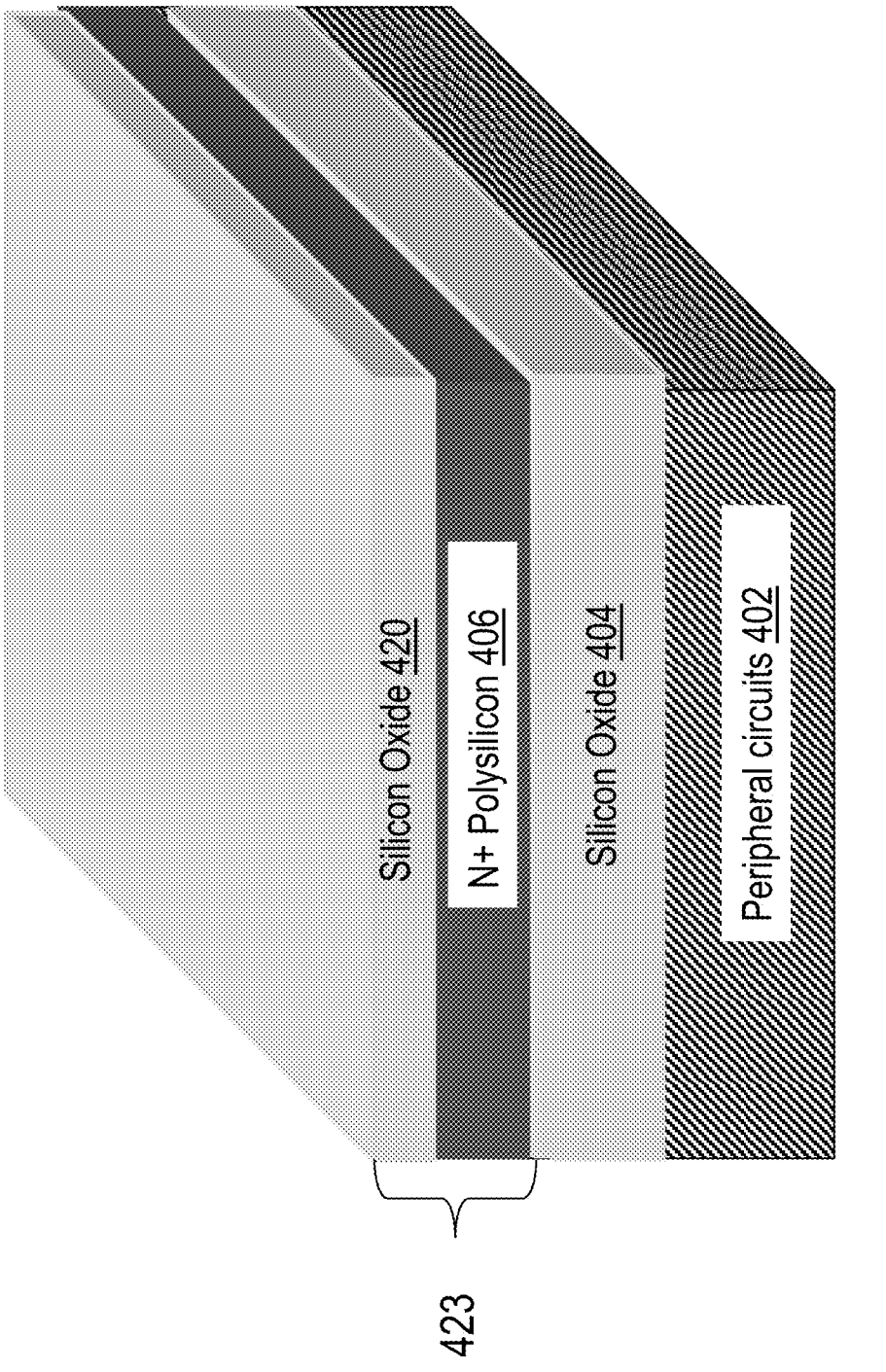

As illustrated in FIG. 4B, a layer of N+ doped poly-crystalline or amorphous silicon 406 may be deposited. The amorphous silicon or poly-crystalline silicon layer 406 may be deposited using a chemical vapor deposition process, such as LPCVD or PECVD, or other process methods, and may be deposited doped with N+ dopants, such as Arsenic or Phosphorous, or may be deposited un-doped and subsequently doped with, such as, ion implantation or PLAD (PLasma Assisted Doping) techniques. Silicon Oxide 420 may then be deposited or grown. This now forms the first Si/SiO2 layer 423 which includes N+ doped poly-crystalline or amorphous silicon layer 406 and silicon oxide layer 420.

Figure 4C:
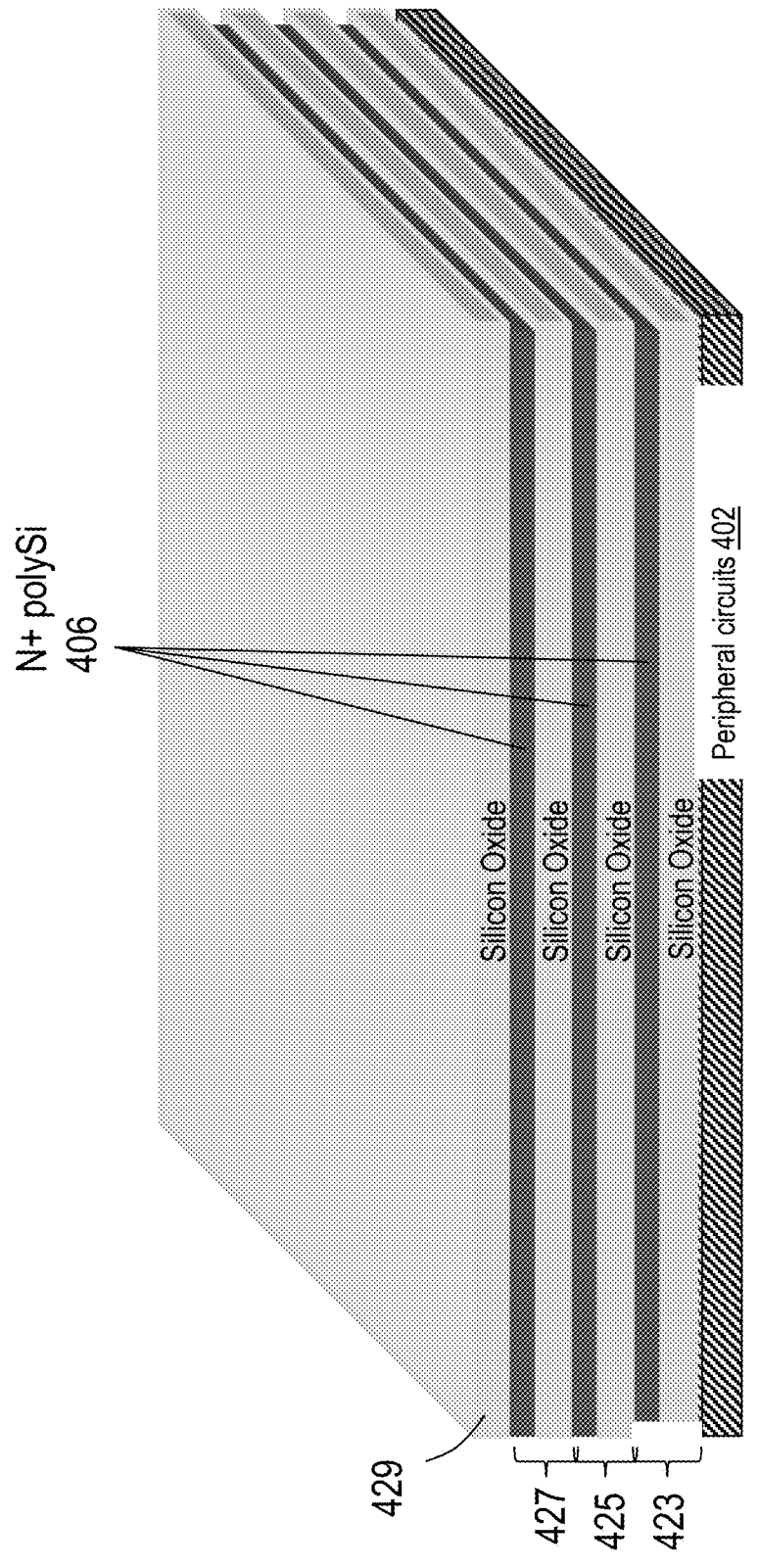

As illustrated in FIG. 4C, additional Si/SiO2 layers, such as, for example, second Si/SiO2 layer 425 and third Si/SiO2 layer 427, may each be formed as described in FIG. 4B. Oxide layer 429 may be deposited to electrically isolate the top N+ doped poly-crystalline or amorphous silicon layer.

Figure 4D:
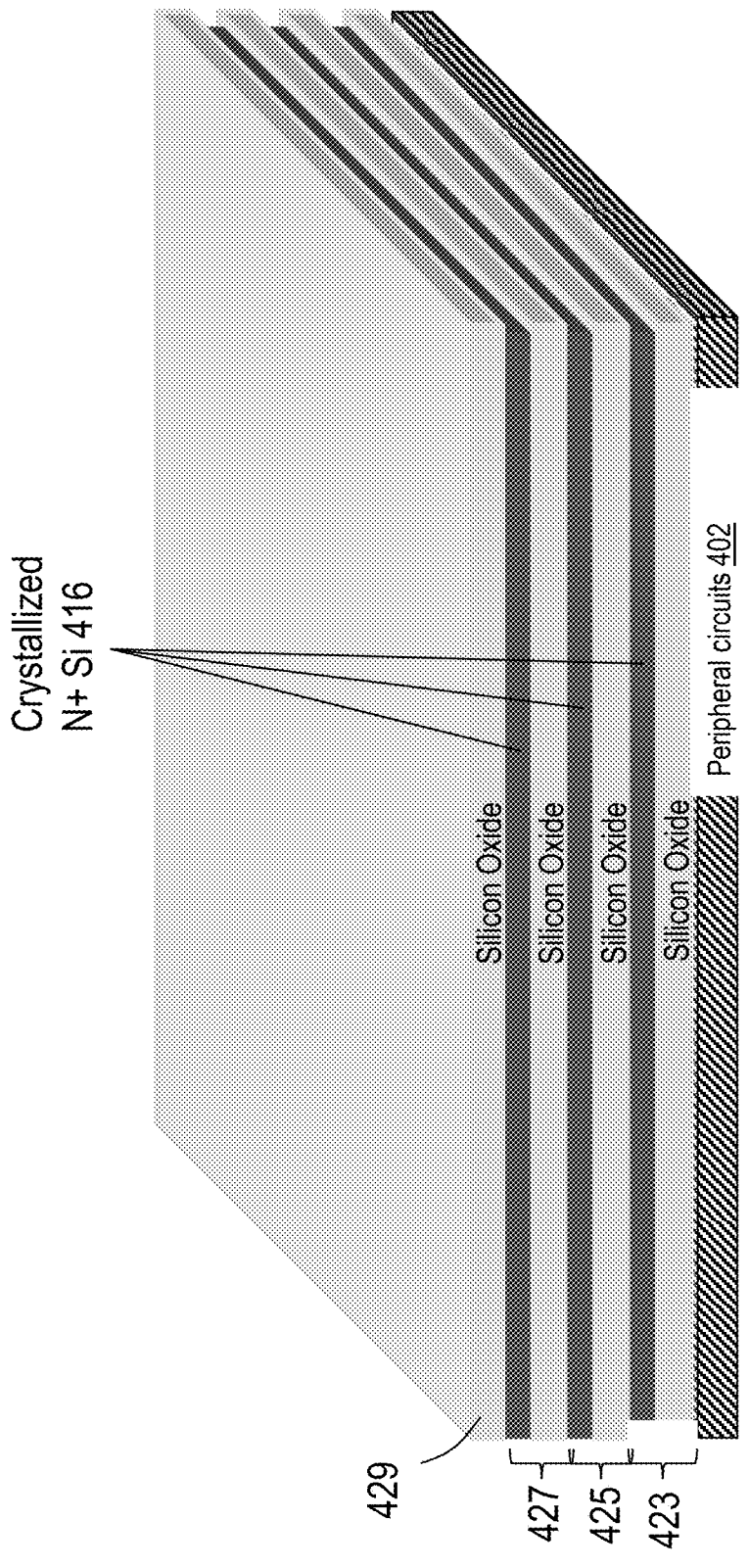

As illustrated in FIG. 4D, a Rapid Thermal Anneal (RTA) is conducted to crystallize the N+ doped poly-crystalline silicon or amorphous silicon layers 406 of first Si/SiO2 layer 423, second Si/SiO2 layer 425, and third Si/SiO2 layer 427, forming crystallized N+ silicon layers 416. Temperatures during this RTA may be as high as approximately 800° C. Alternatively, an optical anneal, such as, for example, a laser anneal, could be performed alone or in combination with the RTA or other annealing processes.

Figure 4E:
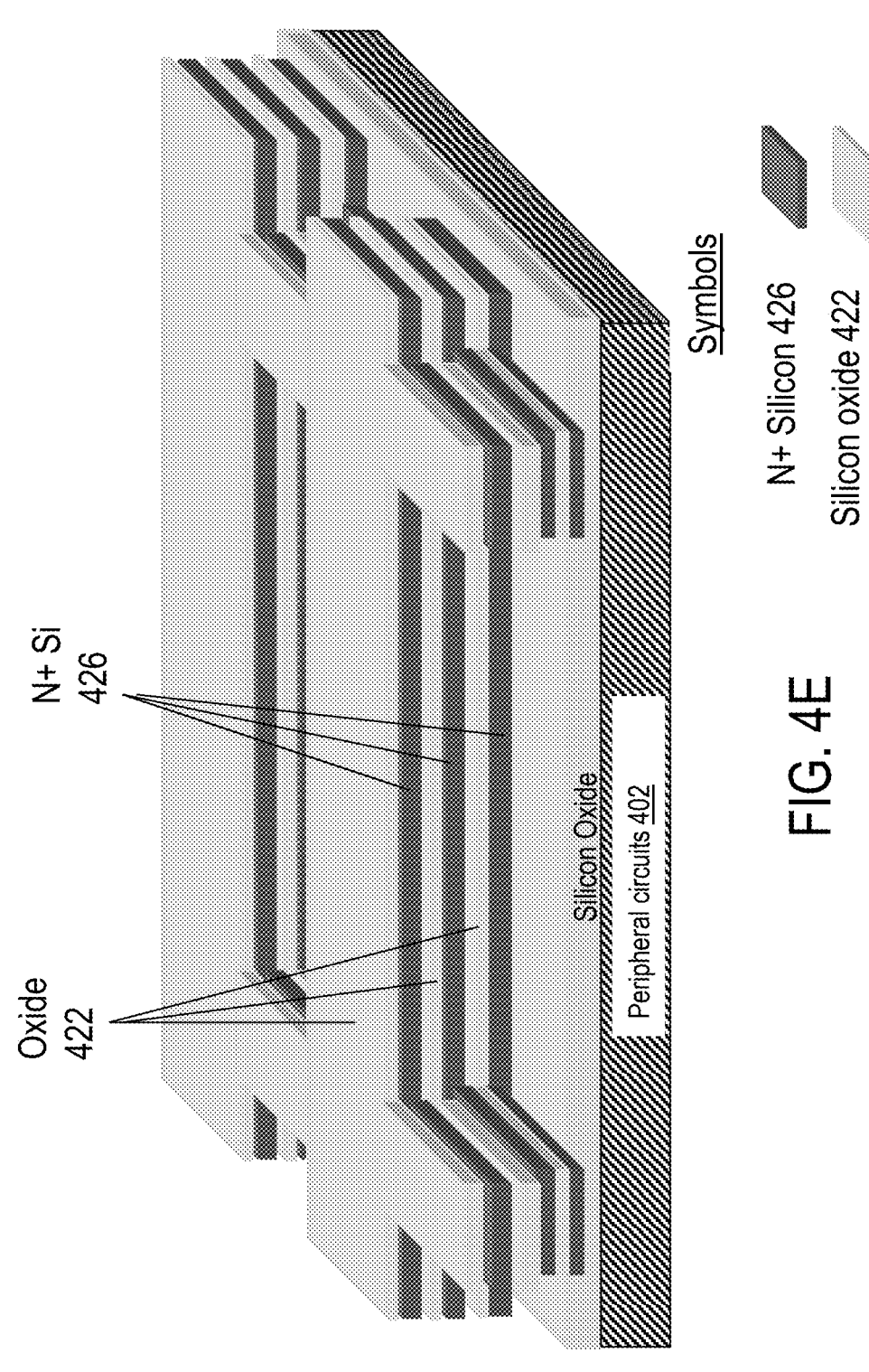

As illustrated in FIG. 4E, oxide 429, third Si/SiO2 layer 427, second Si/SiO2 layer 425 and first Si/SiO2 layer 423 may be lithographically defined and plasma/RIE etched to form a portion of the memory cell structure, which now includes multiple layers of regions of crystallized N+ silicon 426 (previously crystallized N+ silicon layers 416) and oxide 422.

Figure 4F:
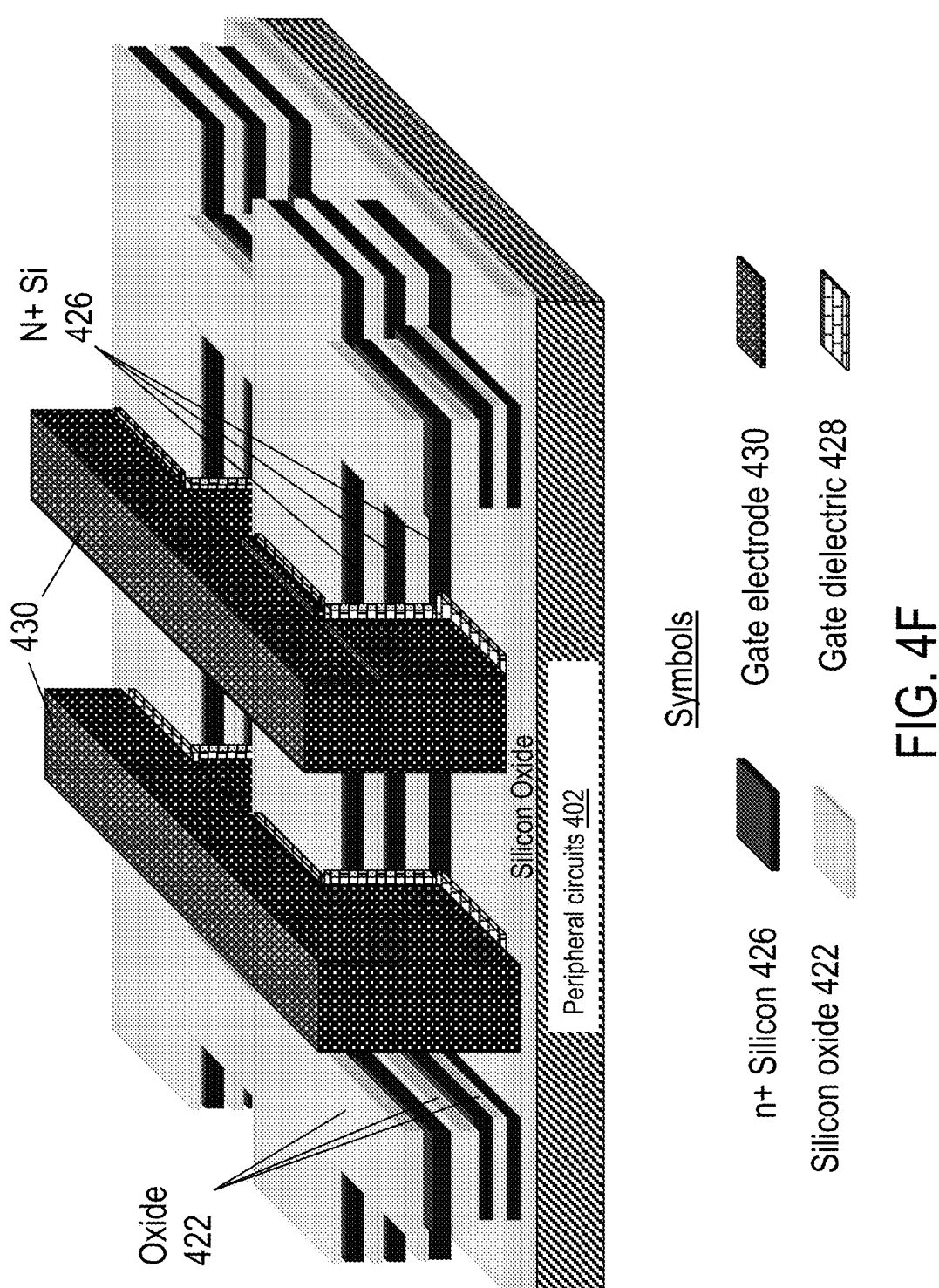

As illustrated in FIG. 4F, a gate dielectric and gate electrode material may be deposited, planarized with a chemical mechanical polish (CMP), and then lithographically defined and plasma/RIE etched to form gate dielectric regions 428 which may either be self aligned to and covered by gate electrodes 430 (shown), or cover the entire crystallized N+ silicon regions 426 and oxide regions 422 multilayer structure. The gate stack including gate electrode 430 and gate dielectric 428 may be formed with a gate dielectric, such as thermal oxide, and a gate electrode material, such as poly-crystalline silicon. Alternatively, the gate dielectric may be an atomic layer deposited (ALD) material that is paired with a work function specific gate metal according to an industry standard of high k metal gate process schemes described previously. Furthermore, the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 4G:
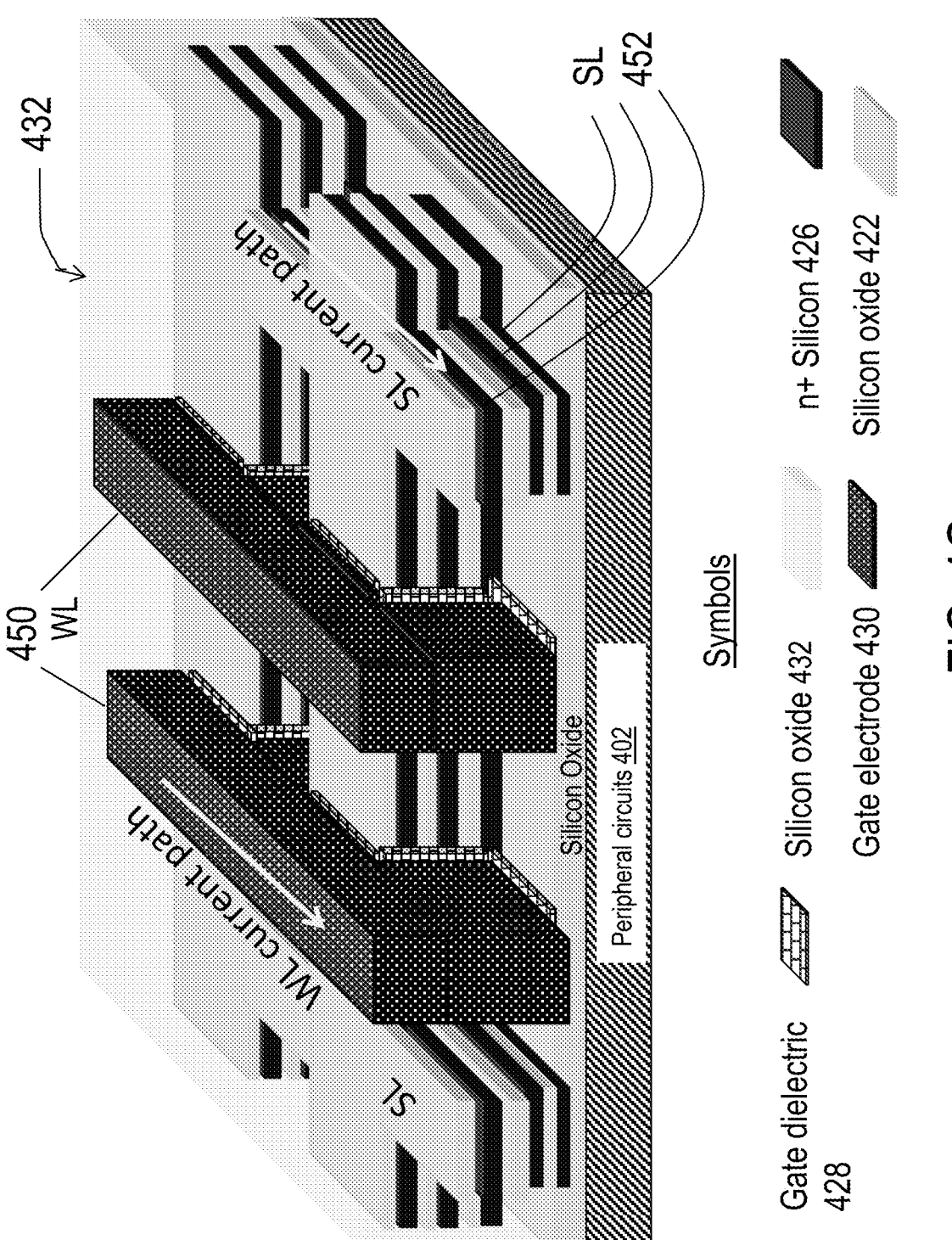

As illustrated in FIG. 4G, the entire structure may be covered with a gap fill oxide 432, which may be planarized with chemical mechanical polishing. The oxide 432 is shown transparently in the figure for clarity, along with word-line regions (WL) 450, coupled with and composed of gate electrodes 430, and source-line regions (SL) 452, composed of crystallized N+ silicon regions 426.

Figure 4H:
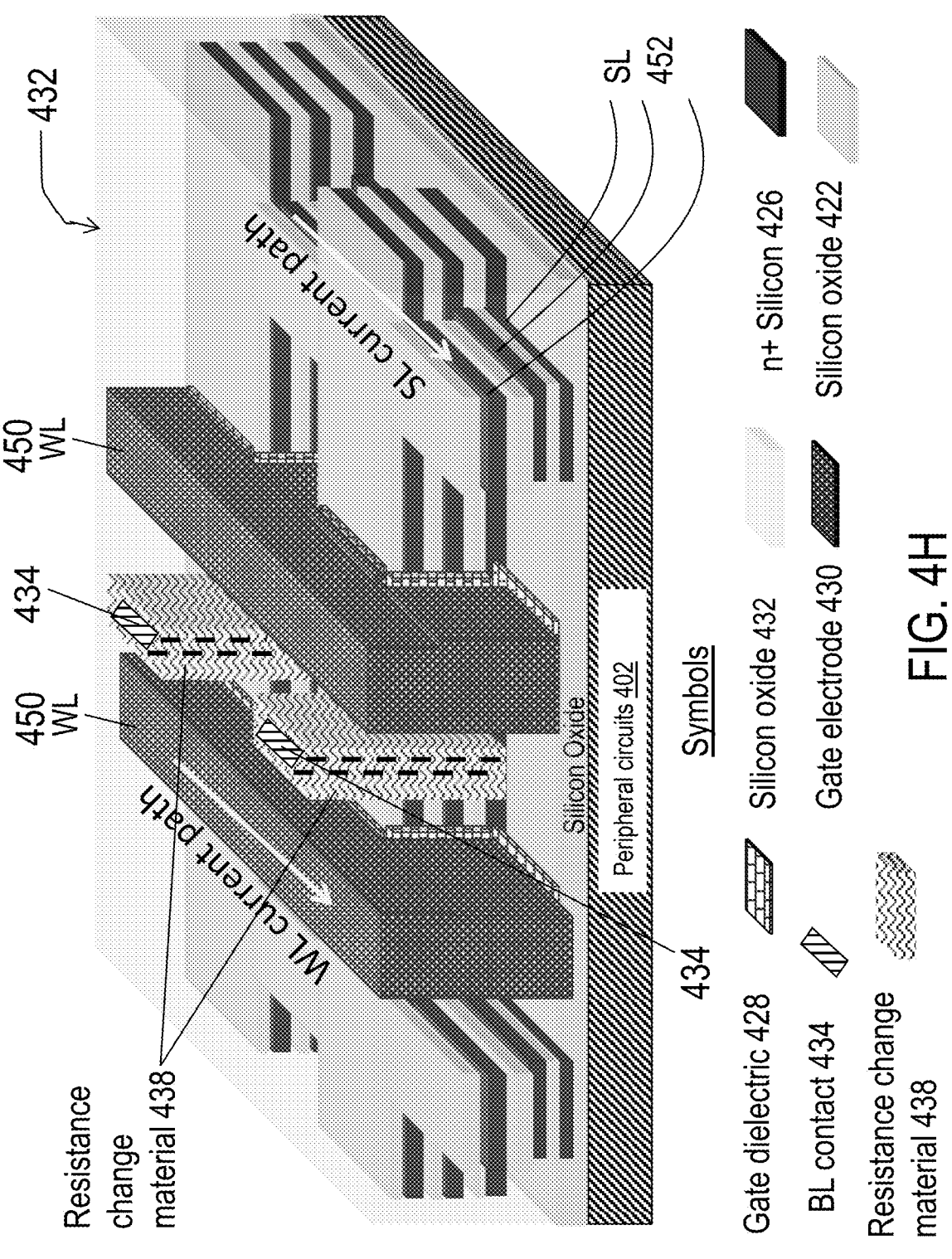

As illustrated in FIG. 4H, bit-line (BL) contacts 434 may be lithographically defined, etched with plasma/RIE through oxide 432, the three crystallized N+ silicon regions 426, and associated oxide vertical isolation regions to connect substantially all memory layers vertically, and photoresist removed. Resistance change memory material 438, such as, for example, hafnium oxides or titanium oxides, may then be deposited, preferably with atomic layer deposition (ALD). The electrode for the resistance change memory element may then be deposited by ALD to form the electrode/BL contact 434. The excess deposited material may be polished to planarity at or below the top of oxide 432. Each BL contact 434 with resistive change material 438 may be shared among substantially all layers of memory, shown as three layers of memory in FIG. 4H.

Figure 4I:
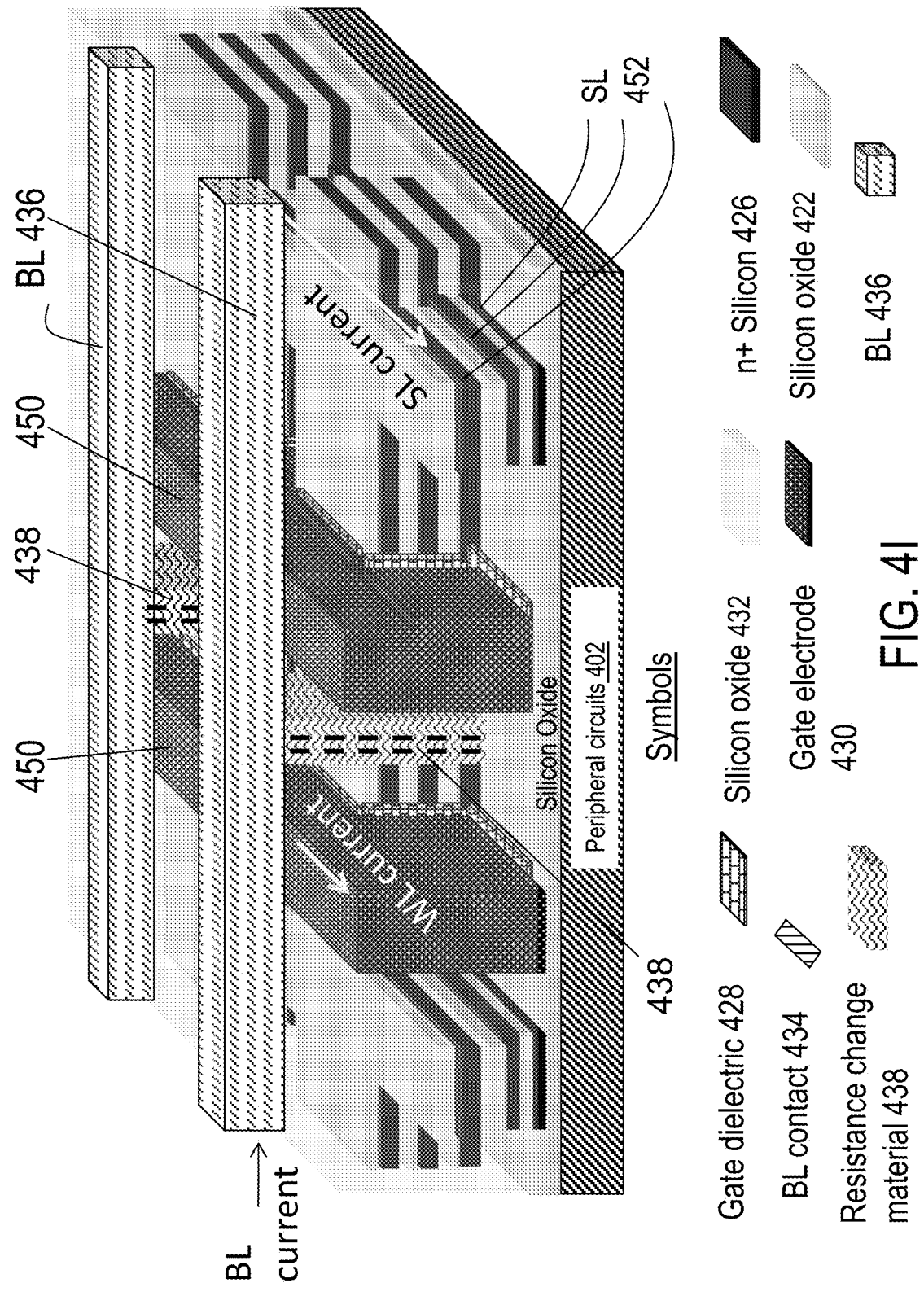

As illustrated in FIG. 4I, BL metal lines 436 may be formed and connected to the associated BL contacts 434 with resistive change material 438. Contacts and associated metal interconnect lines (not shown) may be formed for the WL and SL at the memory array edges. A thru layer via 460 (not shown) may be formed to electrically couple the BL, SL, and WL metallization to the acceptor substrate peripheral circuitry via an acceptor wafer metal connect pad 480 (not shown).

Figure 4J:
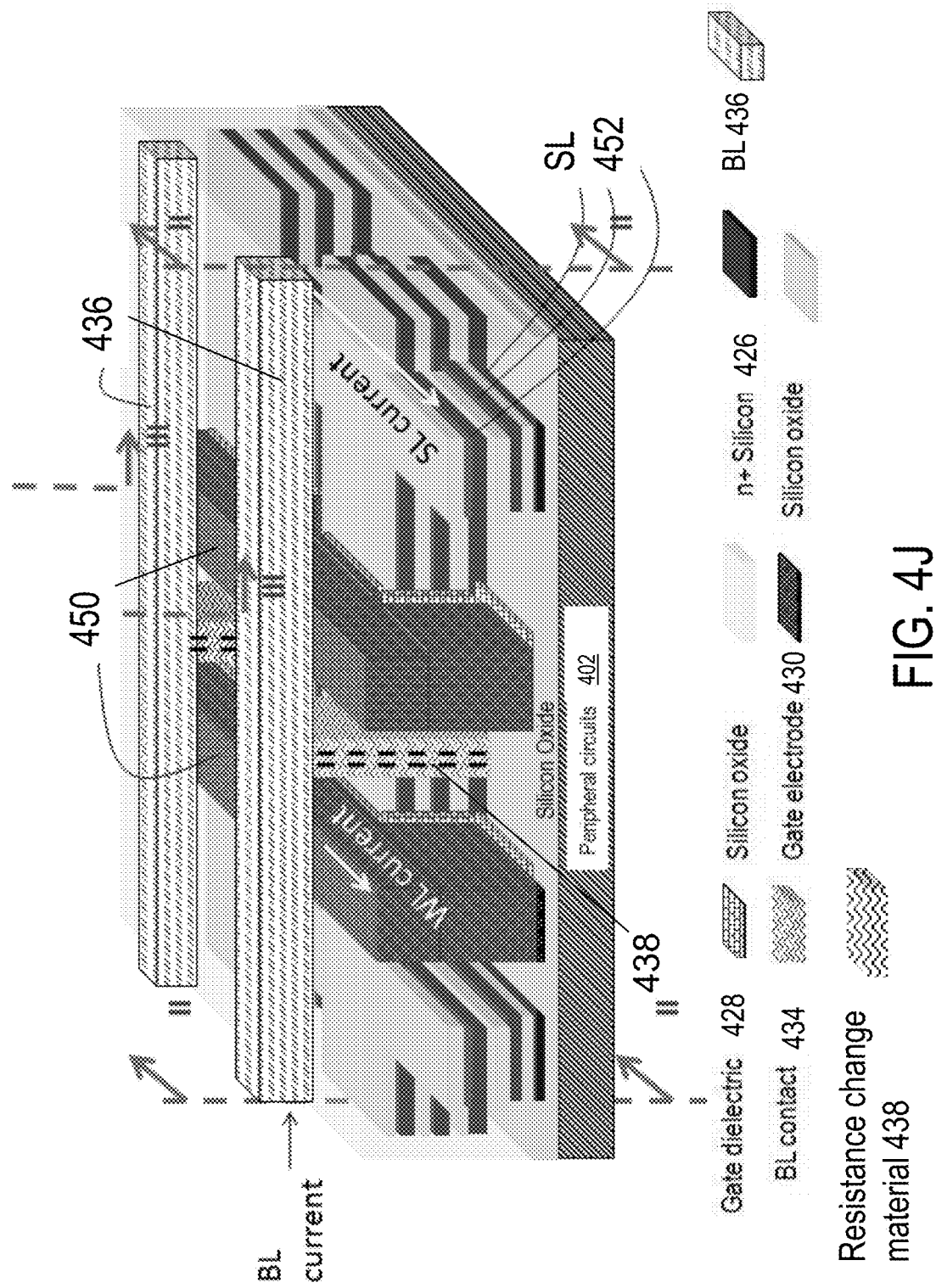
Figures 4K, 4M:
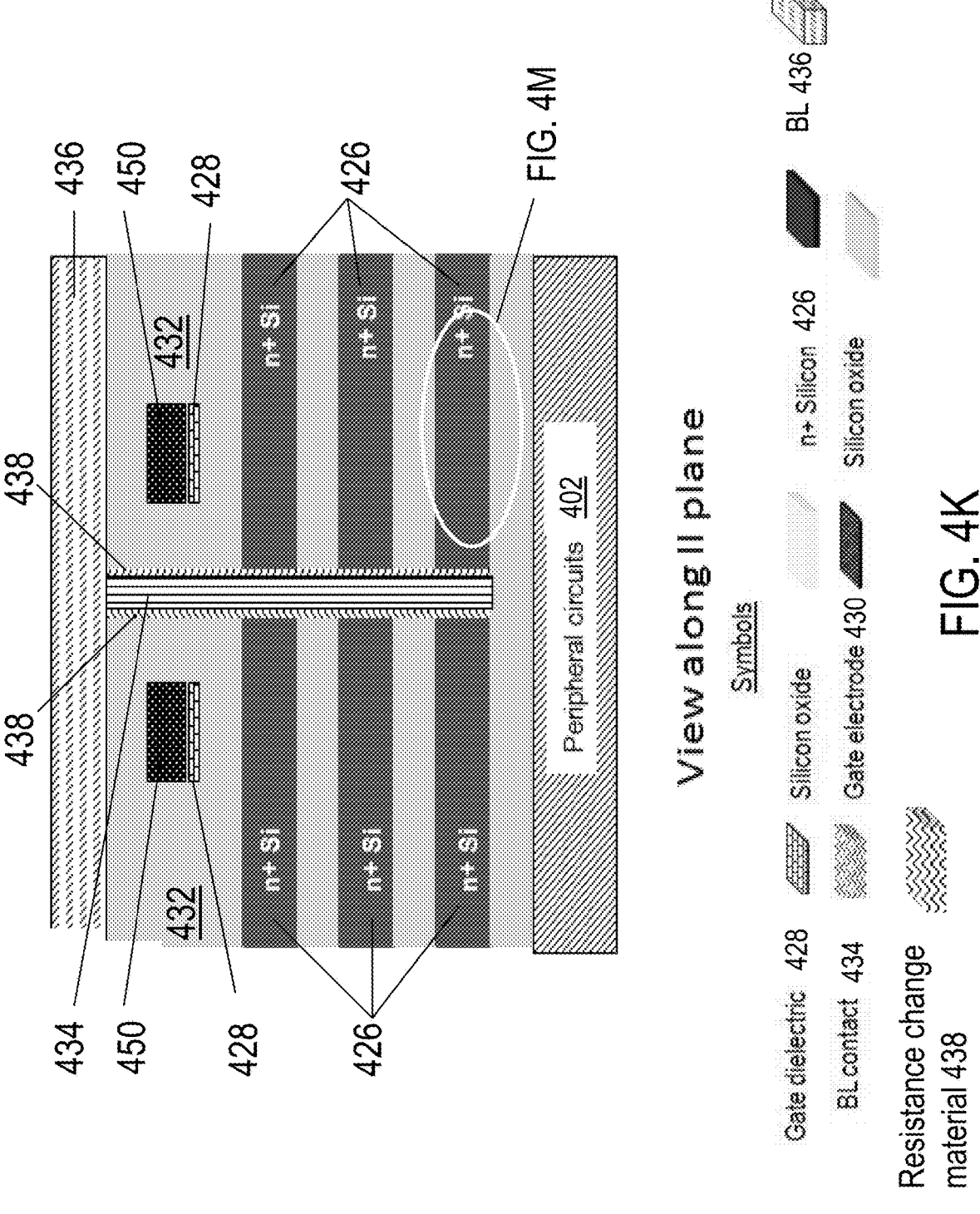
Figure 4L:
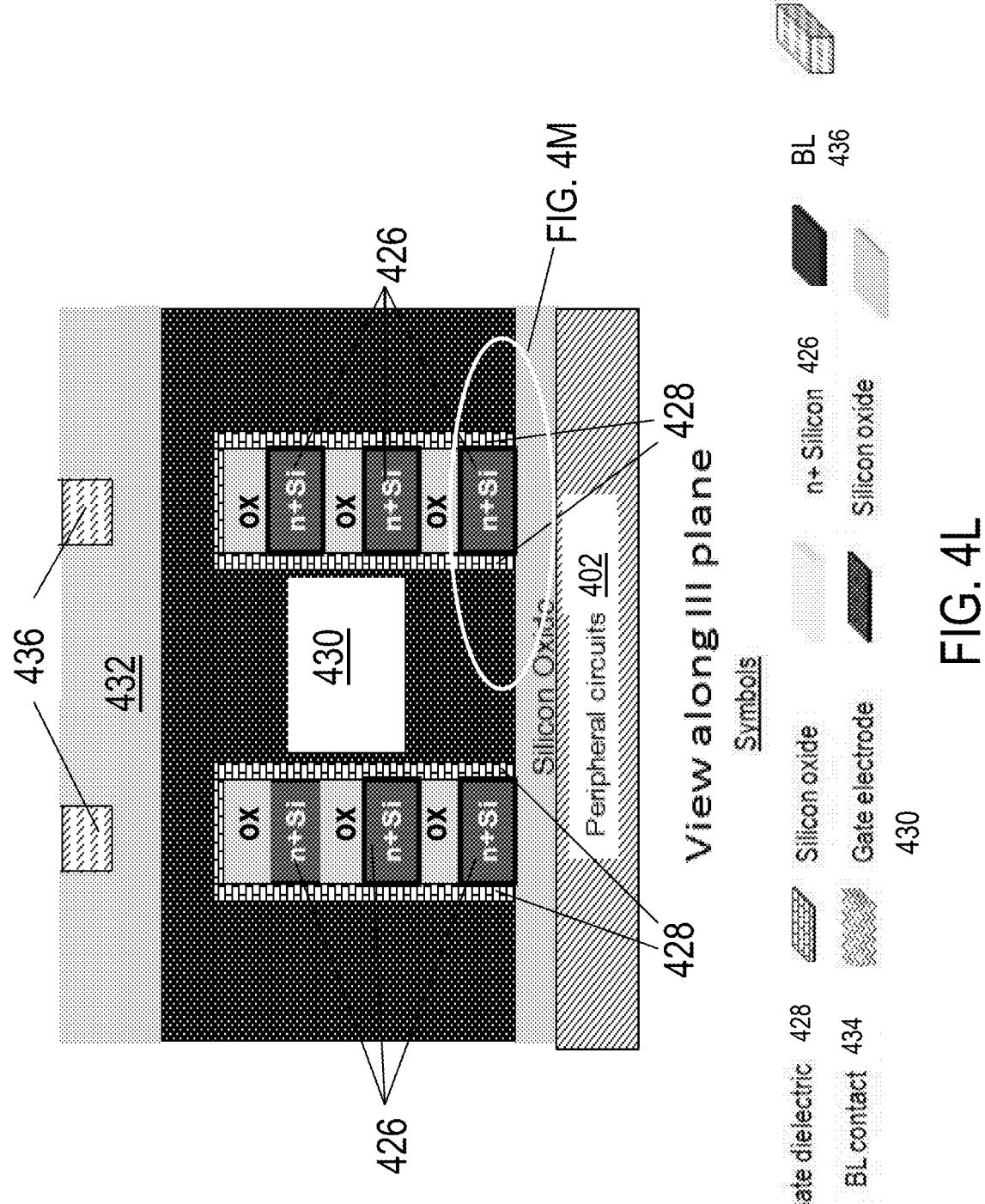
Figure 4M:
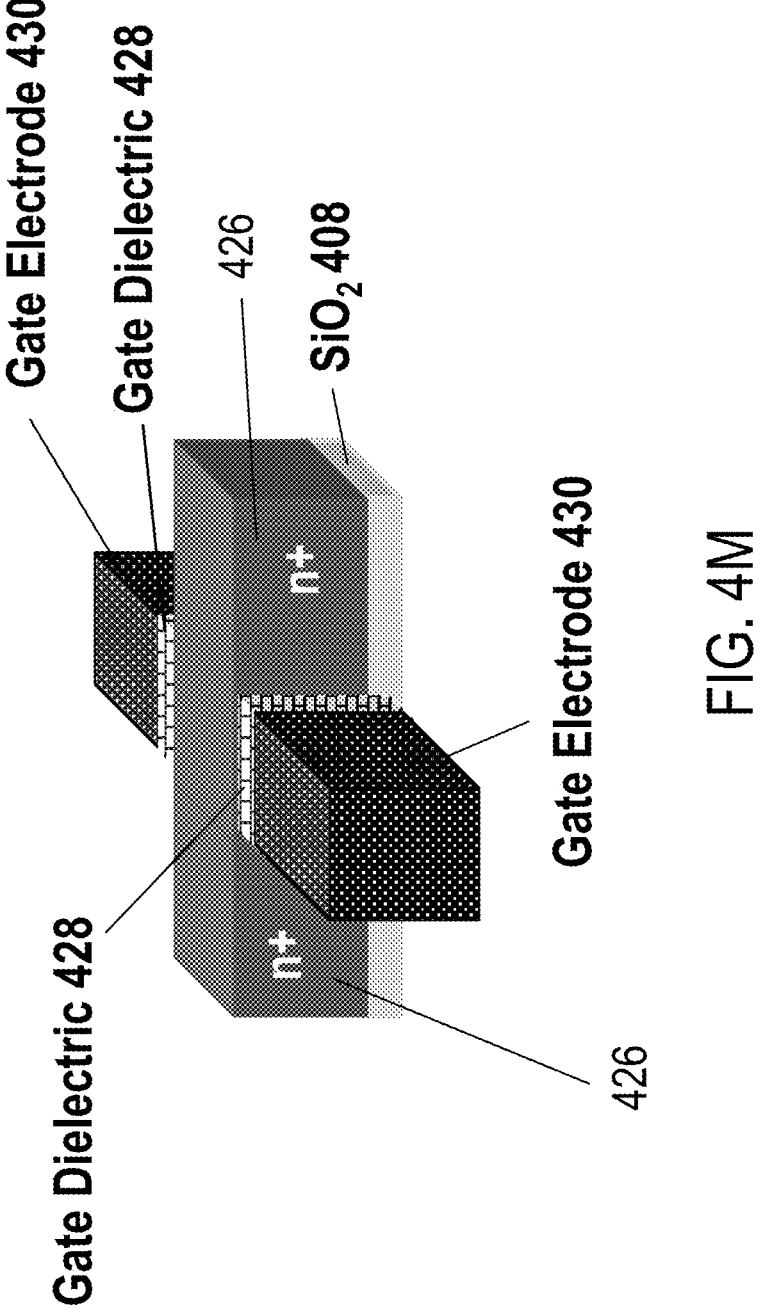

FIG. 4K is a cross sectional cut II view of FIG. 4J, while FIG. 4L is a cross sectional cut III view of FIG. 4J. FIG. 4K shows BL metal line 436, oxide 432, BL contact/electrode 434, resistive change material 438, WL regions 450, gate dielectric 428, crystallized N+ silicon regions 426, and peripheral circuits substrate 402. The BL contact/electrode 434 couples to one side of the three levels of resistive change material 438. The other side of the resistive change material 438 is coupled to crystallized N+ regions 426. FIG. 4L shows BL metal lines 436, oxide 432, gate electrode 430, gate dielectric 428, crystallized N+ silicon regions 426, interlayer oxide region ('ox'), and peripheral circuits substrate 402. The gate electrode 430 is common to substantially all six crystallized N+ silicon regions 426 and forms six two-sided gated junction-less transistors as memory select transistors.

As illustrated in FIG. 4M, a single exemplary two-sided gated junction-less transistor on the first Si/SiO2 layer 423 may include crystallized N+ silicon region 426 (functioning as the source, drain, and transistor channel), and two gate electrodes 430 with associated gate dielectrics 428. The transistor is electrically isolated from beneath by oxide layer 408.

This flow may enable the formation of a resistance-based multi-layer or 3D memory array with zero additional masking steps per memory layer, which utilizes poly-crystalline silicon junction-less transistors and has a resistance-based memory element in series with a select transistor, and is constructed by layer transfers of wafer sized doped poly-crystalline silicon layers, and this 3D memory array may be connected to an underlying multi-metal layer semiconductor device.

Persons of ordinary skill in the art will appreciate that the illustrations in FIGS. 4A through 4M are exemplary only and are not drawn to scale. Such skilled persons will further appreciate that many variations are possible such as, for example, the RTAs and/or optical anneals of the N+ doped poly-crystalline or amorphous silicon layers 406 as described for FIG. 4D may be performed after each Si/SiO2 layer is formed in FIG. 4C. Additionally, N+ doped poly-crystalline or amorphous silicon layer 406 may be doped P+, or with a combination of dopants and other polysilicon network modifiers to enhance the RTA or optical annealing and subsequent crystallization and lower the N+ silicon layer 416 resistivity. Moreover, doping of each crystallized N+ layer may be slightly different to compensate for interconnect resistances. Furthermore, each gate of the double gated 3D resistance based memory can be independently controlled for better control of the memory cell. Many other modifications within the scope of the invention will suggest themselves to such skilled persons after reading this specification. Thus the invention is to be limited only by the appended claims.

As illustrated in FIGS. 5A to 5J, an alternative embodiment of a resistance-based 3D memory with zero additional masking steps per memory layer may be constructed with methods that are suitable for 3D IC manufacturing. This 3D memory utilizes poly-crystalline silicon junction-less transistors that may have either a positive or a negative threshold voltage, a resistance-based memory element in series with a select or access transistor, and may have the periphery circuitry layer formed or layer transferred on top of the 3D memory array.

Figure 5A:
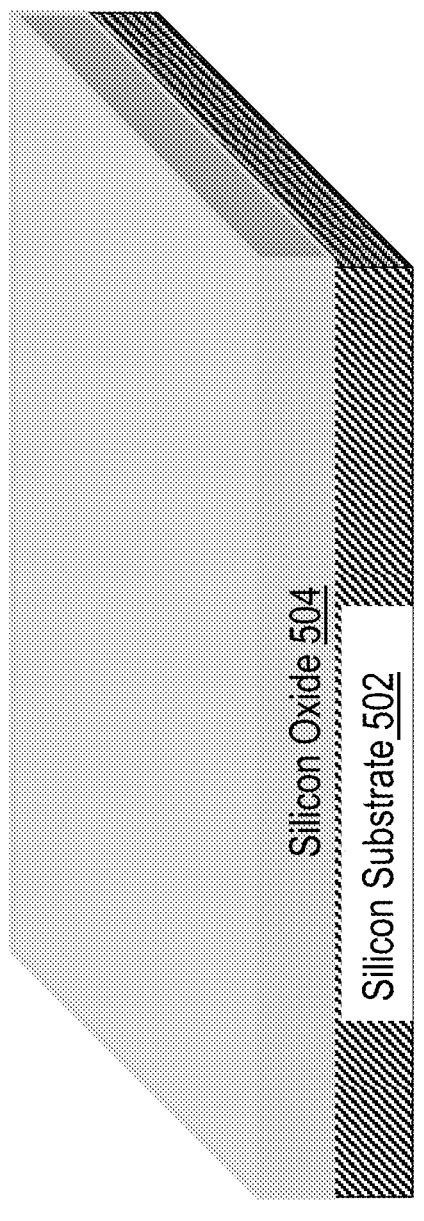
FIGS. 5A-5J are drawing illustrations of the formation of a resistive memory transistor with periphery on top.

As illustrated in FIG. 5A, a silicon oxide layer 504 may be deposited or grown on top of silicon substrate 502.

Figure 5B:
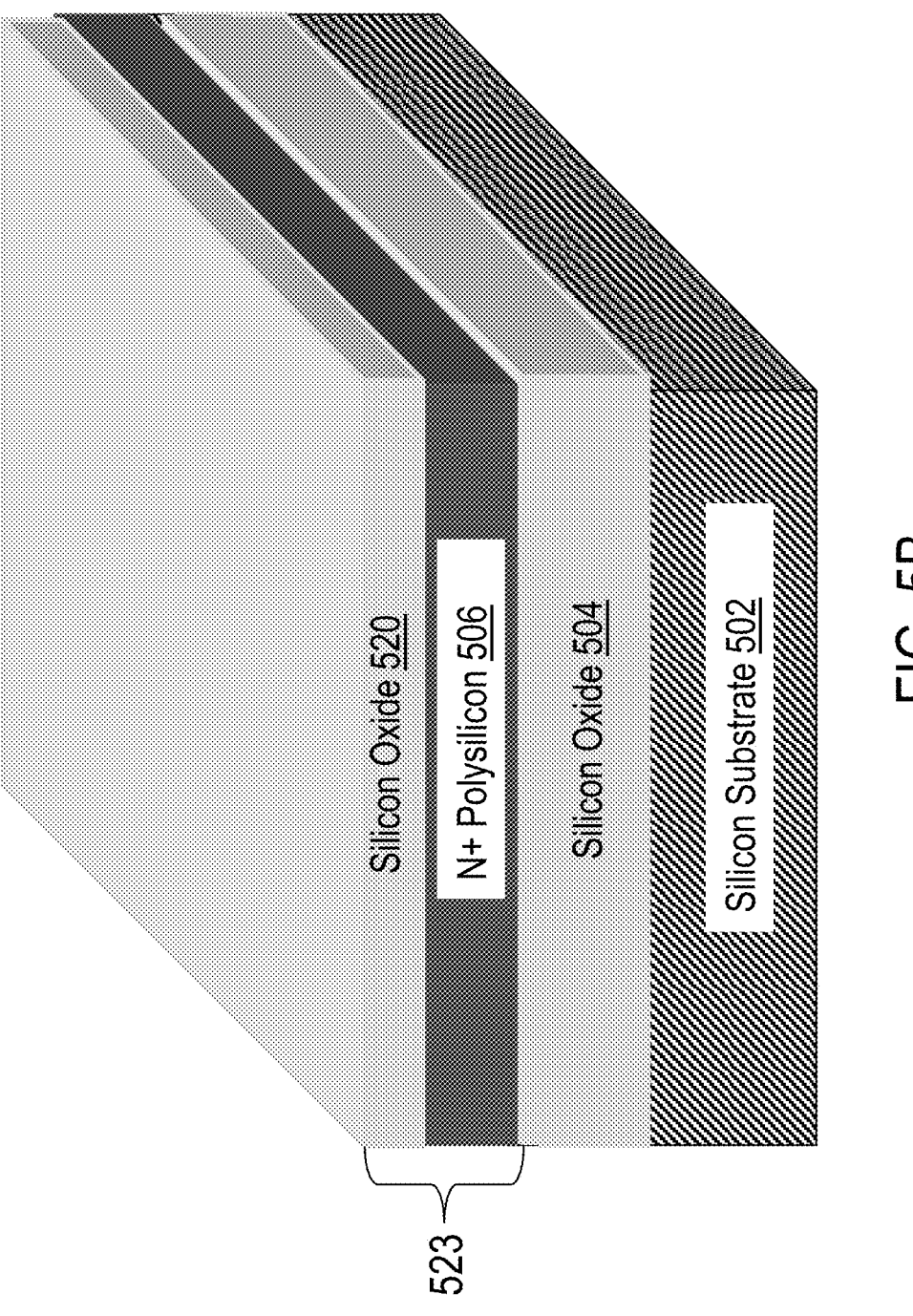

As illustrated in FIG. 5B, a layer of N+ doped poly-crystalline or amorphous silicon 506 may be deposited. The amorphous silicon or poly-crystalline silicon layer 506 may be deposited using a chemical vapor deposition process, such as LPCVD or PECVD, or other process methods, and may be deposited doped with N+ dopants, such as, for example, Arsenic or Phosphorous, or may be deposited un-doped and subsequently doped with, such as, for example, ion implantation or PLAD (PLasma Assisted Doping) techniques. Silicon Oxide 520 may then be deposited or grown. This now forms the first Si/SiO2 layer 523 comprised of N+ doped poly-crystalline or amorphous silicon layer 506 and silicon oxide layer 520.

Figure 5C:
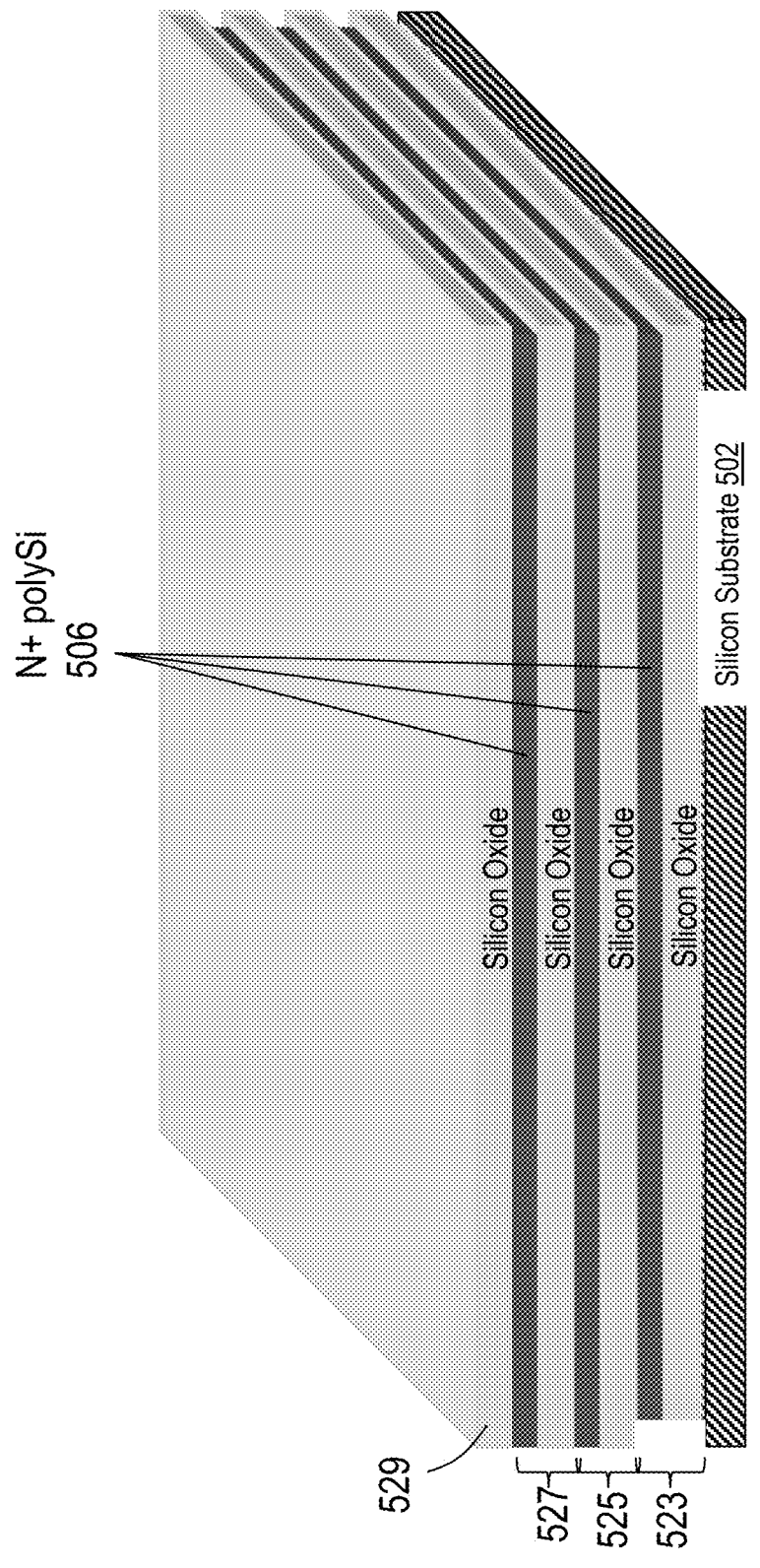

As illustrated in FIG. 5C, additional Si/SiO2 layers, such as, for example, second Si/SiO2 layer 525 and third Si/SiO2 layer 527, may each be formed as described in FIG. 5B. Oxide layer 529 may be deposited to electrically isolate the top N+ doped poly-crystalline or amorphous silicon layer.

Figure 5D:
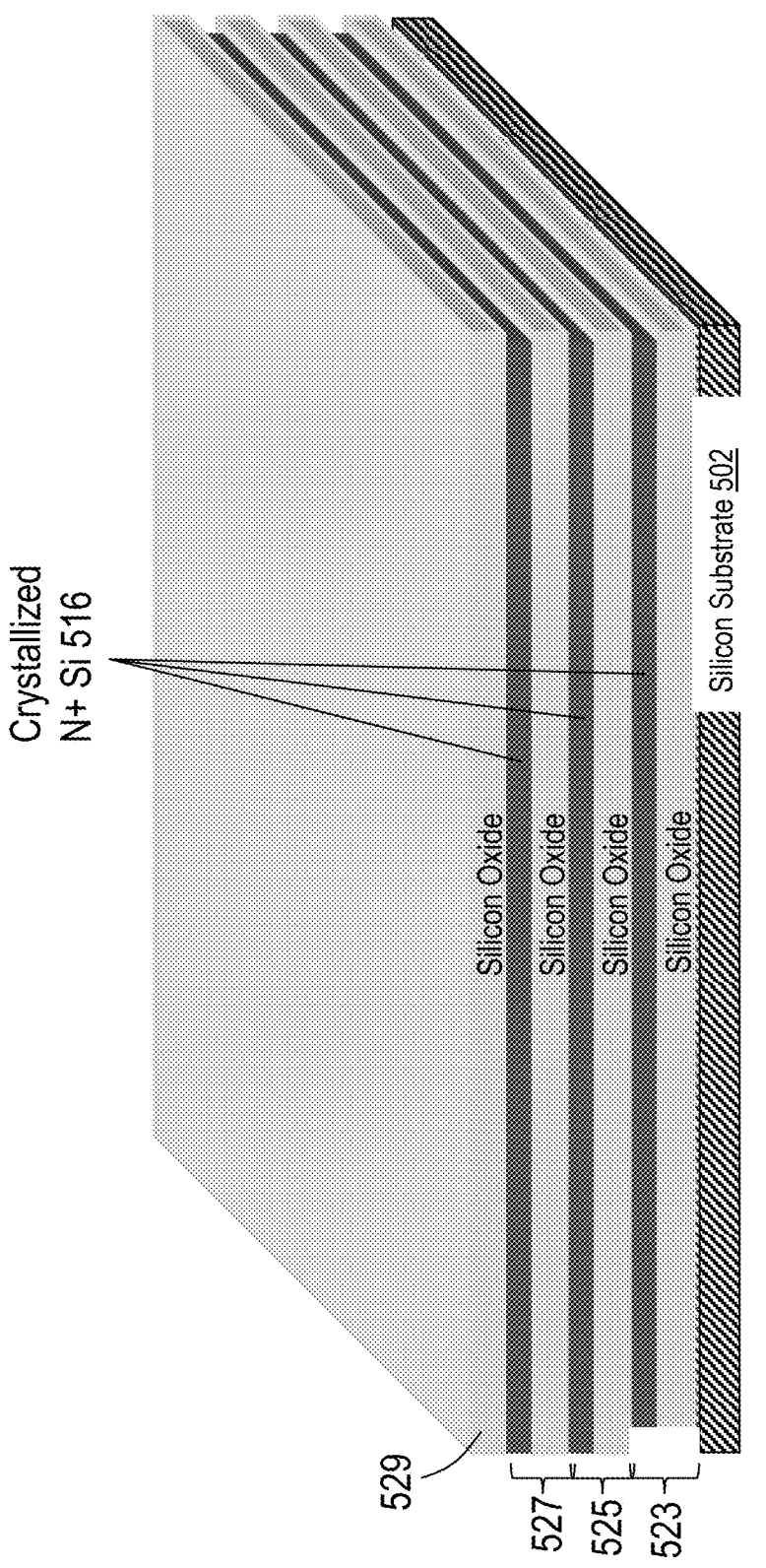

As illustrated in FIG. 5D, a Rapid Thermal Anneal (RTA) is conducted to crystallize the N+ doped poly-crystalline silicon or amorphous silicon layers 506 of first Si/SiO2 layer 523, second Si/SiO2 layer 525, and third Si/SiO2 layer 527, forming crystallized N+ silicon layers 516. Alternatively, an optical anneal, such as, for example, a laser anneal, could be performed alone or in combination with the RTA or other annealing processes. Temperatures during this step could be as high as approximately 700° C., and could even be as high as, for example, 1400° C. Since there are no circuits or metallization underlying these layers of crystallized N+ silicon, very high temperatures (such as, for example, 1400° C.) can be used for the anneal process, leading to very good quality poly-crystalline silicon with few grain boundaries and very high carrier mobilities approaching those of mono-crystalline crystal silicon.

Figure 5E:
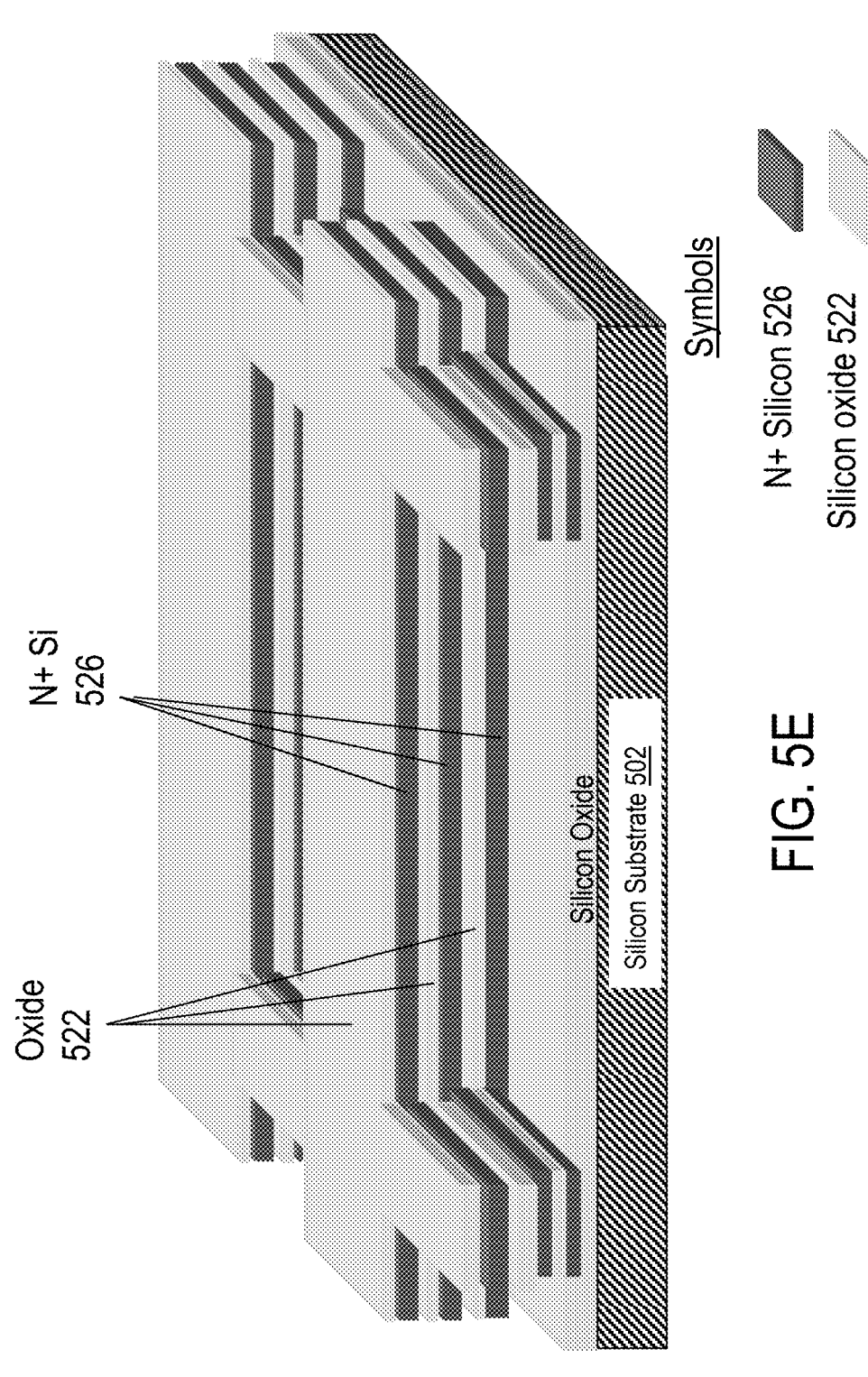

As illustrated in FIG. 5E, oxide 529, third Si/SiO2 layer 527, second Si/SiO2 layer 525 and first Si/SiO2 layer 523 may be lithographically defined and plasma/RIE etched to form a portion of the memory cell structure, which now includes multiple layers of regions of crystallized N+ silicon 526 (previously crystallized N+ silicon layers 516) and oxide 522.

Figure 5F:
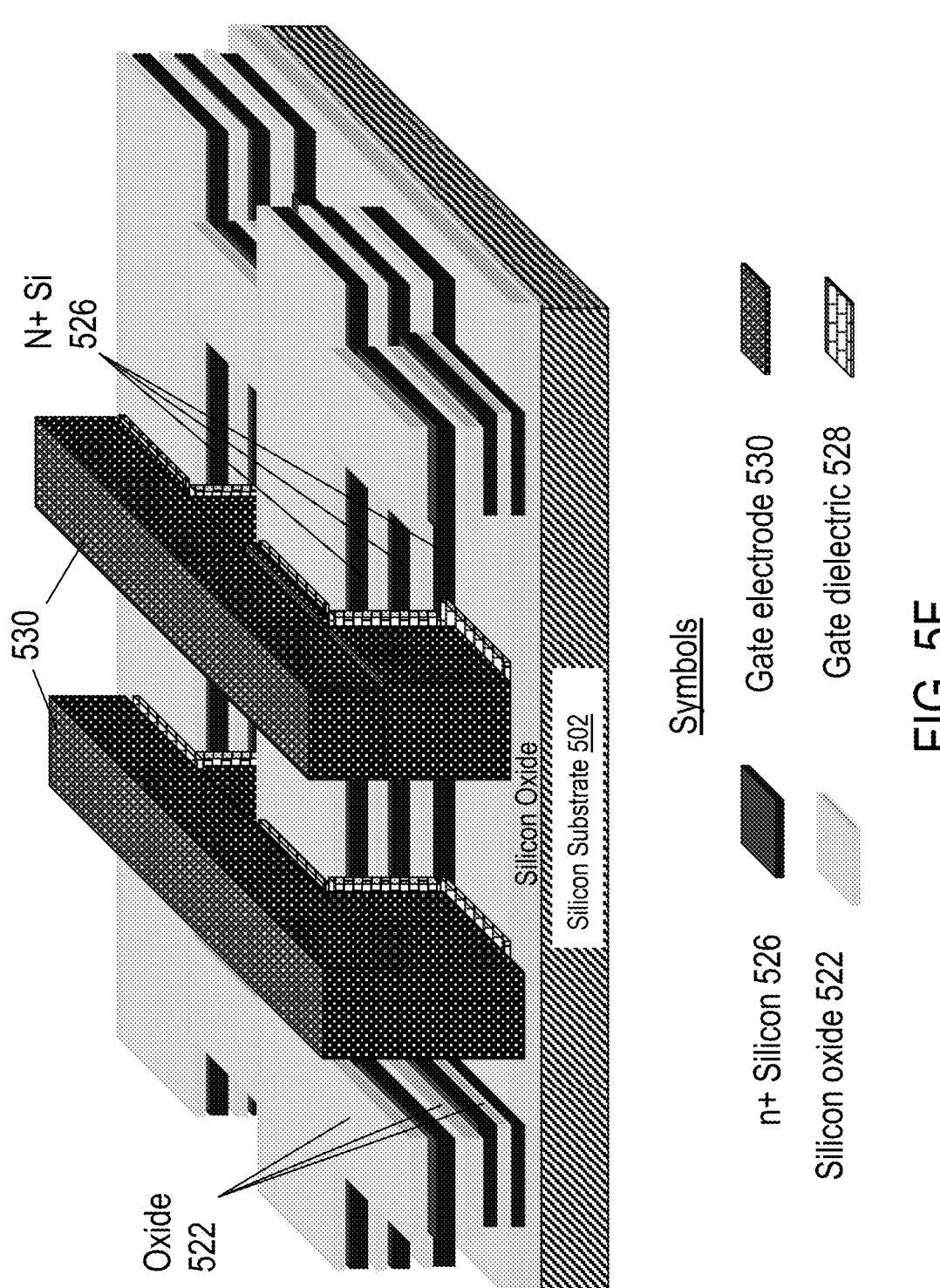

As illustrated in FIG. 5F, a gate dielectric and gate electrode material may be deposited, planarized with a chemical mechanical polish (CMP), and then lithographically defined and plasma/RIE etched to form gate dielectric regions 528 which may either be self aligned to and covered by gate electrodes 530 (shown), or cover the entire crystallized N+ silicon regions 526 and oxide regions 522 multilayer structure. The gate stack including gate electrode 530 and gate dielectric 528 may be formed with a gate dielectric, such as thermal oxide, and a gate electrode material, such as poly-crystalline silicon. Alternatively, the gate dielectric may be an atomic layer deposited (ALD) material that is paired with a work function specific gate metal according to an industry standard of high k metal gate process schemes described previously. Additionally, the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 5G:
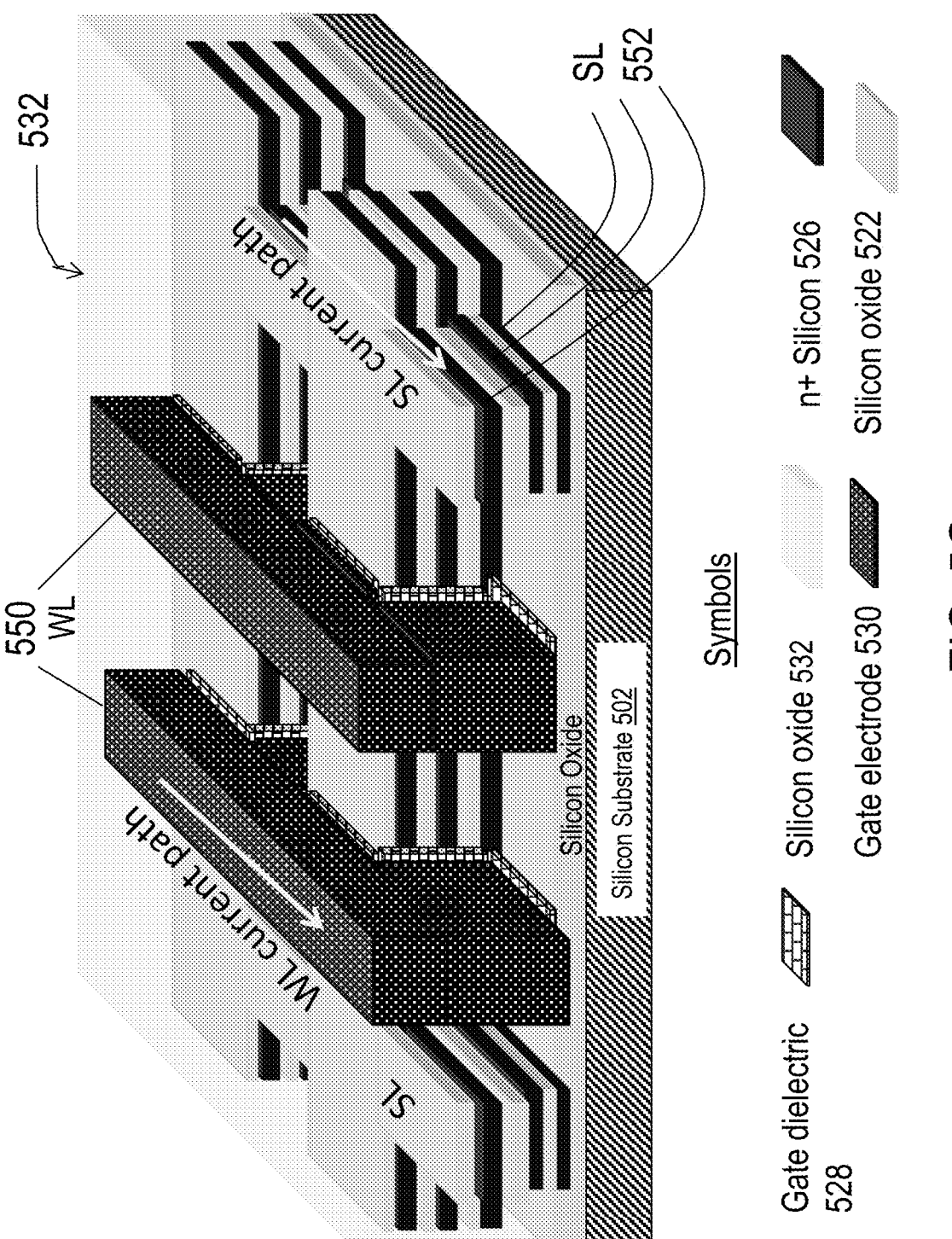

As illustrated in FIG. 5G, the entire structure may be covered with a gap fill oxide 532, which may be planarized with chemical mechanical polishing. The oxide 532 is shown transparently in the figure for clarity, along with word-line regions (WL) 550, coupled with and composed of gate electrodes 530, and source-line regions (SL) 552, composed of crystallized N+ silicon regions 526.

Figure 5H:
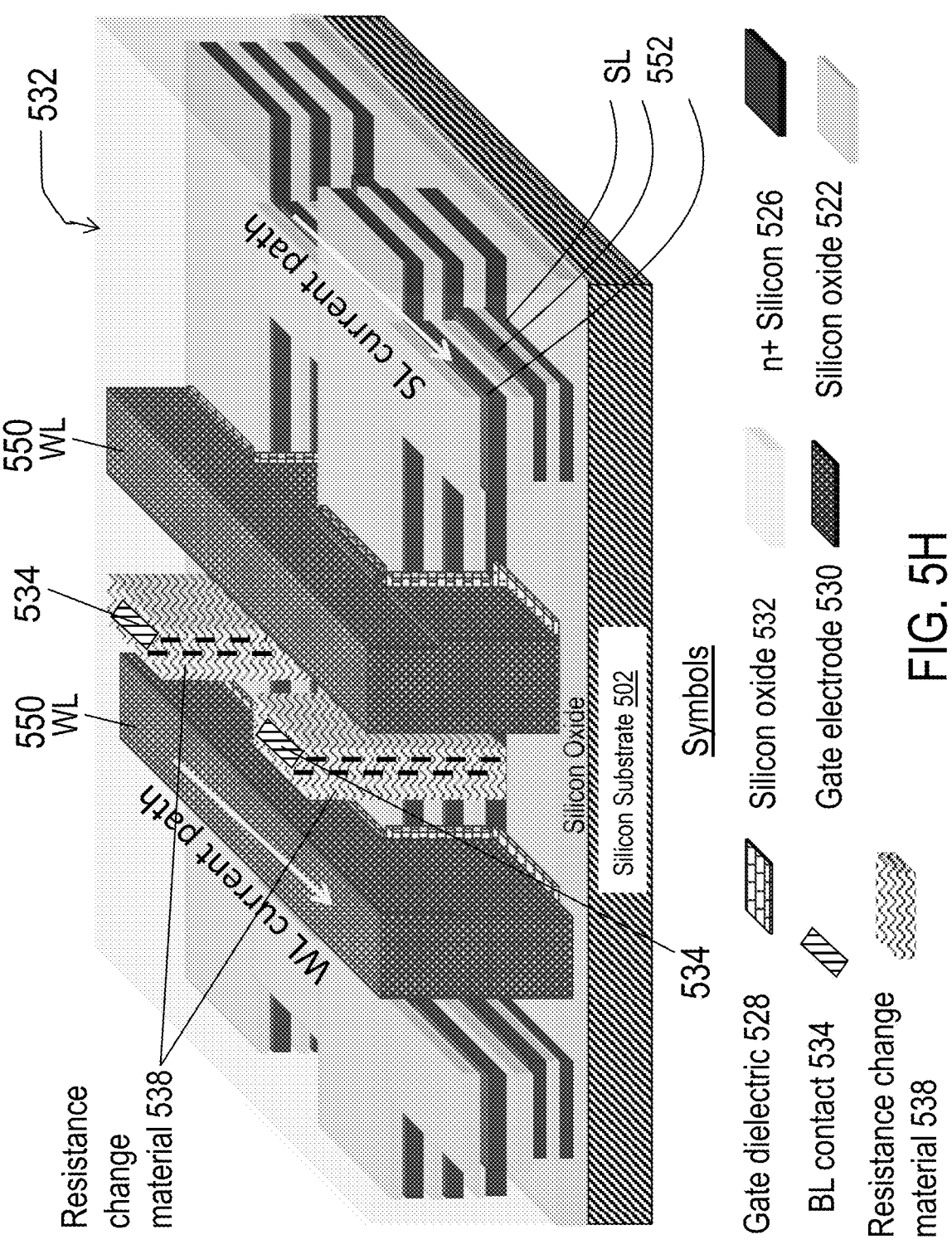

As illustrated in FIG. 5H, bit-line (BL) contacts 534 may be lithographically defined, etched along with plasma/RIE through oxide 532, the three crystallized N+ silicon regions 526, and the associated oxide vertical isolation regions to connect substantially all memory layers vertically. BL contacts 534 may then be processed by a photoresist removal. Resistance change memory material 538, such as hafnium oxides or titanium oxides, may then be deposited, preferably with atomic layer deposition (ALD). The electrode for the resistance change memory element may then be deposited by ALD to form the electrode/BL contact 534. The excess deposited material may be polished to planarity at or below the top of oxide 532. Each BL contact 534 with resistive change material 538 may be shared among substantially all layers of memory, shown as three layers of memory in FIG. 5H.

Figure 5I:
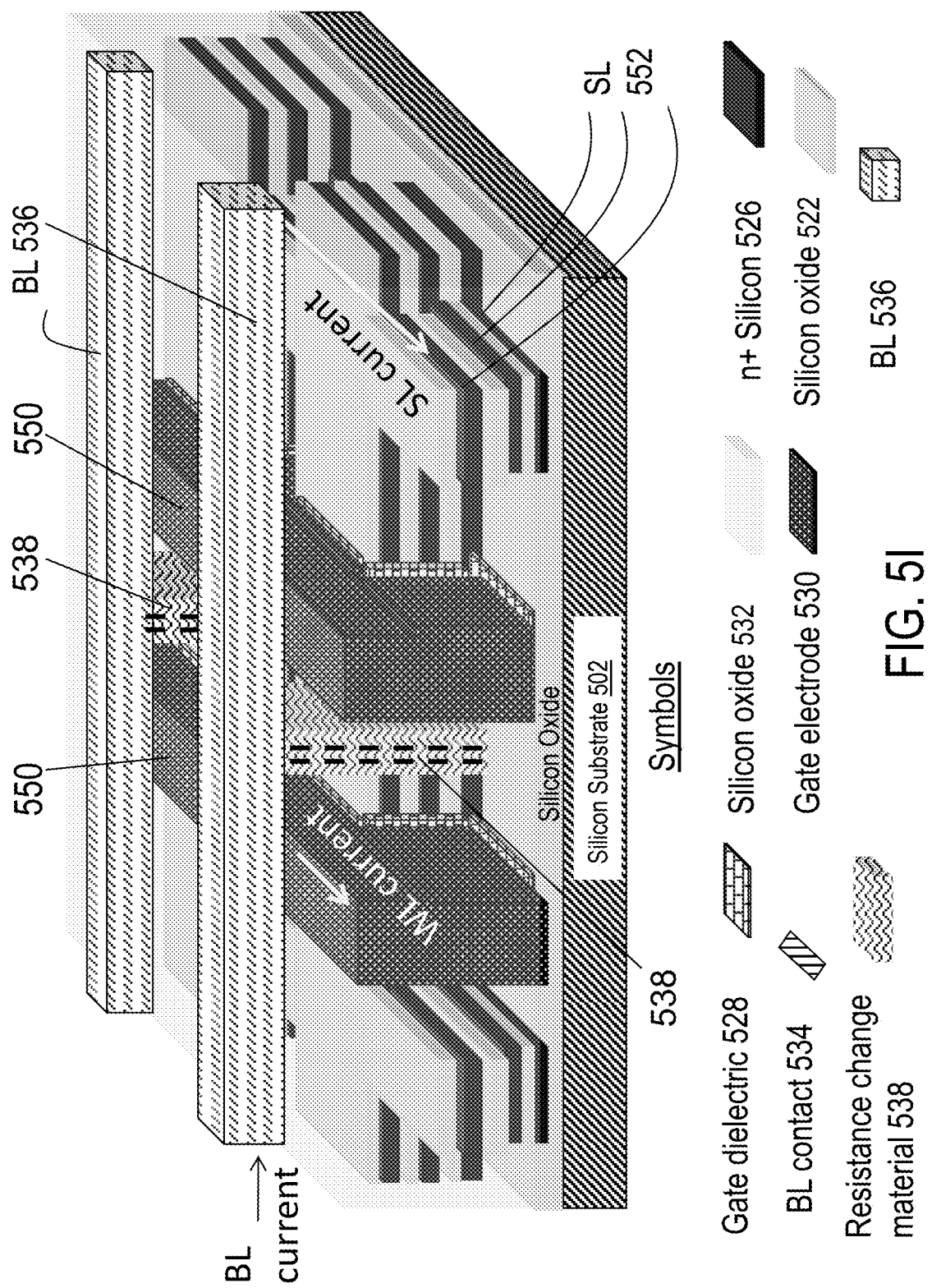

As illustrated in FIG. 5I, BL metal lines 536 may be formed and connected to the associated BL contacts 534 with resistive change material 538. Contacts and associated metal interconnect lines (not shown) may be formed for the WL and SL at the memory array edges.

Figure 5J:
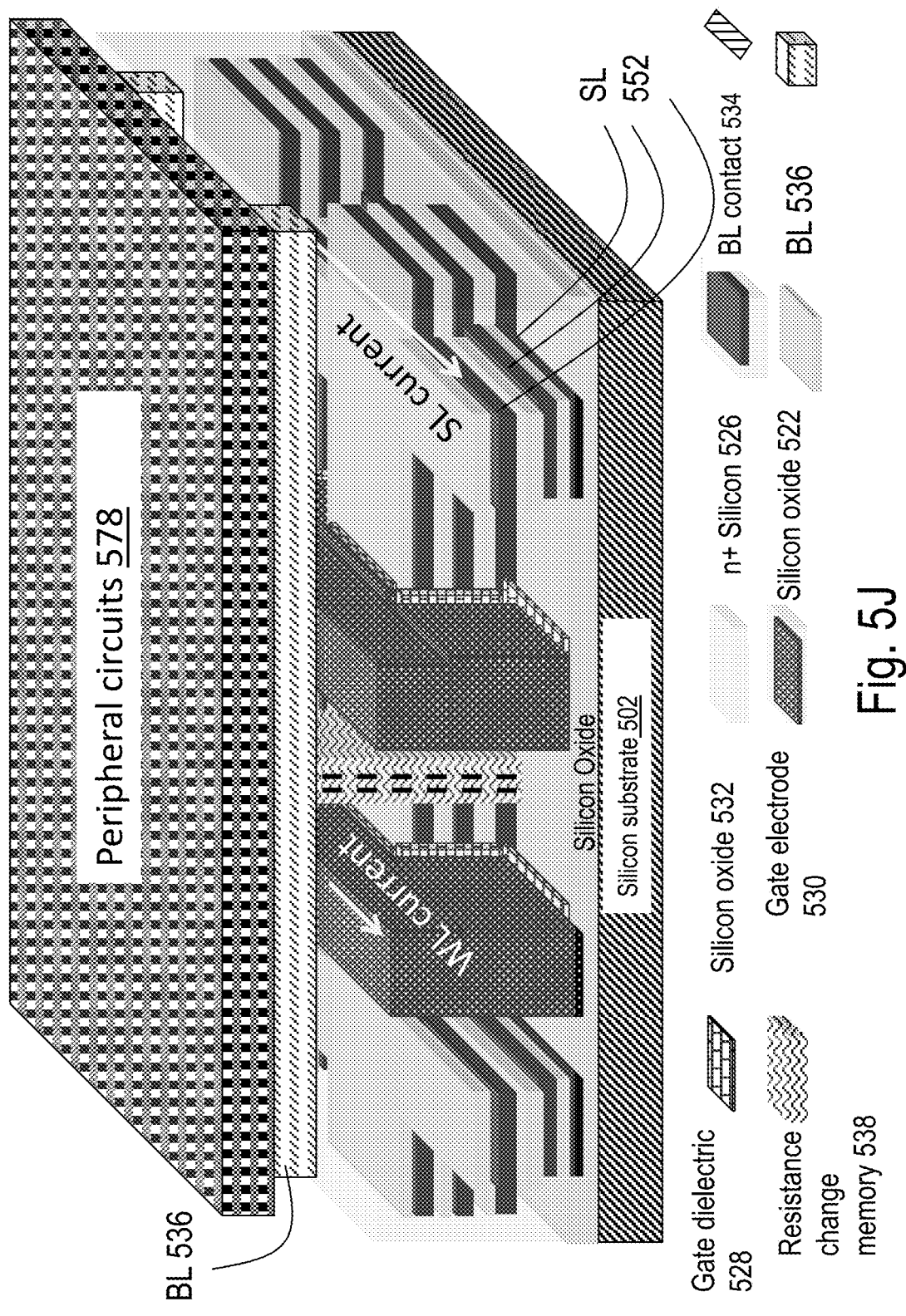

As illustrated in FIG. 5J, peripheral circuits 578 may be constructed and then layer transferred, using methods described previously such as, for example, ion-cut with replacement gates, to the memory array, and then thru layer vias (not shown) may be formed to electrically couple the periphery circuitry to the memory array BL, WL, SL and other connections such as, for example, power and ground. Alternatively, the periphery circuitry may be formed and directly aligned to the memory array and silicon substrate 502 utilizing the layer transfer of wafer sized doped layers and subsequent processing, such as, for example, the junction-less, RCAT, V-groove, or bipolar transistor formation flows as previously described.

This flow may enable the formation of a resistance-based multi-layer or 3D memory array with zero additional masking steps per memory layer, which utilizes poly-crystalline silicon junction-less transistors and has a resistance-based memory element in series with a select transistor, and is constructed by layer transfers of wafer sized doped polycrystalline silicon layers, and this 3D memory array may be connected to an overlying multi-metal layer semiconductor device or periphery circuitry.

Persons of ordinary skill in the art will appreciate that the illustrations in FIGS. 5A through 5J are exemplary only and are not drawn to scale. Such skilled persons will further appreciate that many variations are possible such as, for example, the RTAs and/or optical anneals of the N+ doped poly-crystalline or amorphous silicon layers 506 as described for FIG. 5D may be performed after each Si/SiO2 layer is formed in FIG. 5C. Additionally, N+ doped poly-crystalline or amorphous silicon layer 506 may be doped P+, or with a combination of dopants and other polysilicon network modifiers to enhance the RTA or optical annealing crystallization and subsequent crystallization, and lower the N+ silicon layer 516 resistivity. Moreover, doping of each crystallized N+ layer may be slightly different to compensate for interconnect resistances. Besides, each gate of the double gated 3D resistance based memory can be independently controlled for better control of the memory cell. Furthermore, by proper choice of materials for memory layer transistors and memory layer wires (e.g., by using tungsten and other materials that withstand high temperature processing for wiring), standard CMOS transistors may be processed at high temperatures (e.g., >700° C.) to form the periphery circuitry 578. Many other modifications within the scope of the invention will suggest themselves to such skilled persons after reading this specification. Thus the invention is to be limited only by the appended claims.

Constructing 3D ICs utilizing multiple layers of different function may combine 3D layers using the layer transfer techniques according to some embodiments of the current invention, with fully prefabricated device connected by industry standard TSV technique.

An additional function that would fit well for 3D systems using TSVs, as described, is a power control function. In many cases it is desired to shut down power at times to a portion of the IC that is not currently operational. Using controlled power distribution by an external die connected by TSVs is advantageous as the power supply voltage to this external die could be higher because it is using an older process. Having a higher supply voltage allows easier and better control of power distribution to the controlled die.

Those components of configurable systems could be built by one vendor, or by multiple vendors, who agree on a standard physical interface to allow mix-and-match of various dies from various vendors.

Another advantage of some embodiments of this invention may be an ability to mix and match various processes. It might be advantageous to use memory from a leading edge process, while the I/O, and maybe an analog function die, could be used from an older process of mature technology (e.g., as discussed above)

Figure 6:
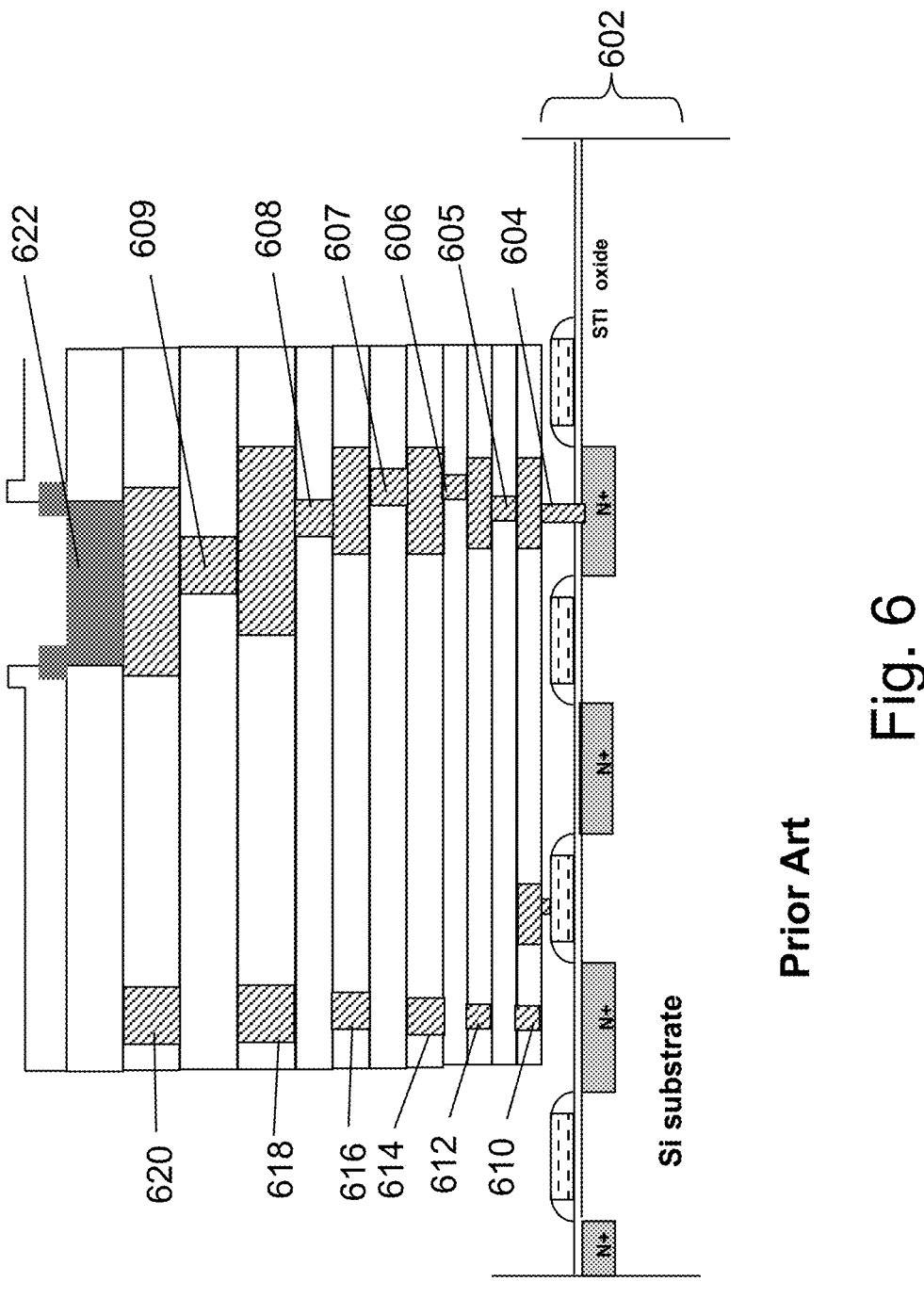
FIG. 6 is a drawing illustration of a metal interconnect stack prior art.

Additionally, when circuit cells are built on two or more layers of thin silicon as shown above, and enjoy the dense vertical thru silicon via interconnections, the metallization layer scheme to take advantage of this dense 3D technology may be improved as follows. FIG. 6 illustrates the prior art of silicon integrated circuit metallization schemes. The conventional transistor silicon layer 602 is connected to the first metal layer 610 thru the contact 604. The dimensions of this interconnect pair of contact and metal lines generally are at the minimum line resolution of the lithography and etch capability for that technology process node. Traditionally, this is called a '1×' design rule metal layer. Usually, the next metal layer is also at the '1×' design rule, the metal line 612 and via below 605 and via above 606 that connects metals 612 with 610 or with 614 where desired. Then the next few layers are often constructed at twice the minimum litho-graphic and etch capability and called '2×' metal layers, and have thicker metal for higher current carrying capability. These are illustrated with metal line 614 paired with via 607 and metal line 616 paired with via 608 in FIG. 6. Accord-ingly, the metal via pairs of 618 with 609, and 620 with bond pad opening 622, represent the '4×' metallization layers where the planar and thickness dimensions are again larger and thicker than the 2× and 1× layers. The precise number of 1× or 2× or 4× layers may vary depending on intercon-nection needs and other requirements; however, the general flow is that of increasingly larger metal line, metal space, and via dimensions as the metal layers are farther from the silicon transistors and closer to the bond pads.

Figure 7:
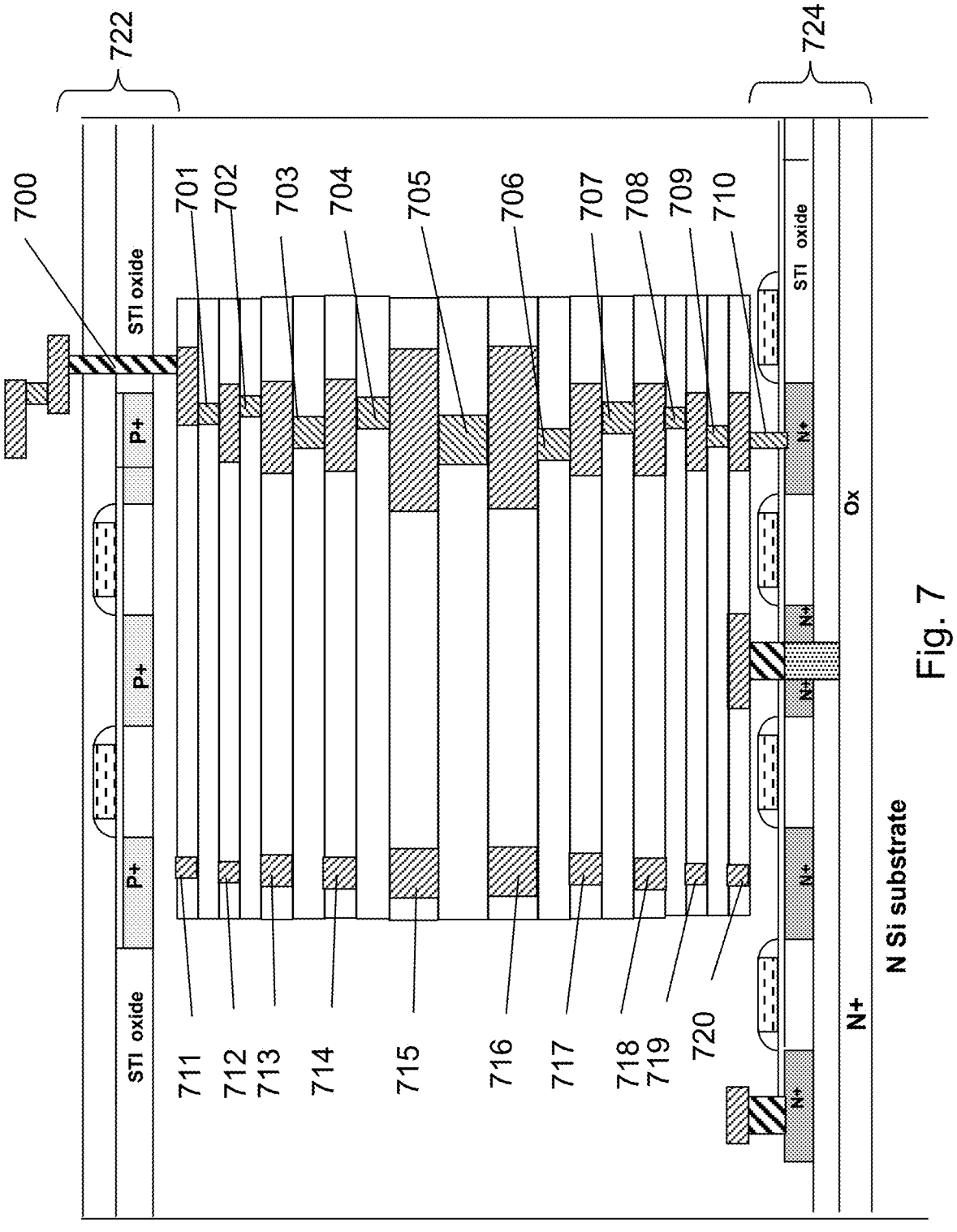
FIG. 7 is a drawing illustration of a metal interconnect stack.

The metallization layer scheme may be improved for 3D circuits as illustrated in FIG. 7. The first mono- or poly-crystalline silicon device layer 724 is illustrated as the NMOS silicon transistor layer from the above 3D library cells, but may also be a conventional logic transistor silicon substrate or layer. The '1×' metal layers 720 and 719 are connected with contact 710 to the silicon transistors and vias 708 and 709 to each other or metal line 718. The 2× layer pairs metal 718 with via 707 and metal 717 with via 706. The 4× metal layer 716 is paired with via 705 and metal 715, also at 4×. However, now via 704 is constructed in 2× design rules to enable metal line 714 to be at 2×. Metal line 713 and via 703 are also at 2× design rules and thicknesses. Vias 702 and 701 are paired with metal lines 712 and 711 at the 1× minimum design rule dimensions and thickness. The thru silicon via 700 of the illustrated PMOS layer transferred silicon 722 may then be constructed at the 1× minimum design rules and provide for maximum density of the top layer. The precise numbers of 1× or 2× or 4× layers may vary depending on circuit area and current carrying metallization design rules and tradeoffs. The layer transferred top transis-tor layer 722 may be any of the low temperature devices illustrated herein.

The various layers of a 3D device may include many types of circuitry, which may be formed by regions of transistors and other semiconductor device elements within that layer or in combination with other layers of the 3D device, and connections between the transistors within the same region, region to region and vertically (layer to layer) may be provided by layers of interconnect metallization and vertical connections such as TLVs and TSVs. In addition, power routing within the 3D device may utilize thicker and more conductive interconnect metallization on some layer rather than another layer, especially if the layer is closest to the source of external power and/or has a greater current load/supply requirement. Many individual device and intercon-nect embodiments for 3D devices have been described herein and in the incorporated patent references. As illus-trated in FIG. 8, some additional embodiments and combi-nations (further embodiments) of devices, circuits, paths, and connections are described and may utilize similar mate-rials, constructions and methods as the incorporated refer-ences or discussed herein. With reference to embodiments described herein, for example with respect to at least FIG. 46 of U.S. Pat. No. 8,803,206, and in others of the incorporated patent references, a substrate layer, which may have a thicker body than other semiconductor layers above or within the 3D device, such as acceptor 810 may be formed and may include heat sink 897, acceptor substrate 895, acceptor wafer transistors and circuits 893, first (acceptor)

layer metal interconnect 881 which may include first layer contacts 891, first layer vias 883, at least one shield layer/region 888 (two layers and many regions, such as lower level shield layer region 885, shown), interconnect insulator regions 896 and ESD diode structures 807. A second semi-conductor layer may be transferred and constructed on top of the first layer with isolation layer 880 in-between and vertical layer to layer interconnections may be provided by TLV/TSV 835, only one is shown. A layer of transistors and circuits 822 may include second layer input device struc-tures 876, FD ESD structures 817, Phase Lock Loop circuits PLL 818, SERDES circuitry 819, and output device struc-ture 851. Second interconnections layer 830 may include at least one layer/regions of metallization and associated con-tacts and via, for example, second layer metallization M1 segments 828, 821, 823, 825, second layer contacts 826, second layer vias 852, and conductive pads 890. The 3D device may be connected to external devices utilizing many structures known to those skilled in the art, for example, bond wires 899. Input device structures 876 and output device structure 851 may be connected to external devices through, for example, second layer contacts 826, second layer metallization M1 segments 828, second layer vias 852, conductive pads 890, and bond wires 899. A portion of the transistors within input device structures 876 and output device structure 851 may be larger in either or both width and length than most transistors within acceptor wafer transistors and circuits 893. Input device structures 876 (and output device structure 851) may be subjected to voltage and/or current transients from external devices or generated externally and traveling to the 3D device along bond wires 899. Input device structures 876 (and output device structure 851) may be protected by dissipating the transient energy in diode structures, such as ESD diode structures 807 on the relatively thicker (than for example, the second semicon-ductor layer) acceptor substrate 895, which may be con-nected by a multiplicity of connection stacks such as first (acceptor) layer metal interconnect 881 which may include first layer contacts 891, first layer vias 883, at least one shield layer/region 888, TLV/TSV 835, and second layer metallization M1 segments 828. Input device structures 876 (and output device structure 851) may be protected by dissipating the transient energy in a transient filtering cir-cuitry such as for example, FD ESD structures 817, which may reside on a relatively thin semiconductor layer in the 3D device and may effectively utilize fully depleted transistors in the filter circuitry. FD ESD structures 817 may be coupled to input device structures 876 (and output device structure 851) by second layer interconnections (not shown). Input device structures 876 may be connected to PLL 818, for example, thru second layer metallization M1 segment 821 and second layer contacts 826. Input device structures 876 may be connected to SERDES circuitry 819, for example, thru second layer metallization (not shown). Output device structures 851 may be connected to SERDES circuitry 819, for example, thru second layer metallization M1 segment 823 and second layer contacts 826. Output device structures 851 may drive signals thru the connection to conductive pads 890 and then out to external devices thru bond wires 899. Transistors within a lower layer, for example within acceptor wafer transistors and circuits 893, may be con-nected (not shown) to the output device structure 851 and drive a signal to the output device structure 851, and a portion of the transistors of output device structure 851 may have a larger width and/or length than the transistors within acceptor wafer transistors and circuits 893. Power from external sources may be routed thru bond wires 899 to conductive pads 890 to the 3D device, wherein at least a portion of the second interconnections layer 830 may be constructed with thicker and/or wider metallization wiring (for example 4× wiring as described in incorporated patent references) so to provide the higher current carrying capability required for the second layer power distribution grid/network than that of the lower layer, in this example, first layer metallization wiring (for example 1× or 2× wiring as described in incorporated patent references). The width and/or length of the transistors of the second layer of transistors and circuits 822, for example a portion of those in second layer input device structures 876 and/or FD ESD structures 817 and/or output device structures 851, may be substantially larger than the width and/or length of transistors in acceptor wafer transistors and circuits 893.

Figure 8:
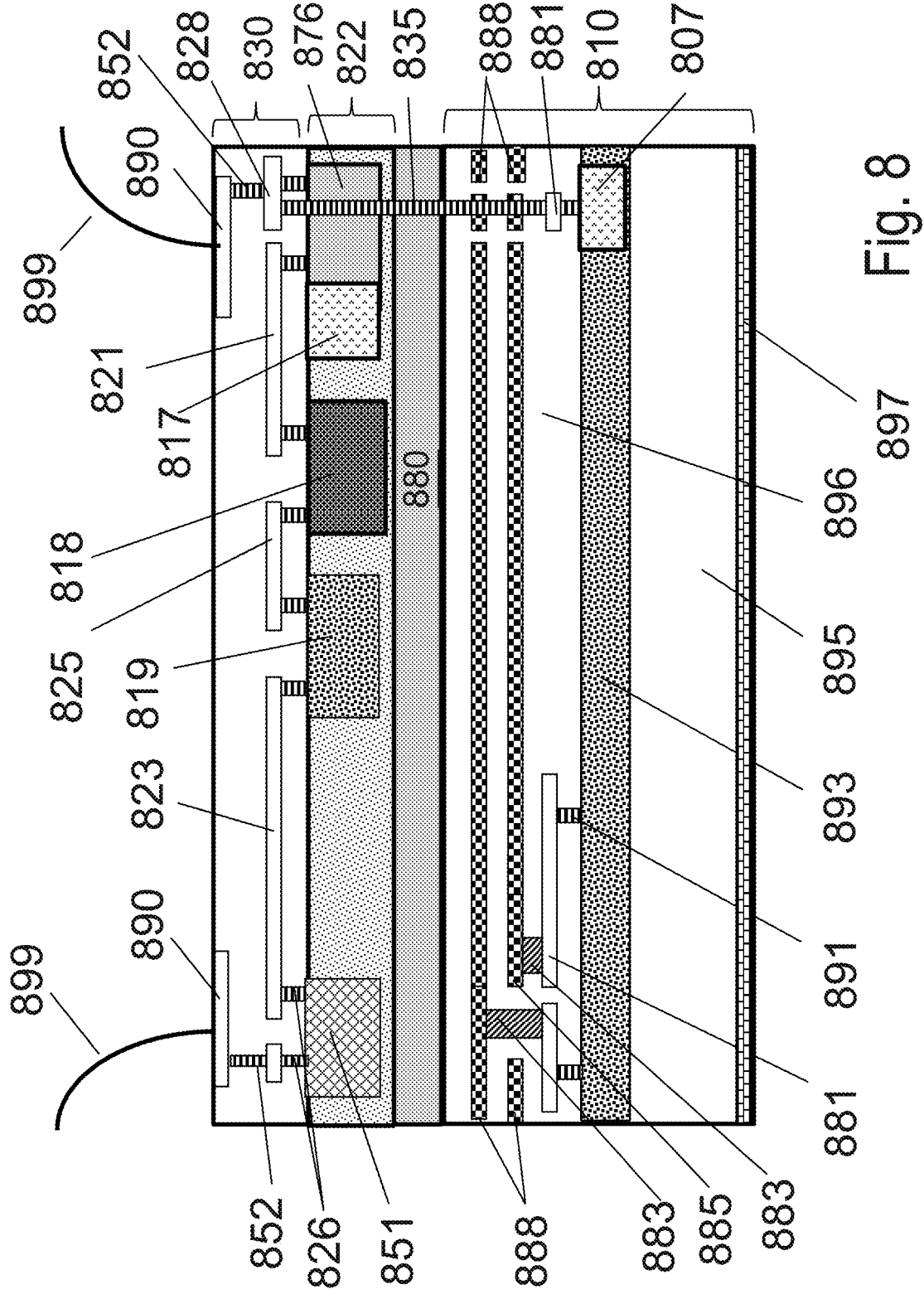
FIG. 8 is an exemplary illustration of some additional embodiments and combinations of devices, circuits, paths, and connections of a 3D device.

Persons of ordinary skill in the art will appreciate that the illustrations in FIG. 8 are exemplary and are not drawn to scale. Such skilled persons will further appreciate that many variations may be possible such as, for example, a thick enough semiconductor layer to enable ESD diode style protection circuitry to be constructed need not only be on the base or substrate layer, but may reside elsewhere in the 3D device stack. Moreover, the output circuitry including output device structures 851 may wholly or partially reside on a semiconductor transistor layer that is not on top, and vertical connections including TLVs/TSV may be utilized to connect the output device structures 851 to conductive pads 890. Furthermore, the input circuitry including input device structures 876 may wholly or partially reside on a semiconductor transistor layer that is not on top, and vertical connections including TLVs/TSV may be utilized to connect the input device structures 876 to conductive pads 890. Similarly, SERDES circuitry and 819 PLL 818 may wholly or partially reside on a semiconductor transistor layer that is not on top, the choices being one of design choice and device characteristics driven. Furthermore, connection to external devices (signal and/or power supply) may be made on the backside of acceptor substrate 895. Moreover, connection to external devices form the 3D device may utilize many types of structures other than bond wires 899 shown in the illustration, for example, flipchip and bumps, wireless circuitry, TSV, etc. Thus the invention is to be limited only by the appended claims.

Figure 9:
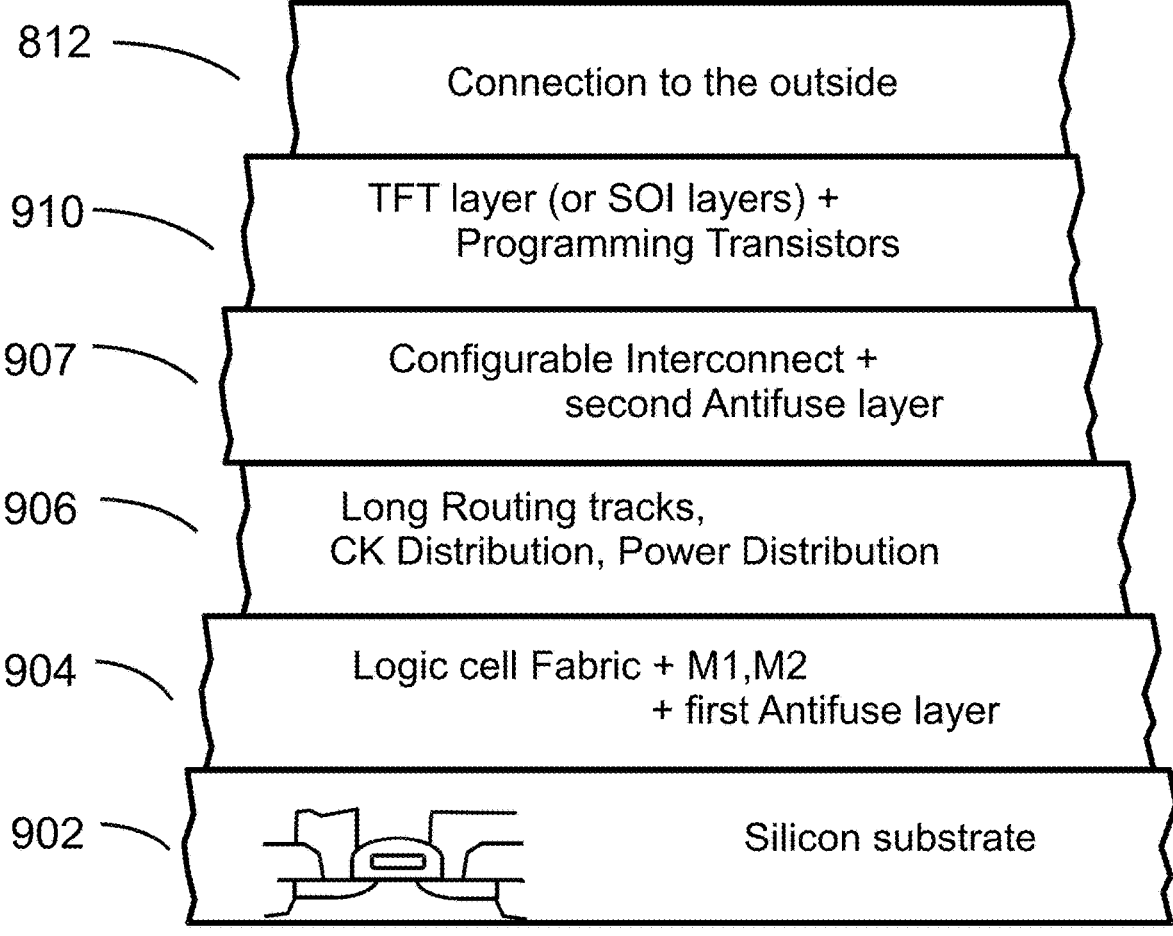
FIG. 9 is a drawing illustration of a programmable device layers structure.

FIG. 9 is a drawing illustration of a programmable device layers structure according to an alternative of the current invention. In this alternative there are two layers comprising antifuses. The first is designated to configure the logic terrain and, in some cases, to also configure the logic clock distribution. The first antifuse layer could also be used to manage some of the power distribution to save power by not providing power to unused circuits. This layer could also be used to connect some of the long routing tracks and/or connections to the inputs and outputs of the logic cells.

The device fabrication of the example shown in FIG. 9 starts with the semiconductor substrate 902 comprising the transistors used for the logic cells and also the first antifuse layer programming transistors. Then comes layers 904 comprising Metal 1, dielectric, Metal 2, and sometimes Metal 3. These layers are used to construct the logic cells and often I/O and other analog cells. In this alternative of the current invention a plurality of first antifuses are incorporated in the isolation layer between metal 1 and metal 2 or in the isolation layer between metal 2 and metal 3 and their programming transistors could be embedded in the silicon substrate 902 being underneath the first antifuses. These first antifuses could be used to program logic cells such as 520, 600 and 700 and to connect individual cells to construct larger logic functions. These first antifuses could also be used to configure the logic clock distribution. The first antifuse layer could also be used to manage some of the power distribution to save power by not providing power to unused circuits. This layer could also be used to connect some of the long routing tracks and/or one or more connections to the inputs and outputs of the cells.

The following few layers 906 could comprise long interconnection tracks for power distribution and clock networks, or a portion of these, in addition to what was fabricated in the first few layers 904.

The following few layers 907 could comprise the antifuse configurable interconnection fabric. It might be called the short interconnection fabric, too. If metal 6 and metal 7 are used for the strips of this configurable interconnection fabric then the second antifuse may be embedded in the dielectric layer between metal 6 and metal 7.

The programming transistors and the other parts of the programming circuit could be fabricated afterward and be on top of the configurable interconnection fabric 910. The programming element could be a thin film transistor or other alternatives for over oxide transistors as was mentioned previously. In such case the antifuse programming transistors are placed over the antifuse layer, which may thereby enable the configurable interconnect 908 or 904. It should be noted that in some cases it might be useful to construct part of the control logic for the second antifuse programming circuits, in the base layers 902 and 904.

The final step is the connection to the outside 912. These could be pads for wire bonding, soldering balls for flip chip, optical, or other connection structures such as those for TSV.

In another alternative of the current invention the antifuse programmable interconnect structure could be designed for multiple use. The same structure could be used as a part of the interconnection fabric, or as a part of the PLA logic cell, or as part of a Read Only Memory (ROM) function. In an FPGA product it might be desirable to have an element that could be used for multiple purposes. Having resources that could be used for multiple functions could increase the utility of the FPGA device.

Figure 9A:
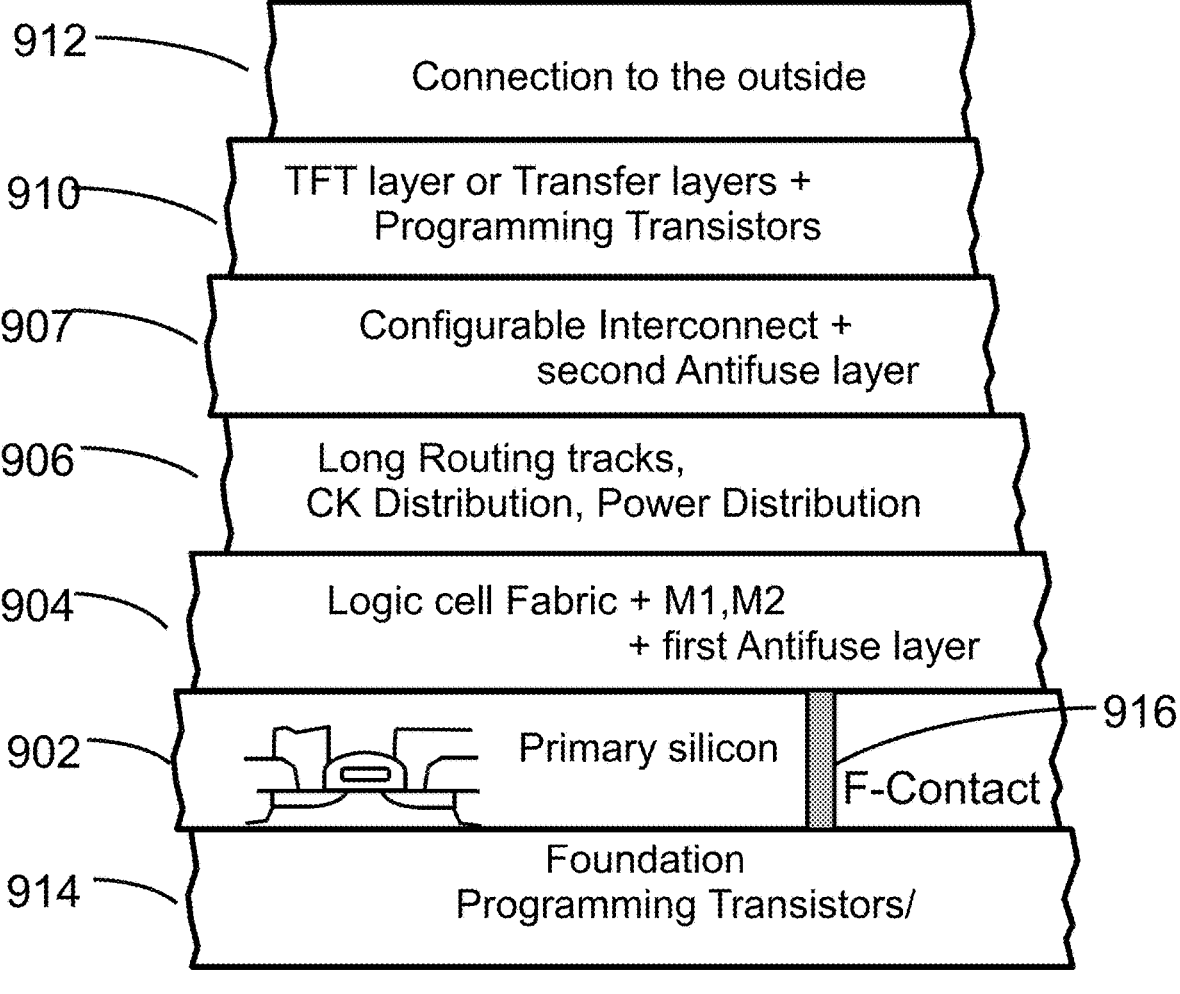
FIG. 9A is a drawing illustration of a programmable device layers structure.

FIG. 9A is a drawing illustration of a programmable device layers structure according to another alternative of the current invention. In this alternative there is additional circuit 914 connected by contact connection 916 to the first antifuse layer 904. This underlying device is providing the programming transistor for the first antifuse layer 904. In this way, the programmable device substrate diffusion layer 916 does not suffer the cost penalty of the programming transistors for the first antifuse layer 904. Accordingly the programming connection of the first antifuse layer 904 will be directed downward to connect to the underlying programming device 914 while the programming connection to the second antifuse layer 907 will be directed upward to connect to the programming circuits 910. This could provide less congestion of the circuit internal interconnection routes.

The reference 908 in subsequent figures can be any one of a vast number of combinations of possible preprocessed wafers or layers containing many combinations of transfer layers that fall within the scope of the invention. The term "preprocessed wafer or layer" may be generic and reference number 908 when used in a drawing figure to illustrate an embodiment of the current invention may represent many different preprocessed wafer or layer types including but not limited to underlying prefabricated layers, a lower layer interconnect wiring, a base layer, a substrate layer, a processed house wafer, an acceptor wafer, a logic house wafer, an acceptor wafer house, an acceptor substrate, target wafer, preprocessed circuitry, a preprocessed circuitry acceptor wafer, a base wafer layer, a lower layer, an underlying main wafer, a foundation layer, an attic layer, or a house wafer.

Figure 9B:
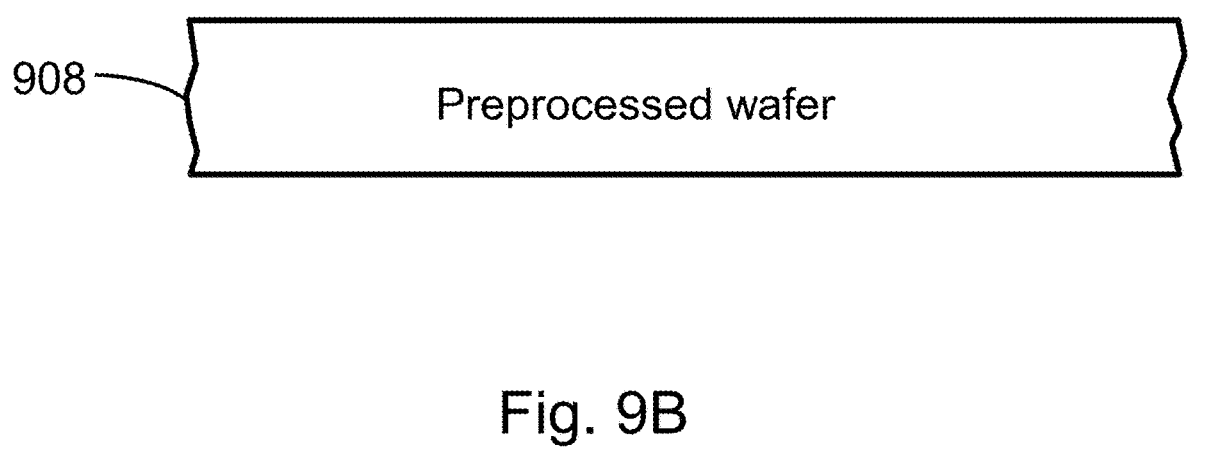

FIG. 9B is a drawing illustration of a generalized preprocessed wafer or layer 908. The wafer or layer 908 may have preprocessed circuitry, such as, for example, logic circuitry, microprocessors, circuitry comprising transistors of various types, and other types of digital or analog circuitry including, but not limited to, the various embodiments described herein. Preprocessed wafer or layer 908 may have preprocessed metal interconnects and may be comprised of copper or aluminum. The preprocessed metal interconnects may be designed and prepared for layer transfer and electrical coupling from preprocessed wafer or layer 908 to the layer or layers to be transferred.

Figure 9C:
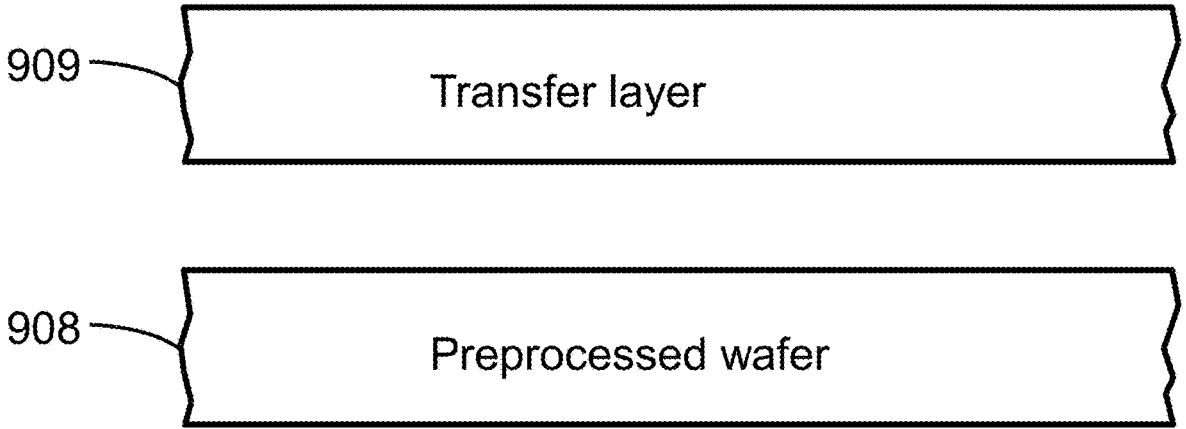

FIG. 9C is a drawing illustration of a generalized transfer layer 909 prior to being attached to preprocessed wafer or layer 908. Transfer layer 909 may be attached to a carrier wafer or substrate during layer transfer. Preprocessed wafer or layer 908 may be called a target wafer, acceptor substrate, or acceptor wafer. The acceptor wafer may have acceptor wafer metal connect pads or strips designed and prepared for electrical coupling to transfer layer 909. Transfer layer 909 may be attached to a carrier wafer or substrate during layer transfer. Transfer layer 909 may have metal interconnects designed and prepared for layer transfer and electrical coupling to preprocessed wafer or layer 908. Electrical coupling from transferred layer 909 to preprocessed wafer or layer 908 may utilize thru layer vias (TLVs). Transfer layer 909 may be comprised of single crystal silicon, or mono-crystalline silicon, or doped mono-crystalline layer or layers, or other semiconductor, metal, and insulator materials, layers; or multiple regions of single crystal silicon, or mono-crystalline silicon, or dope mono-crystalline silicon, or other semiconductor, metal, or insulator materials.

Figure 9D:
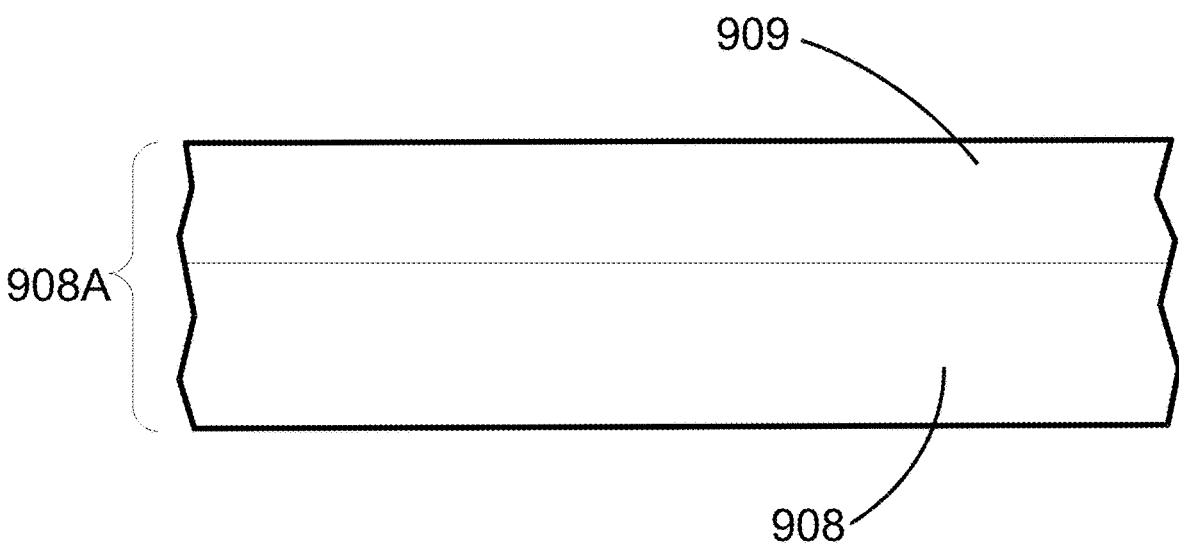

FIG. 9D is a drawing illustration of a preprocessed wafer or layer 908A created by the layer transfer of transfer layer 909 on top of preprocessed wafer or layer 908. The top of preprocessed wafer or layer 908A may be further processed with metal interconnects designed and prepared for layer transfer and electrical coupling from preprocessed wafer or layer 908A to the next layer or layers to be transferred.

Figure 9E:
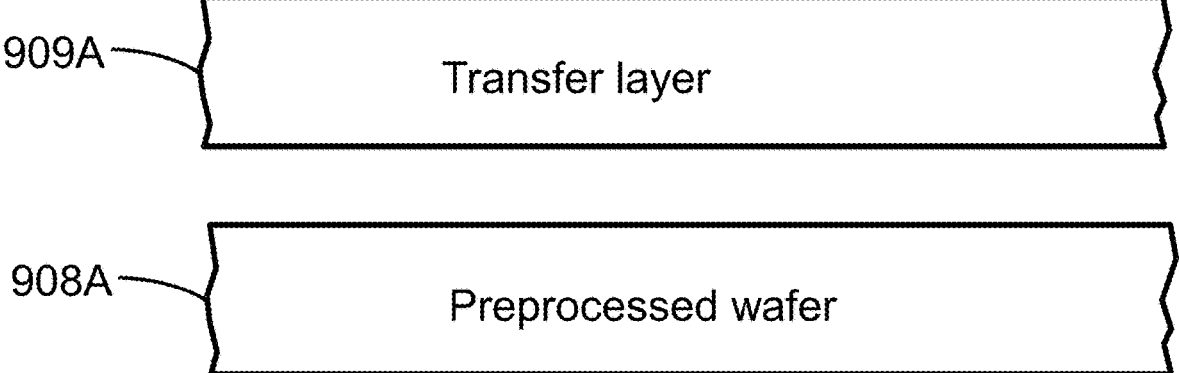

FIG. 9E is a drawing illustration of a generalized transfer layer 909A prior to being attached to preprocessed wafer or layer 908A. Transfer layer 909A may be attached to a carrier wafer or substrate during layer transfer. Transfer layer 909A may have metal interconnects designed and prepared for layer transfer and electrical coupling to preprocessed wafer or layer 908A.

Figure 9F:
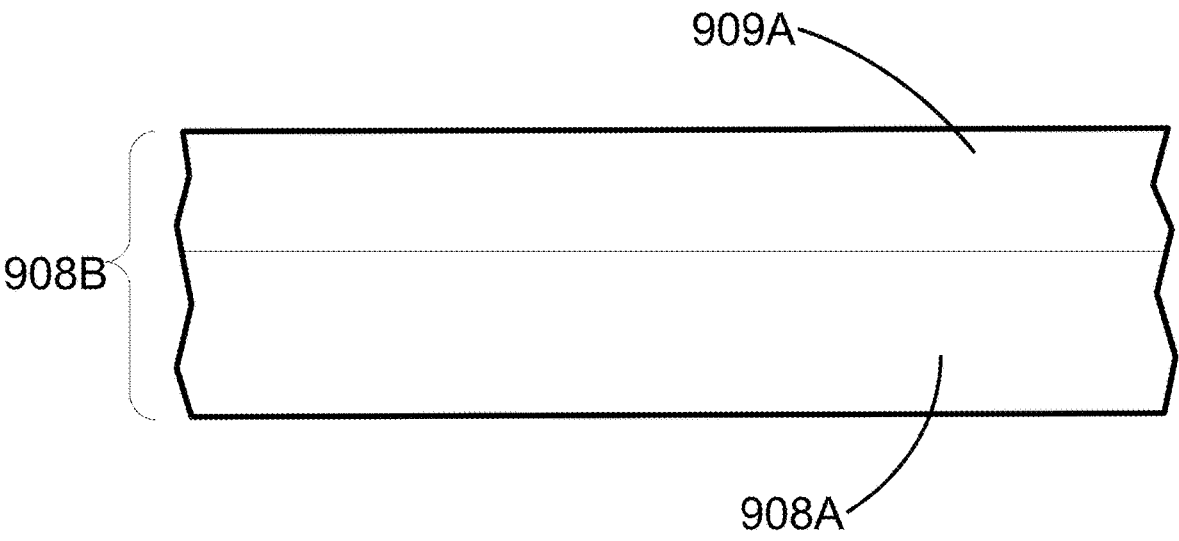

FIG. 9F is a drawing illustration of a preprocessed wafer or layer 908B created by the layer transfer of transfer layer 909A on top of preprocessed wafer or layer 908A. The top of preprocessed wafer or layer 908B may be further processed with metal interconnects designed and prepared for layer transfer and electrical coupling from preprocessed wafer or layer 908B to the next layer or layers to be transferred.

Figure 9G:
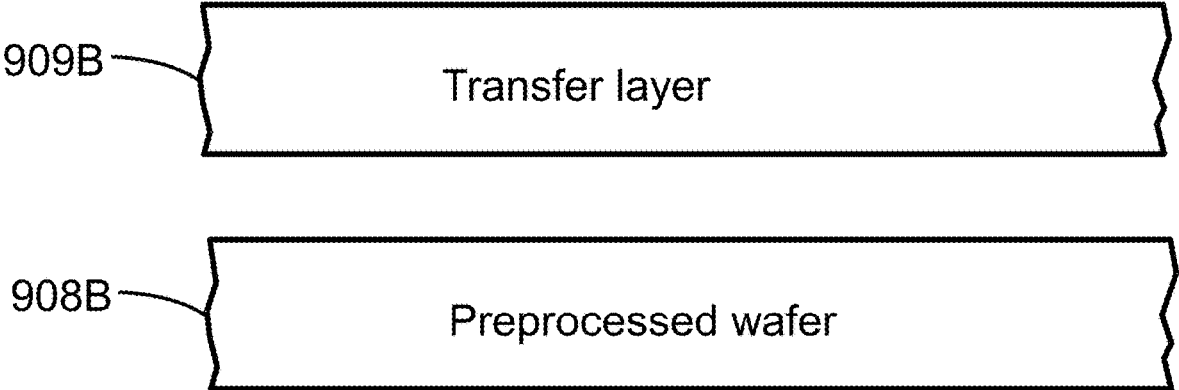

FIG. 9G is a drawing illustration of a generalized transfer layer 909B prior to being attached to preprocessed wafer or layer 908B. Transfer layer 909B may be attached to a carrier wafer or substrate during layer transfer. Transfer layer 909B may have metal interconnects designed and prepared for layer transfer and electrical coupling to preprocessed wafer or layer 908B.

Figure 9H:

FIG. 9H is a drawing illustration of preprocessed wafer layer 908C created by the layer transfer of transfer layer 909B on top of preprocessed wafer or layer 908B. The top of preprocessed wafer or layer 908C may be further processed with metal interconnect designed and prepared for layer transfer and electrical coupling from preprocessed wafer or layer 908C to the next layer or layers to be transferred.

Figure 9I:
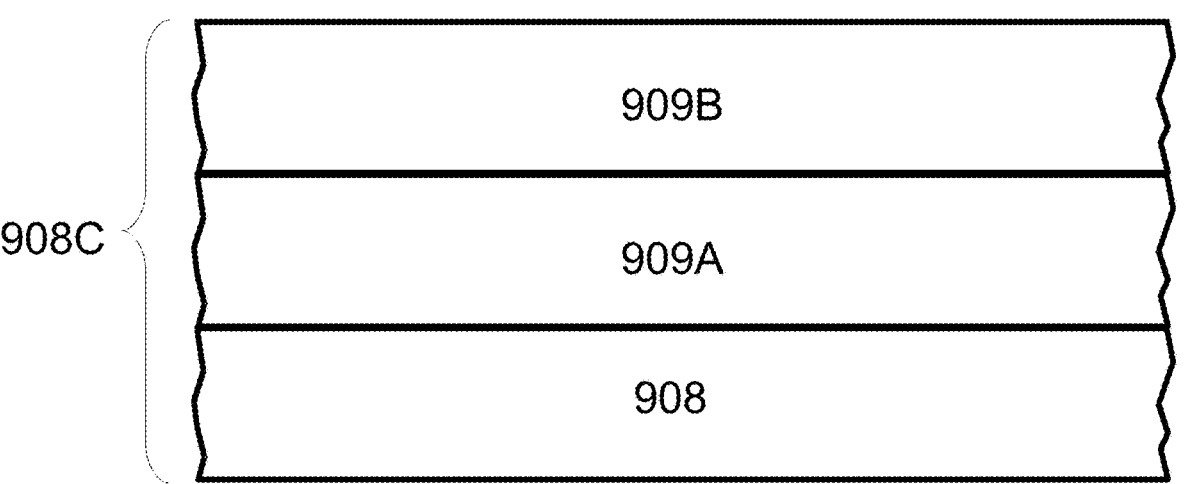

FIG. 9I is a drawing illustration of preprocessed wafer or layer 908C, a 3D IC stack, which may comprise transferred layers 909A and 909B on top of the original preprocessed wafer or layer 908. Transferred layers 909A and 909B and the original preprocessed wafer or layer 908 may comprise transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers involved in the transfer layer. The transistors may be junction-less transistors or recessed channel transistors. Transferred layers 909A and 909B and the original preprocessed wafer or layer 908 may further comprise semiconductor devices such as resistors and capacitors and inductors, one or more programmable interconnects, memory structures and devices, sensors, radio frequency devices, or optical interconnect with associated transceivers. The terms carrier wafer or carrier substrate may also be called holder wafer or holder substrate.

This layer transfer process can be repeated many times, thereby creating preprocessed wafers comprising many different transferred layers which, when combined, can then become preprocessed wafers or layers for future transfers. This layer transfer process may be sufficiently flexible that preprocessed wafers and transfer layers, if properly prepared, can be flipped over and processed on either side with further transfers in either direction as a matter of design choice.

Persons of ordinary skill in the art will appreciate that the illustrations in FIGS. 9 through 9I are exemplary only and are not drawn to scale. Such skilled persons will further appreciate that many variations are possible such as, for example, the preprocessed wafer or layer 908 may act as a base or substrate layer in a wafer transfer flow, or as a preprocessed or partially preprocessed circuitry acceptor wafer in a wafer transfer process flow. Many other modifications within the scope of the invention will suggest themselves to such skilled persons after reading this specification. Thus the invention is to be limited only by the appended claims.

In general logic devices comprise varying quantities of logic elements, varying amounts of memories, and varying amounts of I/O. The continuous array of the prior art allows defining various die sizes out of the same wafers and accordingly varying amounts of logic, but it is far more difficult to vary the three-way ratio between logic, I/O, and memory. In addition, there exists different types of memories such as SRAM, DRAM, Flash, and others, and there exist different types of I/O such as SerDes. Some applications might need still other functions like processor, DSP, analog functions, and others.

Embodiments of the current invention may enable a different approach. Instead of trying to put substantially all of these different functions onto one programmable die, which will need a large number of very expensive mask sets, it uses Through-Silicon Via to construct configurable systems. The technology of "Package of integrated circuits and vertical integration" has been described in U.S. Pat. No. 6,322,903 issued to Oleg Siniaguine and Sergey Savastiouk on Nov. 27, 2001.

Accordingly embodiments of the current invention may suggest the use of a continuous array of tiles focusing each one on a single, or very few types of, function. Then, it constructs the end-system by integrating the desired amount from each type of tiles, in a 3D IC system.

FIG. 10A is a drawing illustration of one reticle site on a wafer comprising tiles of programmable logic 1000A denoted FPGA. Such wafer is a continuous array of programmable logic. 1002 are potential dicing lines to support various die sizes and the amount of logic to be constructed from one mask set. This die could be used as a base 1102A, 1102B, 1102C or 1102D of the 3D system as in FIG. 11. In one alternative of this invention these dies may carry mostly logic, and the desired memory and I/O may be provided on other dies, which may be connected by means of Through-Silicon Via. It should be noted that in some cases it will be desired not to have metal lines, even if unused, in the dicing streets 108. In such case, at least for the logic dies, one may use dedicated masks to allow connection over the unused potential dicing lines to connect the individual tiles according to the desire die size. The actual dicing lines are also called streets.

It should be noted that in general the lithography over the wafer is done by repeatedly projecting what is named reticle over the wafer in a "step-and-repeat" manner. In some cases it might be preferable to consider differently the separation between repeating tile 102 within a reticle image vs. tiles that relate to two projections. For simplicity this description will use the term wafer but in some cases it will apply only to tiles with one reticle.

The repeating tile 102 could be of various sizes. For FPGA applications it may be reasonable to assume tile 1001 to have an edge size between 0.5 mm to 1 mm which allows good balance between the end-device size and acceptable relative area loss due to the unused potential dice lines 1002.

FIG. 10B is a drawing illustration of an alternative reticle site on a wafer comprising tiles of Structured ASIC 1000B. Such wafer may be, for example, a continuous array of configurable logic. 1002 are potential dicing lines to support various die sizes and the amount of logic to be constructed. This die could be used as a base 1102A, 1102B, 1102C or 1102D of the 3D system as in FIG. 11.

FIG. 10C is a drawing illustration of another reticle site on a wafer comprising tiles of RAM 1000C. Such wafer may be a continuous array of memories. The die diced out of such wafer may be a memory die component of the 3D integrated system. It might include an antifuse layer or other form of configuration technique to function as a configurable memory die. Yet it might be constructed as a multiplicity of memories connected by a multiplicity of Through-Silicon Vias to the configurable die, which may also be used to configure the raw memories of the memory die to the desired function in the configurable system.

FIG. 10D is a drawing illustration of another reticle site on a wafer comprising tiles of DRAM 1000D. Such wafer may be a continuous array of DRAM memories.

FIG. 10E is a drawing illustration of another reticle site on a wafer comprising tiles of microprocessor or microcontroller cores 1000E. Such wafer may be a continuous array of Processors.

FIG. 10F is a drawing illustration of another reticle site on a wafer comprising tiles of I/Os 1000F. This could include groups of SerDes. Such a wafer may be a continuous tile of I/Os. The die diced out of such wafer may be an I/O die component of a 3D integrated system. It could include an antifuse layer or other form of configuration technique such as SRAM to configure these I/Os of the configurable I/O die to their function in the configurable system. Yet it might be constructed as a multiplicity of I/O connected by a multiplicity of Through-Silicon Vias to the configurable die, which may also be used to configure the raw I/Os of the I/O die to the desired function in the configurable system.

I/O circuits are a good example of where it could be advantageous to utilize an older generation process. Usually, the process drivers are SRAM and logic circuits. It often takes longer to develop the analog function associated with I/O circuits, SerDes circuits, PLLs, and other linear functions. Additionally, while there may be an advantage to using smaller transistors for the logic functionality, I/Os may need stronger drive and relatively larger transistors. Accordingly, using an older process may be more cost effective, as the older process wafer might cost less while still performing effectively.

An additional function that it might be advantageous to pull out of the programmable logic die and onto one of the other dies in the 3D system, connected by Through-Silicon-Vias, may be the Clock circuits and their associated PLL, DLL, and control. Clock circuits and distribution. These circuits may often be area consuming and may also be challenging in view of noise generation. They also could in many cases be more effectively implemented using an older process. The Clock tree and distribution circuits could be included in the I/O die. Additionally the clock signal could be transferred to the programmable die using the Through-Silicon-Vias (TSVs) or by optical means. A technique to transfer data between dies by optical means was presented for example in U.S. Pat. No. 6,052,498 assigned to Intel Corp.

Alternatively an optical clock distribution could be used. There are new techniques to build optical guides on silicon or other substrates. An optical clock distribution may be utilized to minimize the power used for clock signal distribution and would enable low skew and low noise for the rest of the digital system. Having the optical clock constructed on a different die and than connected to the digital die by means of Through-Silicon-Vias or by optical means make it very practical, when compared to the prior art of integrating optical clock distribution with logic on the same die.

Having wafers dedicated to each of these functions may support high volume generic product manufacturing. Then, similar to Lego® blocks, many different configurable systems could be constructed with various amounts of logic memory and I/O. In addition to the alternatives presented in FIGS. 10A through 10F there many other useful functions that could be built and that could be incorporated into the 3D Configurable System. Examples of such may be image sensors, analog, data acquisition functions, photovoltaic devices, non-volatile memory, and so forth.

An additional function that would fit well for 3D systems using TSVs, as described, is a power control function. In many cases it is desired to shut down power at times to a portion of the IC that is not currently operational. Using controlled power distribution by an external die connected by TSVs is advantageous as the power supply voltage to this external die could be higher because it is using an older process. Having a higher supply voltage allows easier and better control of power distribution to the controlled die.

Those components of configurable systems could be built by one vendor, or by multiple vendors, who agree on a standard physical interface to allow mix-and-match of various dies from various vendors.

The construction of the 3D Programmable System could be done for the general market use or custom-tailored for a specific customer.

Another advantage of some embodiments of this invention may be an ability to mix and match various processes. It might be advantageous to use memory from a leading edge process, while the I/O, and maybe an analog function die, could be used from an older process of mature technology (e.g., as discussed above).

Figures 11A, 11B, 11C, 11D, 11E:
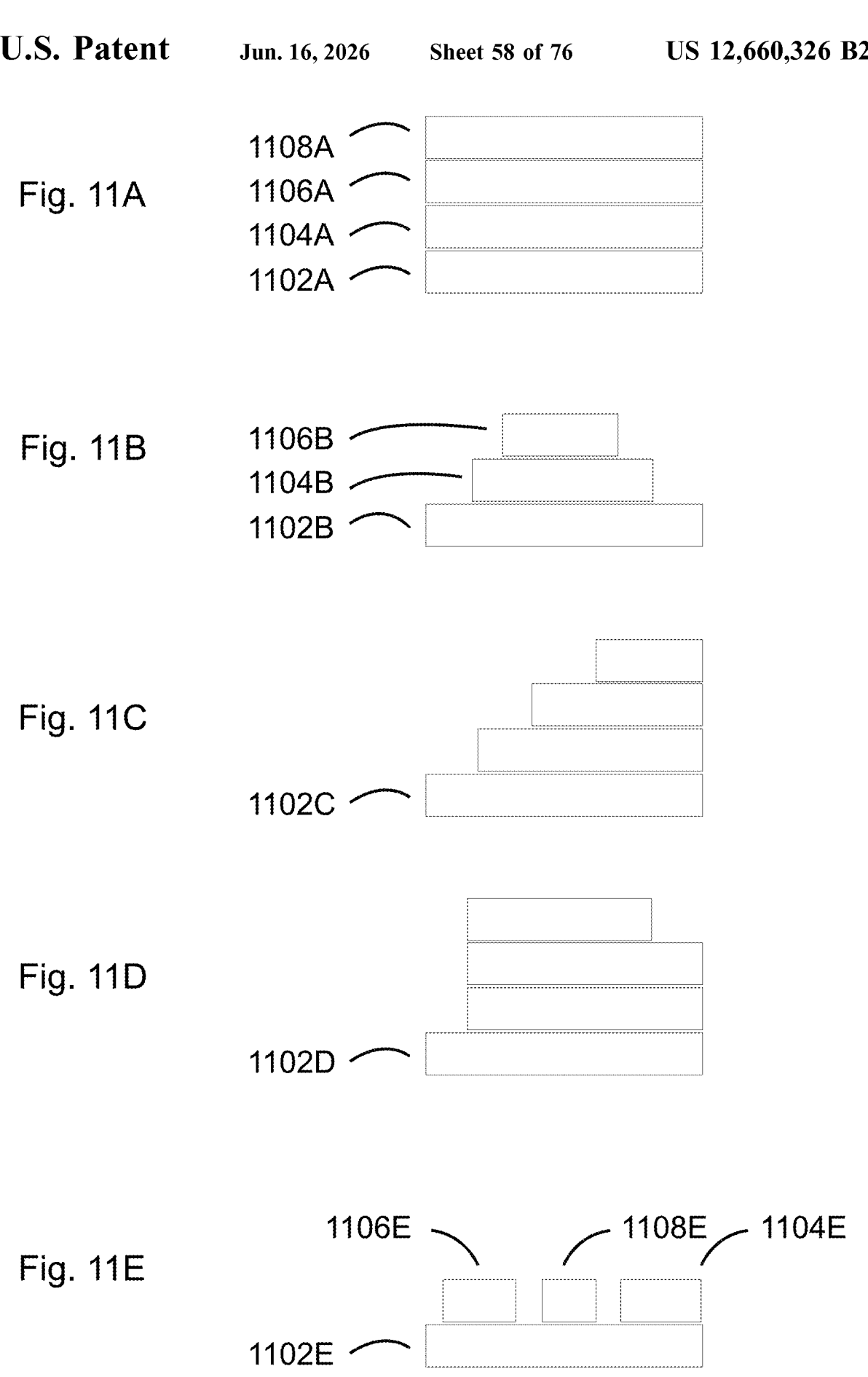
FIGS. 11A through 11E are a drawing illustration of Configurable system.

FIGS. 11A through 11E illustrate integrated circuit systems. An integrated circuit system that comprises configurable die could be called a Configurable System. FIGS. 11A through 11E are drawings illustrating integrated circuit systems or Configurable Systems with various options of die sizes within the 3D system and alignments of the various dies. FIG. 11E presents a 3D structure with some lateral options. In such case a few dies 1104E, 1106E, 1108E are placed on the same underlying die 1102E allowing relatively smaller die to be placed on the same mother die. For example die 1104E could be a SerDes die while die 1106E could be an analog data acquisition die. It could be advantageous to fabricate these die on different wafers using different process and than integrate them in one system. When the dies are relatively small then it might be useful to place them side by side (such as FIG. 11E) instead of one on top of the other (FIGS. 11A-D).

The Through Silicon Via technology is constantly evolving. In the early generations such via would be 10 microns in diameter. Advanced work is now demonstrating Through Silicon Via with less than a 1-micron diameter. Yet, the density of connections horizontally within the die may typically still be far denser than the vertical connection using Through Silicon Via.

In another alternative of the present invention the logic portion could be broken up into multiple dies, which may be of the same size, to be integrated to a 3D configurable system. Similarly it could be advantageous to divide the memory into multiple dies, and so forth, with other function.

Recent work on 3D integration shows effective ways to bond wafers together and then dice those bonded wafers. This kind of assembly may lead to die structures like FIG. 11A or FIG. 11D. Alternatively for some 3D assembly techniques it may be better to have dies of different sizes. Furthermore, breaking the logic function into multiple vertically integrated dies may be used to reduce the average length of some of the heavily loaded wires such as clock signals and data buses, which may, in turn, improve performance.

An additional variation of the invention may be the adaptation of the continuous array (presented in relation to FIGS. 10 and 10 of the original parent application) to the general logic device and even more so for the 3D IC system. Lithography limitations may pose considerable concern to advanced device design. Accordingly regular structures may be highly desirable and layers may be constructed in a mostly regular fashion and in most cases with one orientation at a time. Additionally, highly vertically-connected 3D IC system could be most efficiently constructed by separating logic memories and I/O into dedicated layers.

Figure 12:
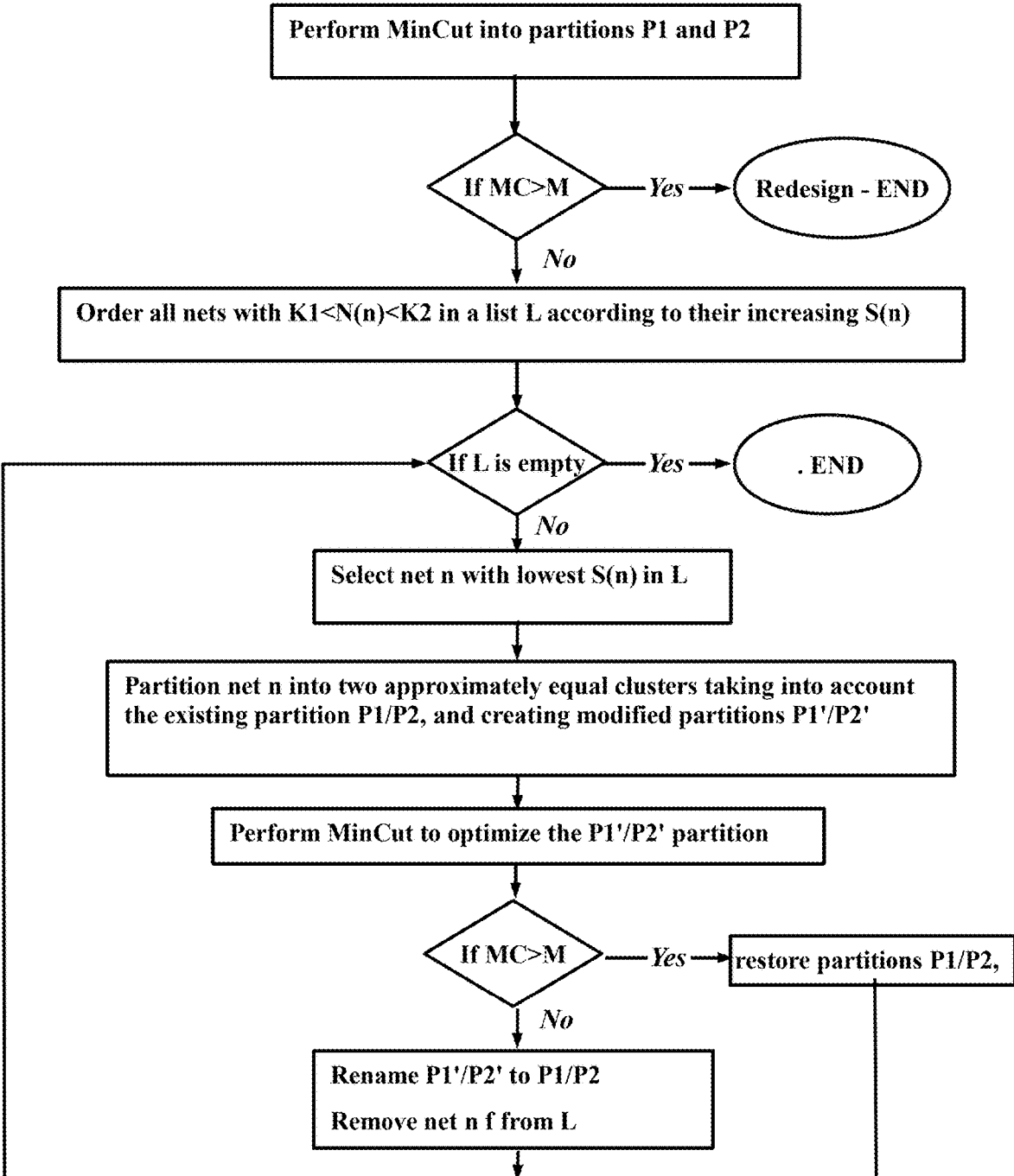
FIG. 12 a drawing illustration of a flow chart for 3D logic partitioning.

FIG. 12 is a flow-chart illustration for 3D logic partitioning. The partitioning of a logic design to two or more vertically connected dies presents a different challenge for a Place and Route—P&R—tool. A place and route tool is a type of CAD software capable of operating on libraries of logic cells (as well as libraries of other types of cells) as previously discussed. The common layout flow of prior art P & R tools may typically start with planning the placement followed by the routing. But the design of the logic of vertically connected dies may give priority to the much-reduced frequency of connections between dies and may create a need for a special design flow and CAD software specifically to support the design flow. In fact, a 3D system might merit planning some of the routing first as presented in the flows of FIG. 12.

The flow chart of FIG. 12 uses the following terms:

M—The number of TSVs available for logic;

N(n)—The number of nodes connected to net n;

S(n)—The median slack of net n;

MinCut—a known algorithm to partition logic design (net-list) to two pieces about equal in size with a minimum number of nets (MC) connecting the pieces;

MC—number of nets connecting the two partitions;

K1, K2—Two parameters selected by the designer.

One idea of the proposed flow of FIG. 12 is to construct a list of nets in the logic design that connect more than K1 nodes and less than K2 nodes. K1 and K2 are parameters that could be selected by the designer and could be modified in an iterative process. K1 should be high enough so to limit the number of nets put into the list. The flow's objective is to assign the TSVs to the nets that have tight timing constraints—critical nets. And also have many nodes whereby having the ability to spread the placement on multiple die help to reduce the overall physical length to meet the timing constraints. The number of nets in the list should be close but smaller than the number of TSVs. Accordingly K1 should be set high enough to achieve this objective. K2 is the upper boundary for nets with the number of nodes N(n) that would justify special treatment.

Critical nets may be identified usually by using static timing analysis of the design to identify the critical paths and the available "slack" time on these paths, and pass the constraints for these paths to the floor planning, layout, and routing tools so that the final design is not degraded beyond the requirement.

Once the list is constructed it is priority-ordered according to increasing slack, or the median slack, S(n), of the nets. Then, using a partitioning algorithm, such as, but not limited to, MinCut, the design may be split into two parts, with the highest priority nets split about equally between the two parts. The objective is to give the nets that have tight slack a better chance to be placed close enough to meet the timing challenge. Those nets that have higher than K1 nodes tend to get spread over a larger area, and by spreading into three dimensions we get a better chance to meet the timing challenge.

The Flow of FIG. 12 suggests an iterative process of allocating the TSVs to those nets that have many nodes and are with the tightest timing challenge, or smallest slack.

Clearly the same Flow could be adjusted to three-way partition or any other number according to the number of dies the logic will be spread on.

Constructing a 3D Configurable System comprising anti-fuse based logic also provides features that may implement yield enhancement through utilizing redundancies. This may be even more convenient in a 3D structure of embodiments of the current invention because the memories may not be sprinkled between the logic but may rather be concentrated in the memory die, which may be vertically connected to the logic die. Constructing redundancy in the memory, and the proper self-repair flow, may have a smaller effect on the logic and system performance.

The potential dicing streets of the continuous array of this invention represent some loss of silicon area. The narrower the street the lower the loss is, and therefore, it may be advantageous to use advanced dicing techniques that can create and work with narrow streets.

One such advanced dicing technique may be the use of lasers for dicing the 3D IC wafers. Laser dicing techniques, including the use of water jets to cool the substrate and remove debris, may be employed to minimize damage to the 3D IC structures and may also be utilized to cut sensitive layers in the 3D IC, and then a conventional saw finish may be used.

An additional advantage of the 3D Configurable System of various embodiments of this invention may be a reduction in testing cost. This is the result of building a unique system by using standard 'Lego®' blocks. Testing standard blocks could reduce the cost of testing by using standard probe cards and standard test programs.

An alternative technology for such underlying circuitry is to use the "SmartCut" process. The "SmartCut" process is a well understood technology used for fabrication of SOI wafers. The "SmartCut" process, together with wafer bonding technology, enables a "Layer Transfer" whereby a thin layer of a single or mono-crystalline silicon wafer is transferred from one wafer to another wafer. The "Layer Transfer" could be done at less than 400° C. and the resultant transferred layer could be even less than 100 nm thick. The process with some variations and under different names is commercially available by two companies, namely, Soitec (Crolles, France) and SiGen—Silicon Genesis Corporation (San Jose, CA). A room temperature wafer bonding process utilizing ion-beam preparation of the wafer surfaces in a vacuum has been recently demonstrated by Mitsubishi Heavy Industries Ltd., Tokyo, Japan. This process allows room temperature layer transfer.

Alternatively, other technology may also be used. For example, other technologies may be utilized for layer transfer as described in, for example, IBM's layer transfer method shown at IEDM 2005 by A. W. Topol, et al. The IBM's layer transfer method employs a SOI technology and utilizes glass handle wafers. The donor circuit may be high-temperature processed on an SOI wafer, temporarily bonded to a borosilicate glass handle wafer, backside thinned by chemical mechanical polishing of the silicon and then the Buried Oxide (BOX) is selectively etched off. The now thinned donor wafer is subsequently aligned and low-temperature oxide-to-oxide bonded to the acceptor wafer topside. A low temperature release of the glass handle wafer from the thinned donor wafer is performed, and then thru bond via connections are made. Additionally, epitaxial liftoff (ELO) technology as shown by P. Demeester, et. al, of IMEC in Semiconductor Science Technology 1893 may be utilized for layer transfer. ELO makes use of the selective removal of a very thin sacrificial layer between the substrate and the layer structure to be transferred. The to-be-transferred layer of GaAs or silicon may be adhesively 'rolled' up on a cylinder or removed from the substrate by utilizing a flexible carrier, such as, for example, black wax, to bow up the to-be-transferred layer structure when the selective etch, such as, for example, diluted Hydrofluoric (HF) Acid, etches the exposed release layer, such as, for example, silicon oxide in SOI or AlAs. After liftoff, the transferred layer is then aligned and bonded to the desired acceptor substrate or wafer. The manufacturability of the ELO process for multilayer layer transfer use was recently improved by J. Yoon, et al., of the University of Illinois at Urbana-Champaign as described in Nature May 20, 2010. Canon developed a layer transfer technology called ELTRAN—Epitaxial Layer TRANsfer from porous silicon. ELTRAN may be utilized. The Electrochemical Society Meeting abstract No. 438 from year 2000 and the JSAP International July 2001 paper show a seed wafer being anodized in an HF/ethanol solution to create pores in the top layer of silicon, the pores are treated with a low temperature oxidation and then high temperature hydrogen annealed to seal the pores. Epitaxial silicon may then be deposited on top of the porous silicon and then oxidized to form the SOI BOX. The seed wafer may be bonded to a handle wafer and the seed wafer may be split off by high pressure water directed at the porous silicon layer. The porous silicon may then be selectively etched off leaving a uniform silicon layer.

Figure 13:
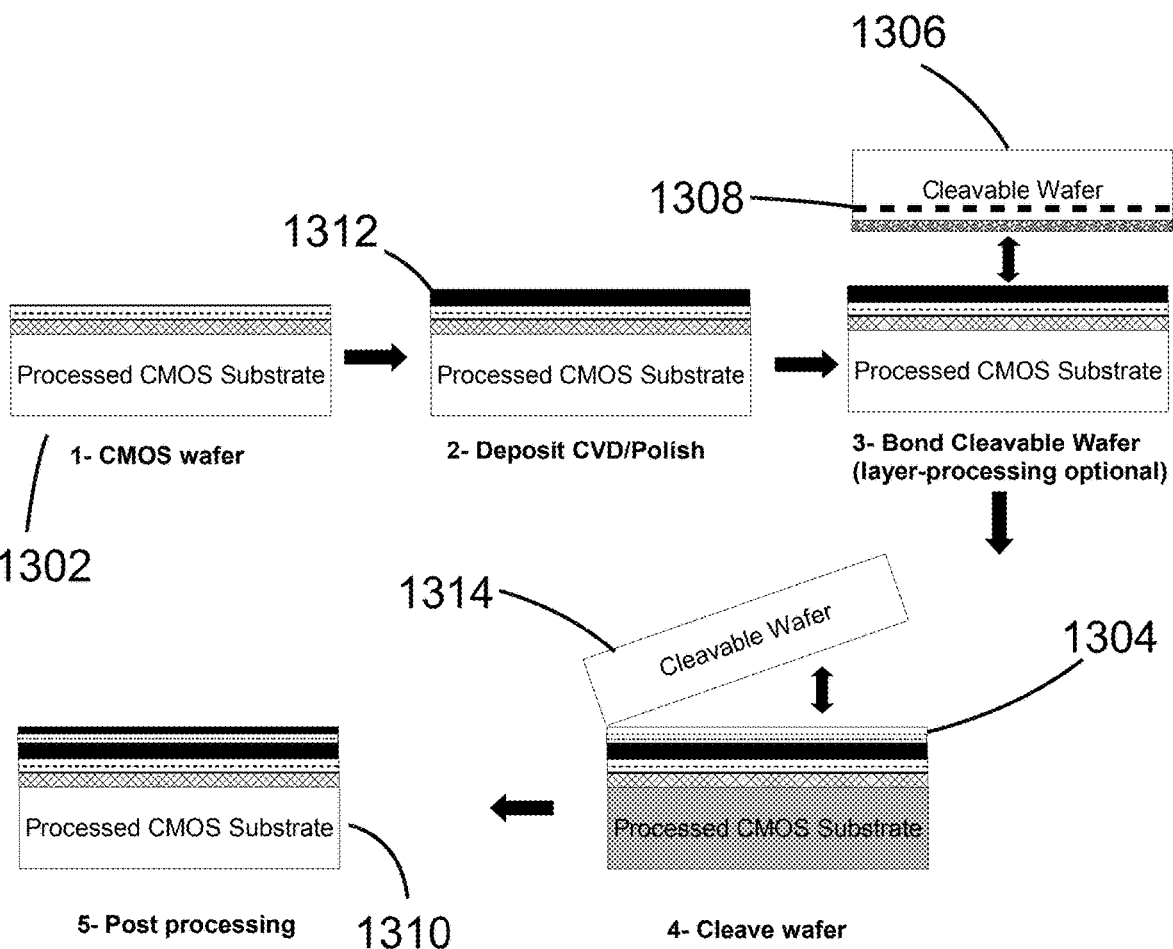
FIG. 13 is a drawing illustration of a layer transfer process flow.

FIG. 13 is a drawing illustration of a layer transfer process flow. In another alternative of the invention, "Layer-Transfer" is used for construction of the underlying circuitry 914. 1302 is a wafer that was processed to construct the underlying circuitry. The wafer 1302 could be of the most advanced process or more likely a few generations behind. It could comprise the programming circuits 914 and other useful structures and may be a preprocessed CMOS silicon wafer, or a partially processed CMOS, or other prepared silicon or semiconductor substrate. Wafer 1302 may also be called an acceptor substrate or a target wafer. An oxide layer 1312 is then deposited on top of the wafer 1302 and then is polished for better planarization and surface preparation. A donor wafer 1306 is then brought in to be bonded to 1302. The surfaces of both donor wafer 1306 and wafer 1302 may be pre-processed for low temperature bonding by various surface treatments, such as an RCA pre-clean that may comprise dilute ammonium hydroxide or hydrochloric acid, and may include plasma surface preparations to lower the bonding energy and enhance the wafer to wafer bond strength. The donor wafer 1306 is pre-prepared for "SmartCut" by an ion implant of an atomic species, such as H+ ions, at the desired depth to prepare the SmartCut line 1308. SmartCut line 1308 may also be called a layer transfer demarcation plane, shown as a dashed line. The SmartCut line 1308 or layer transfer demarcation plane may be formed before or after other processing on the donor wafer 1306. Donor wafer 1306 may be bonded to wafer 1302 by bringing the donor wafer 1306 surface in physical contact with the wafer 1302 surface, and then applying mechanical force and/or thermal annealing to strengthen the oxide to oxide bond. Alignment of the donor wafer 1306 with the wafer 1302 may be performed immediately prior to the wafer bonding. Acceptable bond strengths may be obtained with bonding thermal cycles that do not exceed approximately 400° C. After bonding the two wafers a SmartCut step is performed to cleave and remove the top portion 1314 of the donor wafer 1306 along the cut layer 1308. The cleaving may be accomplished by various applications of energy to the SmartCut line 1308, or layer transfer demarcation plane, such as a mechanical strike by a knife or jet of liquid or jet of air, or by local laser heating, or other suitable methods. The result is a 3D wafer 1310 which comprises wafer 1302 with an added layer 1304 of mono-crystalline silicon, or multiple layers of materials. Layer 1304 may be polished chemically and mechanically to provide a suitable surface for further processing. Layer 1304 could be quite thin at the range of 50-200 nm as desired. The described flow is called "layer transfer". Layer transfer is commonly utilized in the fabrication of SOI—Silicon On Insulator—wafers. For SOI wafers the upper surface is oxidized so that after "layer transfer" a buried oxide—BOX—provides isolation between the top thin mono-crystalline silicon layer and the bulk of the wafer. The use of an implanted atomic species, such as Hydrogen or Helium or a combination, to create a cleaving plane as described above may be referred to in this document as "ion-cut" and is the preferred and illustrated layer transfer method utilized.

Persons of ordinary skill in the art will appreciate that the illustrations in FIG. 13 are exemplary only and are not drawn to scale. Such skilled persons will further appreciate that many variations are possible such as, for example, a heavily doped (greater than 1e20 atoms/cm3) boron layer or silicon germanium (SiGe) layer may be utilized as an etch stop either within the ion-cut process flow, wherein the layer transfer demarcation plane may be placed within the etch stop layer or into the substrate material below, or the etch stop layers may be utilized without a implant cleave process and the donor wafer may be preferentially etched away until the etch stop layer is reached. Such skilled persons will further appreciate that the oxide layer within an SOI or GeOI donor wafer may serve as the etch stop layer. Many other modifications within the scope of the invention will suggest themselves to such skilled persons after reading this specification. Thus the invention is to be limited only by the appended claims.

Now that a "layer transfer" process is used to bond a thin mono-crystalline silicon layer 1304 on top of the prepro-cessed wafer 1302, a standard process could ensue to construct the rest of the desired circuits as is illustrated in FIG. 9A, starting with layer 902 on the transferred layer 1304. The lithography step will use alignment marks on wafer 1302 so the following circuits 902 and 916 and so forth could be properly connected to the underlying circuits 914. An aspect that should be accounted for is the high temperature that would be needed for the processing of circuits 902. The pre-processed circuits on wafer 1302 would need to withstand this high temperature needed for the activation of the semiconductor transistors 902 fabri-cated on the 1304 layer. Those circuits on wafer 1302 will comprise transistors and local interconnects of poly-crystal-line silicon (polysilicon or poly) and some other type of interconnection that could withstand high temperature such as tungsten. A processed wafer that can withstand subse-quent processing of transistors on top at high temperatures may be a called the "Foundation" or a foundation wafer, layer or circuitry. An advantage of using layer transfer for the construction of the underlying circuits is having the layer transferred 1304 be very thin which enables the through silicon via connections 916, or thru layer vias (TLVs), to have low aspect ratios and be more like normal contacts, which could be made very small and with minimum area penalty. The thin transferred layer also allows conventional direct thru-layer alignment techniques to be performed, thus increasing the density of silicon via connections 916.

Figure 14:
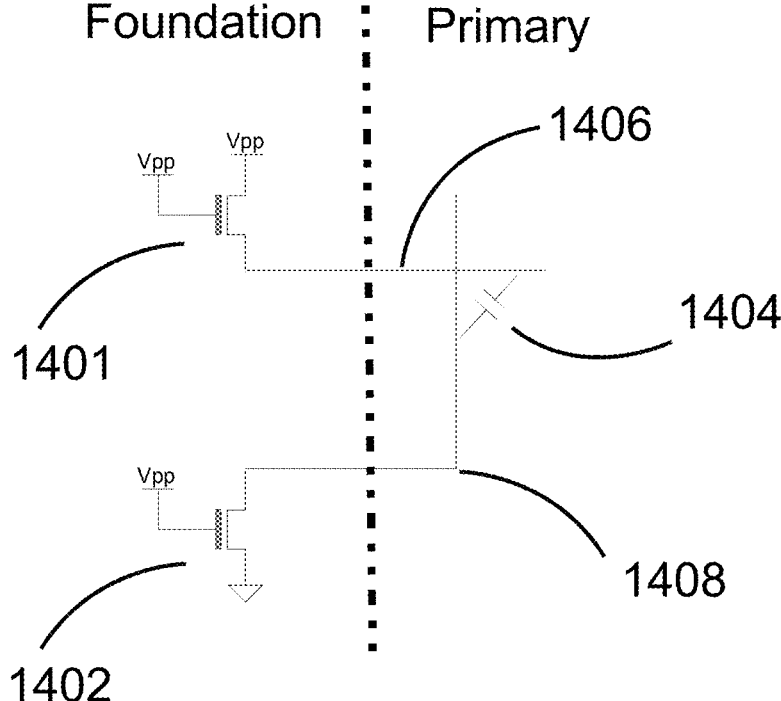
FIG. 14 is a drawing illustration of an underlying programming circuits.

FIG. 14 is a drawing illustration of an underlying pro-gramming circuit. Programming Transistors 1401 and 1402 are pre-fabricated on the foundation wafer 1302 and then the programmable logic circuits and the antifuse 1404 are built on the transferred layer 1304. The programming connections 1406, 1408 are connected to the programming transistors by contact holes through layer 1304 as illustrated in FIG. 9A by 916. The programming transistors are designed to withstand the relatively higher programming voltage for the antifuse 1404 programming.

Figure 15:
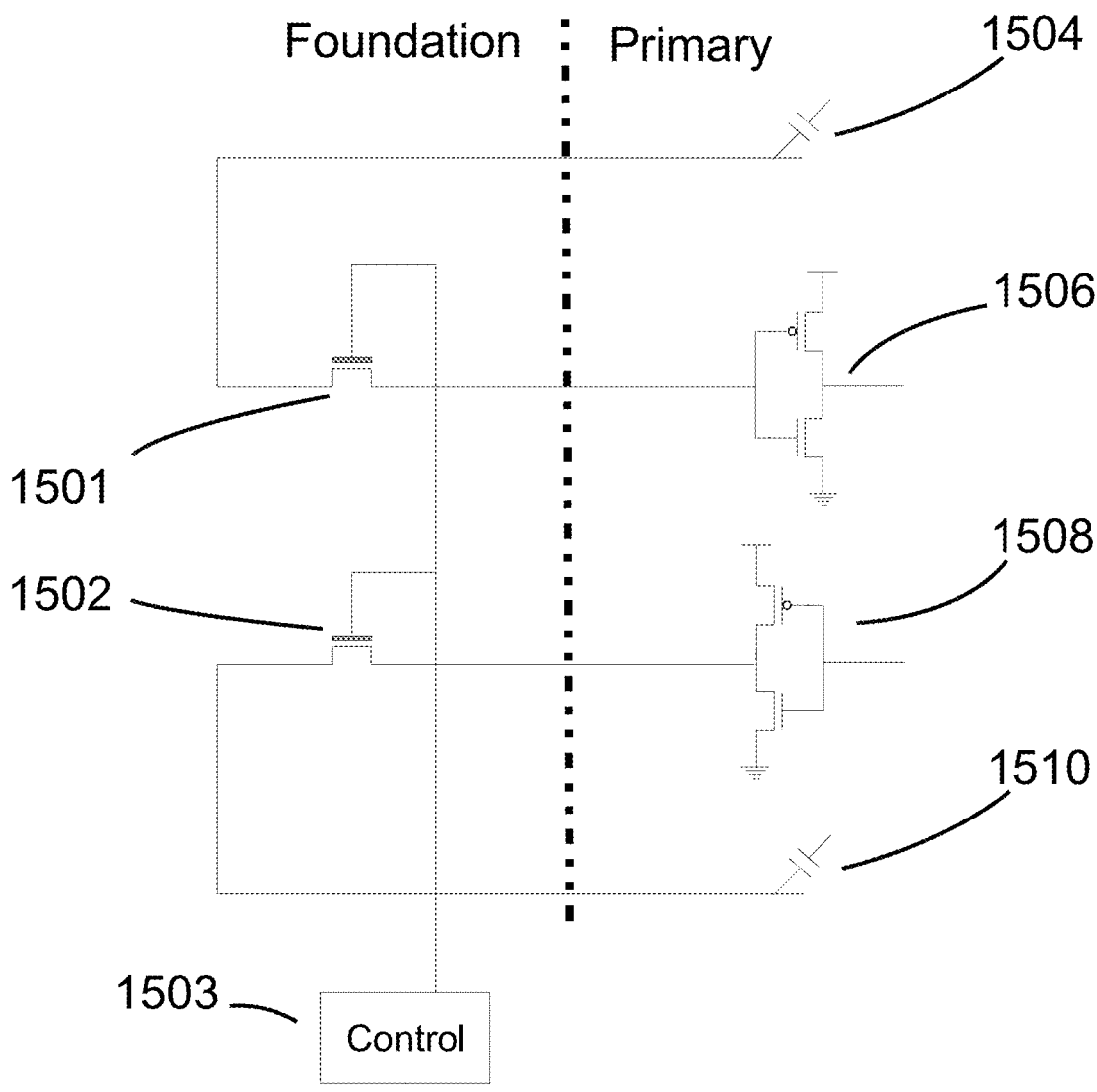
FIG. 15 is a drawing illustration of an underlying isolation transistors circuits.

FIG. 15 is a drawing illustration of an underlying isolation transistor circuit. The higher voltage used to program anti-fuses 1504 or 1510 might damage the logic transistors 1506, 1508. To protect the logic circuits, isolation transistors 1501, 1502, which are designed to withstand higher voltage, are used. The higher programming voltage is only used at the programming phase at which time the isolation transistors are turned off by the control circuit 1503. The underlying wafer 1302 could also be used to carry the isolation tran-sistors. Having the relatively large programming transistors and isolation transistor on the foundation silicon 1302 allows far better use of the primary silicon 902 (1304). Usually the primary silicon will be built in an advanced process to provide high density and performance. The foun-dation silicon could be built in a less advanced process to reduce costs and support the higher voltage transistors. It could also be built with other than CMOS transistors such as Double Diffused Metal Oxide Semiconductor (DMOS) or bi-polar junction transistors when such is advantageous for the programming and the isolation function. In many cases there is a need to have protection diodes for the gate input that are called Antennas. Such protection diodes could be also effectively integrated in the foundation alongside the input related Isolation Transistors. On the other hand the isolation transistors 1501, 1502 would provide the protec-tion for the antenna effect so no additional diodes would be needed.

An additional alternative embodiment of the invention is where the foundation layer 1302 is pre-processed to carry a plurality of back bias voltage generators. A known challenge in advanced semiconductor logic devices is die-to-die and within-a-die parameter variations. Various sites within the die might have different electrical characteristics due to dopant variations and such. The most critical of these parameters that affect the variation is the threshold voltage of the transistor. Threshold voltage variability across the die is mainly due to channel dopant, gate dielectric, and critical dimension variability. This variation becomes profound in sub 45 nm node devices. The usual implication is that the design should be done for the worst case, resulting in a quite significant performance penalty. Alternatively complete new designs of devices are being proposed to solve this variabil-ity problem with significant uncertainty in yield and cost. A possible solution is to use localized back bias to drive upward the performance of the worst zones and allow better overall performance with minimal additional power. The foundation-located back bias could also be used to minimize leakage due to process variation.

Figure 16A:
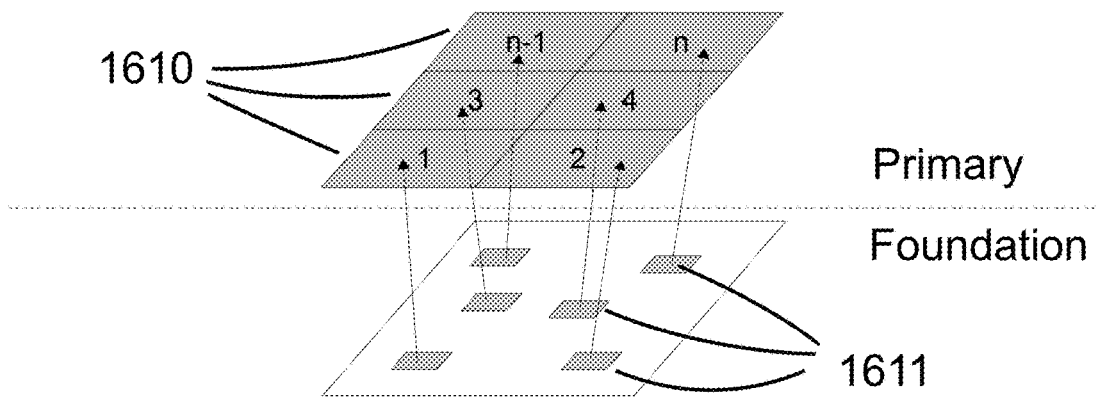
FIG. 16A is a topology drawing illustration of underlying back bias circuitry.

FIG. 16A is a topology drawing illustration of back bias circuitry. The foundation layer 1302 carries back bias cir-cuits 1611 to allow enhancing the performance of some of the zones 1610 on the primary device which otherwise will have lower performance.

Figure 16B:
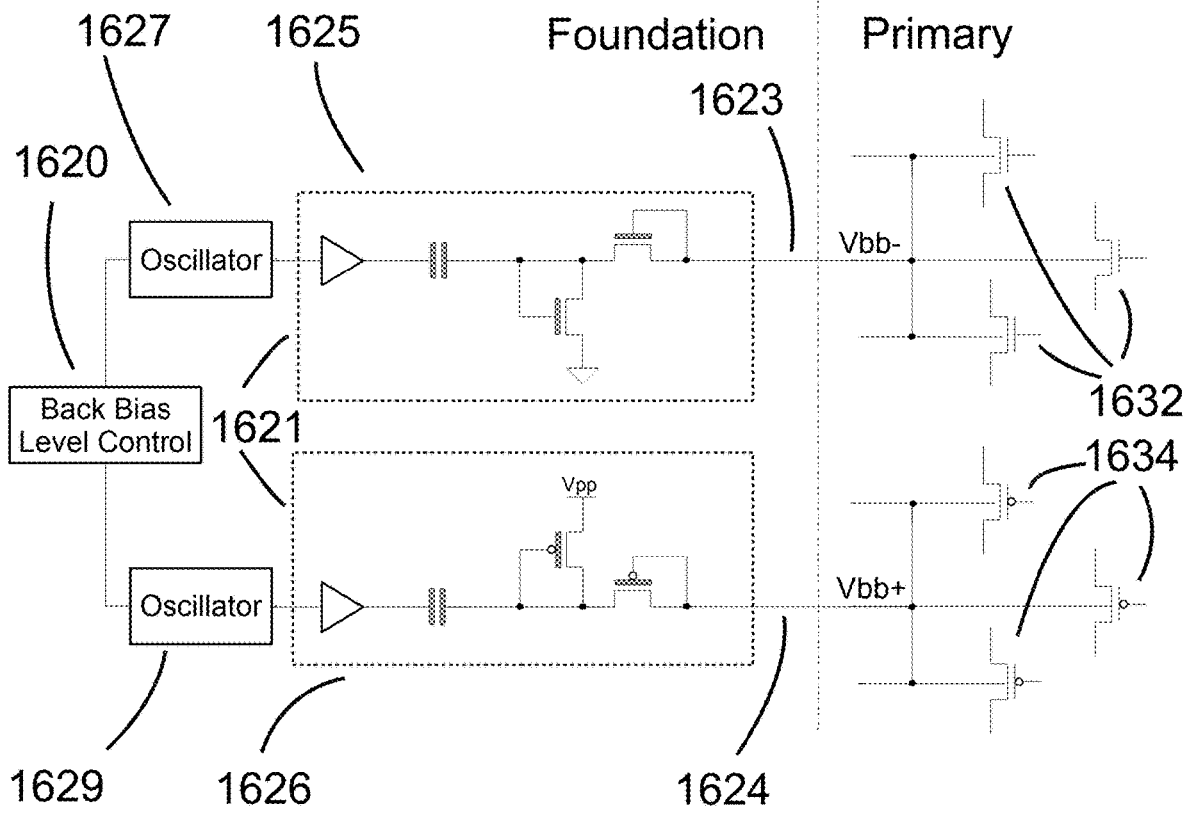
FIG. 16B is a drawing illustration of underlying back bias circuits.

FIG. 16B is a drawing illustration of back bias circuits. A back bias level control circuit 1620 is controlling the oscil-lators 1627 and 1629 to drive the voltage generators 1621. The negative voltage generator 1625 will generate the desired negative bias which will be connected to the primary circuit by connection 1623 to back bias the N-channel Metal-Oxide-Semiconductor (NMOS) transistors 1632 on the primary silicon 1304. The positive voltage generator 1626 will generate the desired negative bias which will be connected to the primary circuit by connection 1624 to back bias the P-channel Metal-Oxide-Semiconductor (PMOS) transistors 1634 on the primary silicon 1304. The setting of the proper back bias level per zone will be done in the initiation phase. It could be done by using external tester and controller or by on-chip self test circuitry. Preferably a non volatile memory will be used to store the per zone back bias voltage level so the device could be properly initialized at power up. Alternatively a dynamic scheme could be used where different back bias level(s) are used in different operating modes of the device. Having the back bias cir-cuitry in the foundation allows better utilization of the primary device silicon resources and less distortion for the logic operation on the primary device.

Figure 16C:
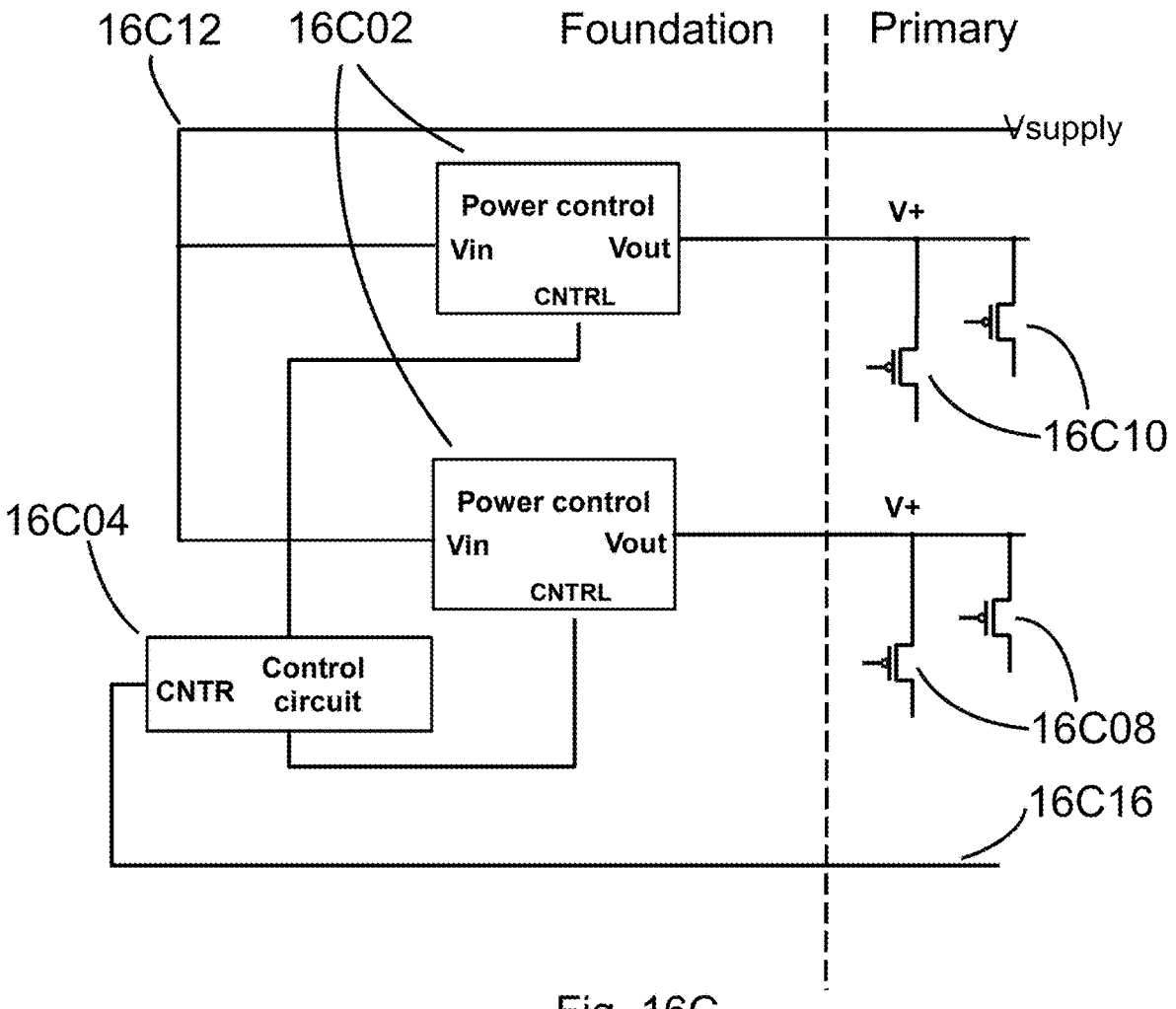
FIG. 16C is a drawing illustration of power control circuits

FIG. 16C illustrates an alternative circuit function that may fit well in the "Foundation." In many IC designs it is desired to integrate power control to reduce either voltage to sections of the device or to totally power off these sections when those sections are not needed or in an almost 'sleep' mode. In general such power control is best done with higher voltage transistors. Accordingly a power control circuit cell 16C02 may be constructed in the Foundation. Such power control 16C02 may have its own higher voltage supply and control or regulate supply voltage for sections 16C10 and 16C08 in the "Primary" device. The control may come from the primary device 16C16 and be managed by control circuit 16C04 in the Foundation.

Figure 16D:
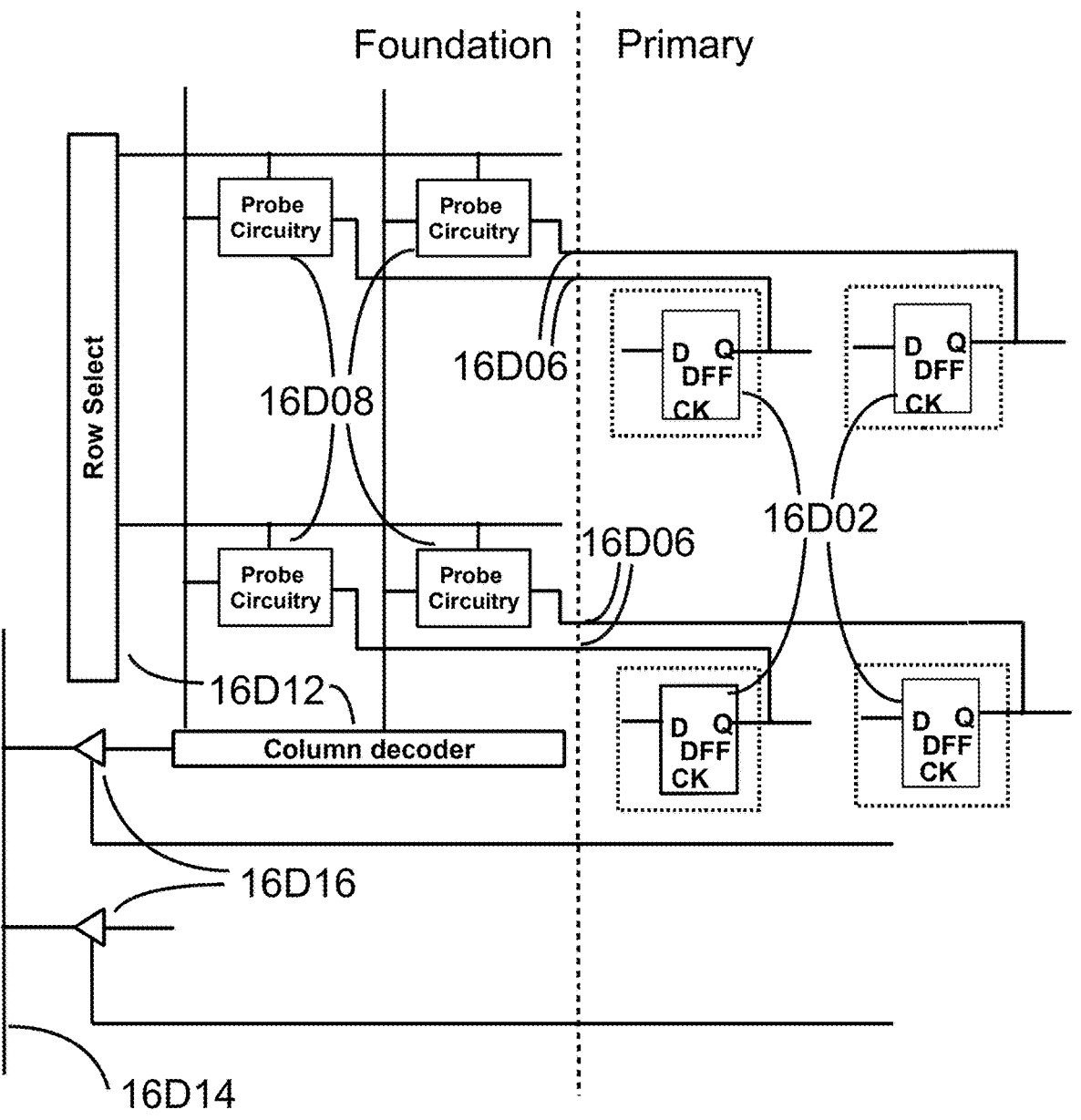
FIG. 16D is a drawing illustration of probe circuits

FIG. 16D illustrates an alternative circuit function that may fit well in the "Foundation." In many IC designs it is desired to integrate a probe auxiliary system that will make it very easy to probe the device in the debugging phase, and to support production testing. Probe circuits have been used in the prior art sharing the same transistor layer as the primary circuit. FIG. 16D illustrates a probe circuit constructed in the Foundation underneath the active circuits in the primary layer. FIG. 16D illustrates that the connections are made to the sequential active circuit elements 16D02. Those connections are routed to the Foundation through interconnect lines 17D06 where high impedance probe circuits 16D08 will be used to sense the sequential element output. A selector circuit 16D12 allows one or more of those sequential outputs to be routed out through one or more buffers 16D16 which may be controlled by signals from the Primary circuit to supply the drive of the sequential output signal to the probed signal output 16D14 for debugging or testing. Persons of ordinary skill in the art will appreciate that other configurations are possible like, for example, having multiple groups of probe circuitry 16D08, multiple probe output signals 16D14, and controlling buffers 16D16 with signals not originating in the primary circuit.

Figure 17:
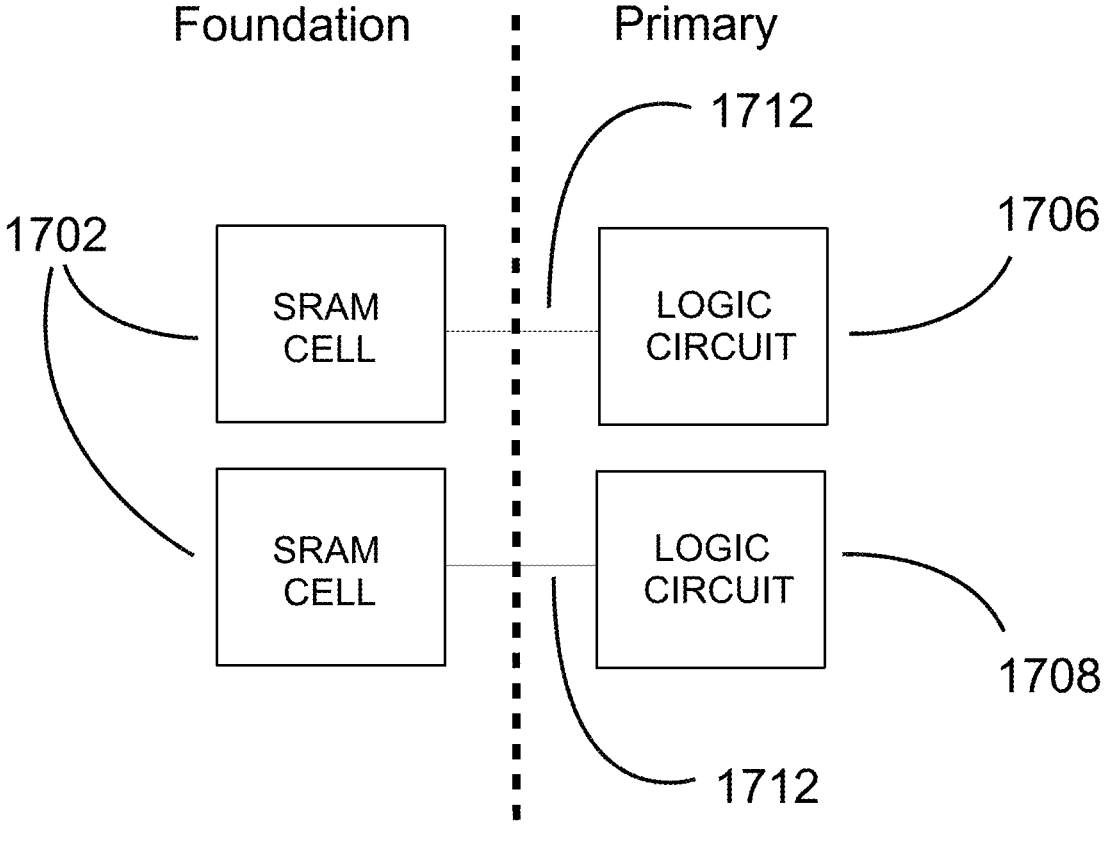
FIG. 17 is a drawing illustration of an underlying SRAM.

In another alternative the foundation substrate 1302 could additionally carry SRAM cells as illustrated in FIG. 17. The SRAM cells 1702 pre-fabricated on the underlying substrate 1302 could be connected 1712 to the primary logic circuit 1706, 1708 built on 1704. As mentioned before, the layers built on 1704 could be aligned to the pre-fabricated structure on the underlying substrate 1302 so that the logic cells could be properly connected to the underlying RAM cells.

Figures 18A, 18B:
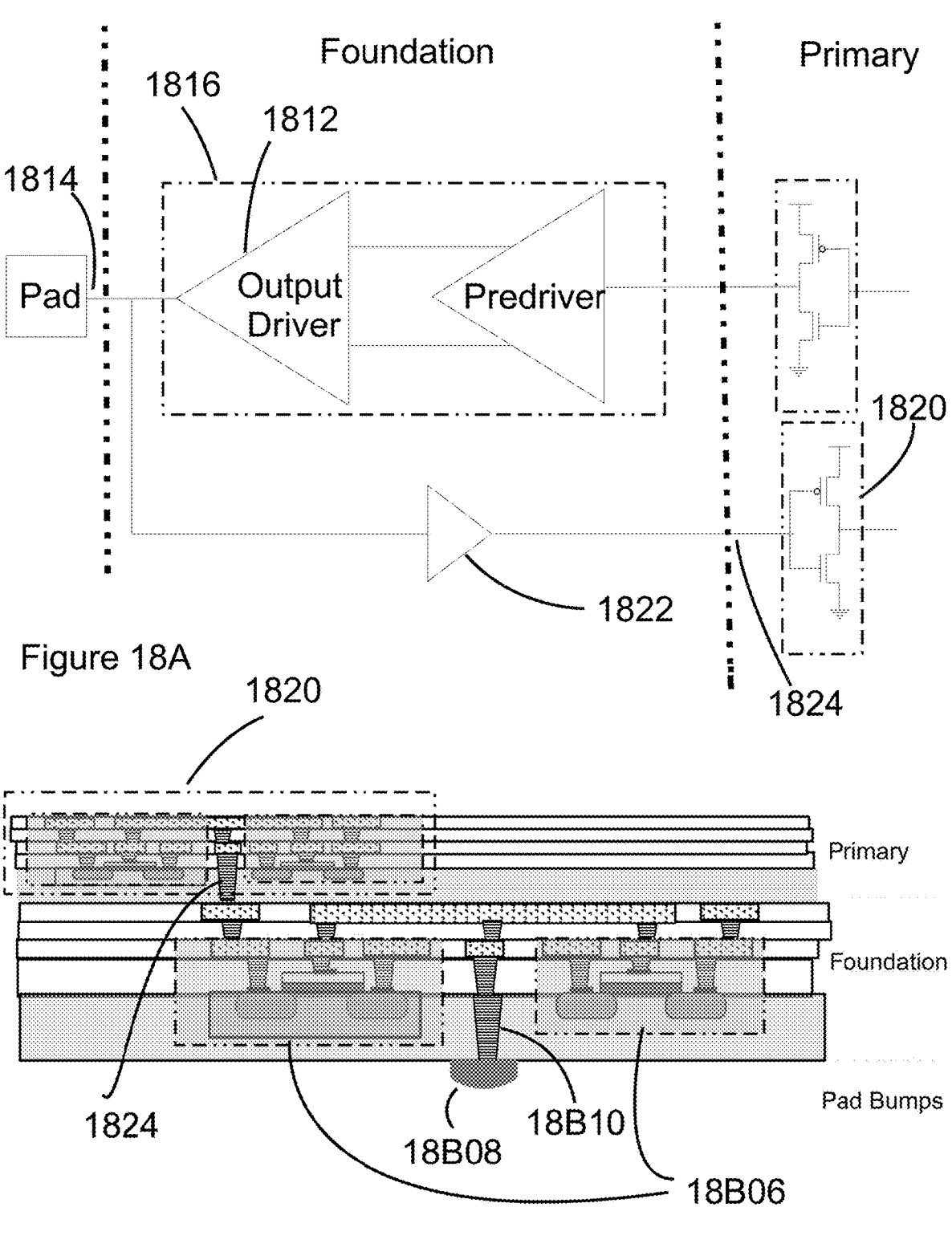
FIG. 18A is a drawing illustration of an underlying I/O.
FIG. 18B is a drawing illustration of side "cut"

FIG. 18A is a drawing illustration of an underlying I/O. The foundation 1302 could also be preprocessed to carry the I/O circuits or part of it, such as the relatively large transistors of the output drive 1812. Additionally TSV in the foundation could be used to bring the I/O connection 1814 all the way to the back side of the foundation. FIG. 18B is a drawing illustration of a side "cut" of an integrated device according to an embodiment of the present invention. The Output Driver is illustrated by PMOS and NMOS output transistors 18B06 coupled through TSV 18B10 to connect to a backside pad or pad bump 18B08. The connection material used in the foundation 1302 can be selected to withstand the temperature of the following process constructing the full device on 1304 as illustrated in FIG. 9A—902, 904, 906, 907, 910, 912, such as tungsten. The foundation could also carry the input protection circuit 1816 connecting the pad 18B08 to the input logic 1820 in the primary circuits or buffer 1822.

An additional embodiment of the present invention may be to use TSVs in the foundation such as TSV 18B10 to connect between wafers to form 3D Integrated Systems. In general each TSV takes a relatively large area, typically a few square microns. When the need is for many TSVs, the overall cost of the area for these TSVs might be high if the use of that area for high density transistors is precluded. Pre-processing these TSVs on the donor wafer on a relatively older process line will significantly reduce the effective costs of the 3D TSV connections. The connection 1824 to the primary silicon circuitry 1820 could be then made at the minimum contact size of few tens of square nanometers, which is two orders of magnitude lower than the few square microns needed by the TSVs. Those of ordinary skill in the art will appreciate that FIG. 18B is for illustration only and is not drawn to scale. Such skilled persons will understand there are many alternative embodiments and component arrangements that could be constructed using the inventive principles shown and that FIG. 18B is not limiting in any way.

Figure 18C:
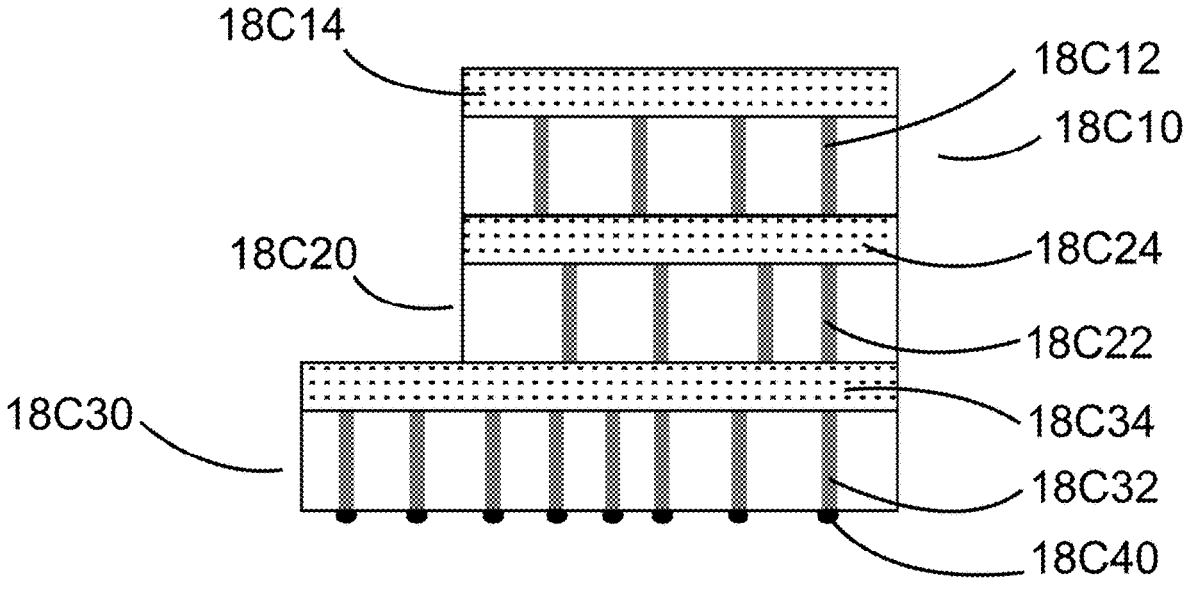
FIG. 18C is a drawing illustration of a 3D IC system.

FIG. 18C demonstrates a 3D system comprising three dice 18C10, 18C20 and 18C30 coupled together with TSVs 18C12, 18C22 and 18C32 similar to TSV 18B10 as described in association with FIG. 18A. The stack of three dice utilize TSV in the Foundations 18C12, 18C22, and 18C32 for the 3D interconnect may allow for minimum effect or silicon area loss of the Primary silicon 18C14, 18C24 and 18C34 connected to their respective Foundations with minimum size via connections. The three die stacks may be connected to a PC Board using bumps 18C40 connected to the bottom die TSVs 18C32. Those of ordinary skill in the art will appreciate that FIG. 18C is for illustration only and is not drawn to scale. Such skilled persons will understand there are many alternative embodiments and component arrangements that could be constructed using the inventive principles shown and that FIG. 18C is not limiting in any way. For example, a die stack could be placed in a package using flip chip bonding or the bumps 18C40 could be replaced with bond pads and the part flipped over and bonded in a conventional package with bond wires.

Figure 18D:
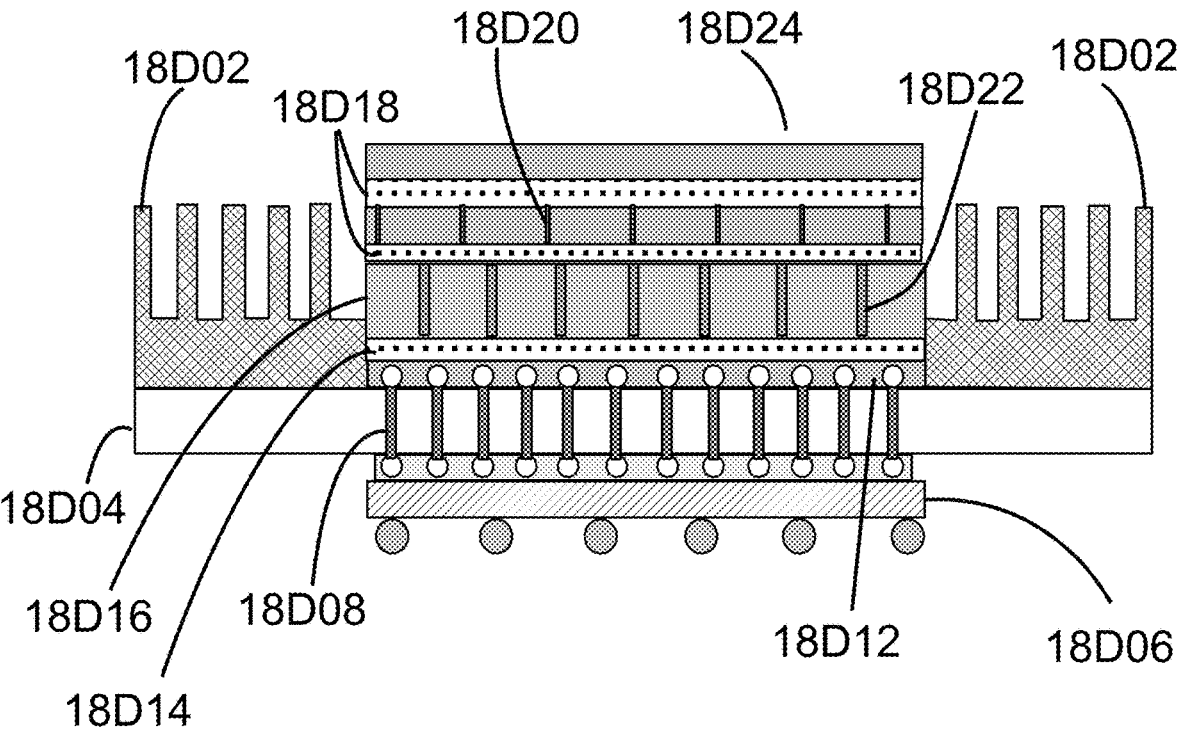
FIG. 18D is a drawing illustration of a 3D IC processor and DRAM system.

FIG. 18D illustrates a 3D IC processor and DRAM system. A well known problem in the computing industry is known as the "memory wall" and relates to the speed the processor can access the DRAM. The prior art proposed solution was to connect a DRAM stack using TSV directly on top of the processor and use a heat spreader attached to the processor back to remove the processor heat. But in order to do so, a special via needs to go "through DRAM" so that the processor I/Os and power could be connected. Having many processor-related "through-DRAM vias" leads to a few severe disadvantages. First, it reduces the usable silicon area of the DRAM by a few percent. Second, it increases the power overhead by a few percent. Third, it requires that the DRAM design be coordinated with the processor design which is very commercially challenging. The embodiment of FIG. 18D illustrates one solution to mitigate the above mentioned disadvantages by having a foundation with TSVs as illustrated in FIGS. 18B and 18C. The use of the foundation and primary structure may enable the connections of the processor without going through the DRAM.

In FIG. 18D the processor I/Os and power may be coupled from the face-down microprocessor active area 18D14—the primary layer, by vias 18D08 through heat spreader substrate 18D04 to an interposer 18D06. A heat spreader 18D12, the heat spreader substrate 19D04, and heat sink 18D02 are used to spread the heat generated on the processor active area 18D14. TSVs 18D22 through the Foundation 18D16 are used for the connection of the DRAM stack 18D24. The DRAM stack comprises multiple thinned DRAM 18D18 interconnected by TSV 18D20. Accordingly the DRAM stack does not need to pass through the processor I/O and power planes and could be designed and produced independent of the processor design and layout. The DRAM chip 18D18 that is closest to the Foundation 18D16 may be designed to connect to the Foundation TSVs 18D22, or a separate ReDistribution Layer (or RDL, not shown) may be added in between, or the Foundation 18D16 could serve that function with preprocessed high temperature interconnect layers, such as Tungsten, as described previously. And the processor's active area is not compromised by having TSVs through it as those are done in the Foundation 18D16.

Alternatively the Foundation vias 18D22 could be used to pass the processor I/O and power to the substrate 18D04 and to the interposer 18D06 while the DRAM stack would be coupled directly to the processor active area 18D14. Persons of ordinary skill in the art will appreciate that many more combinations are possible within the scope of the disclosed invention.

Figure 18E:
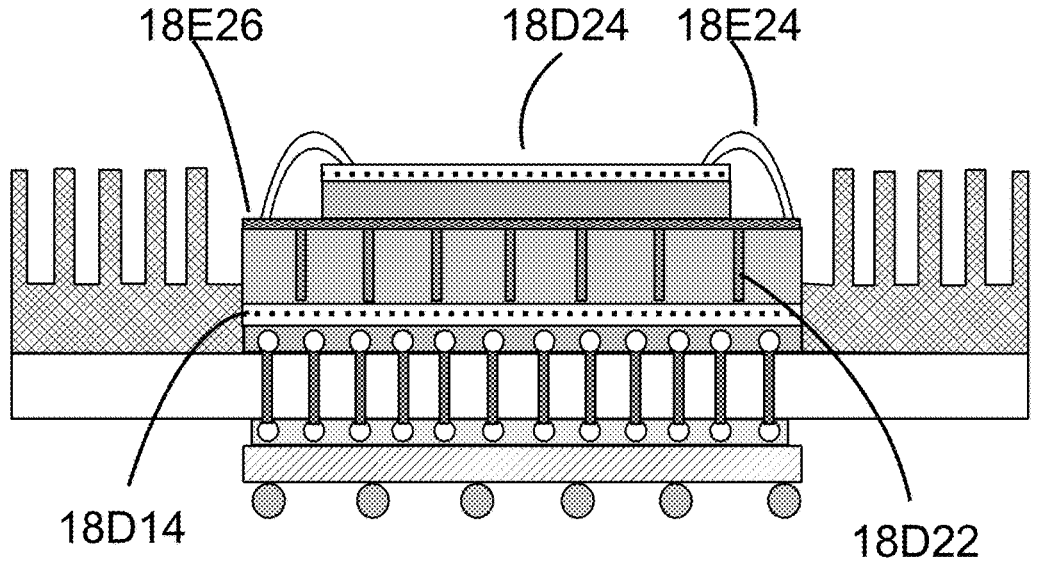
FIG. 18E is a drawing illustration of a 3D IC processor and DRAM system.

FIG. 18E illustrates another embodiment of the present invention wherein the DRAM stack 18D24 may be coupled by wire bonds 18E24 to an RDL (ReDistribution Layer) 18E26 that couples the DRAM to the Foundation vias 18D22, and thus couples them to the face-down processor 18D14.

Figure 18F:
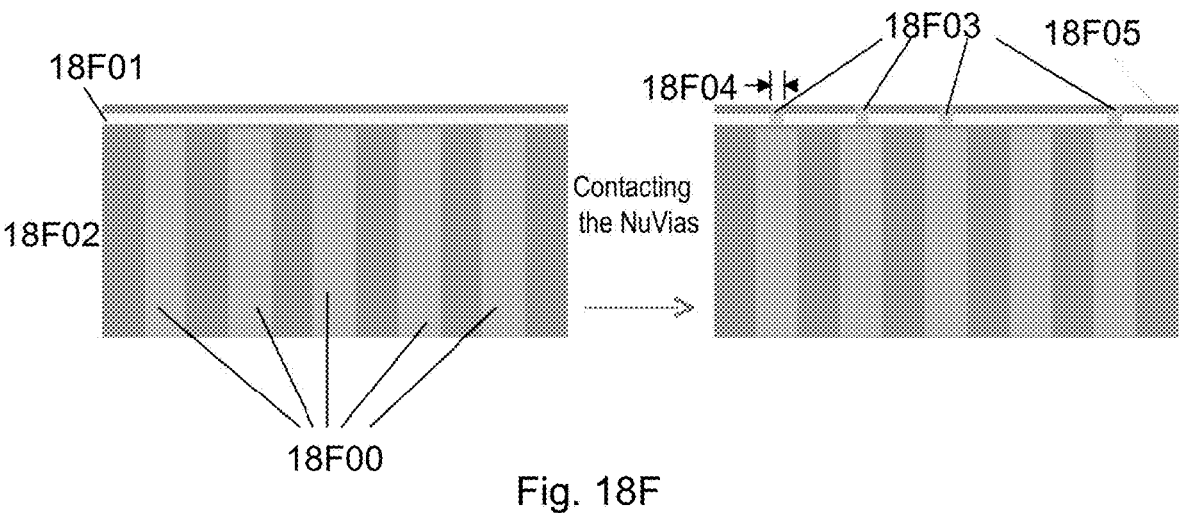
FIG. 18F is a drawing illustration of a custom SOI wafer used to build through-silicon connections.
Figure 18G:
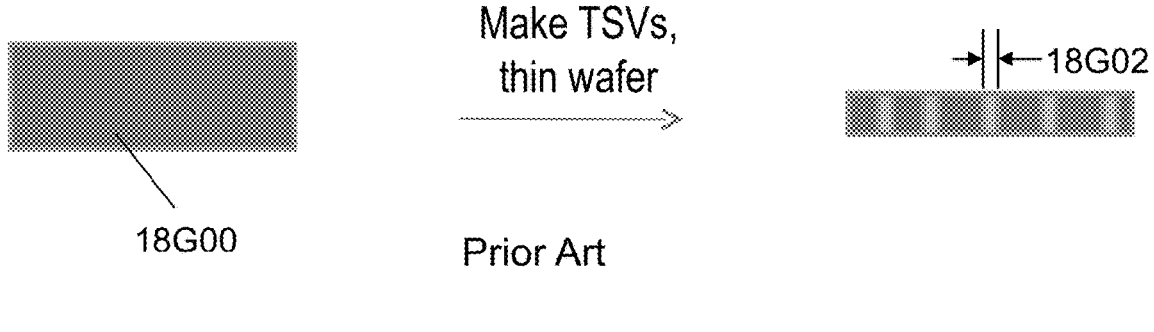
FIG. 18G is a drawing illustration of a prior art method to make through-silicon vias.

In yet another embodiment, custom SOI wafers are used where NuVias 18F00 may be processed by the wafer supplier. NuVias 18F00 may be conventional TSVs that may be 1 micron or larger in diameter and may be preprocessed by an SOI wafer vendor. This is illustrated in FIG. 18F with handle wafer 18F02 and Buried Oxide BOX 18F01. The handle wafer 18F02 may typically be many hundreds of microns thick, and the BOX 18F01 may typically be a few hundred nanometers thick. The Integrated Device Manufacturer (IDM) or foundry then processes NuContacts 18F03 to connect to the Nu Vias 18F00. NuContacts may be conventionally dimensioned contacts etched thru the thin silicon 18F05 and the BOX 18F01 of the SOI and filled with metal. The NuContact diameter DNuContact 18F04, in FIG. 18F may then be processed into the tens of nanometer range. The prior art of construction with bulk silicon wafers 18G00 as illustrated in FIG. 18G typically has a TSV diameter, DTSV_prior_art 18G02, in the micron range. The reduced dimension of NuContact DNuContact 18F04 in FIG. 18F may have important implications for semiconductor designers. The use of NuContacts may provide reduced die size penalty of through-silicon connections, reduced handling of very thin silicon wafers, and reduced design complexity. The arrangement of TSVs in custom SOI wafers can be based on a high-volume integrated device manufacturer (IDM) or foundry's request, or be based on a commonly agreed industry standard.

Figure 18H:
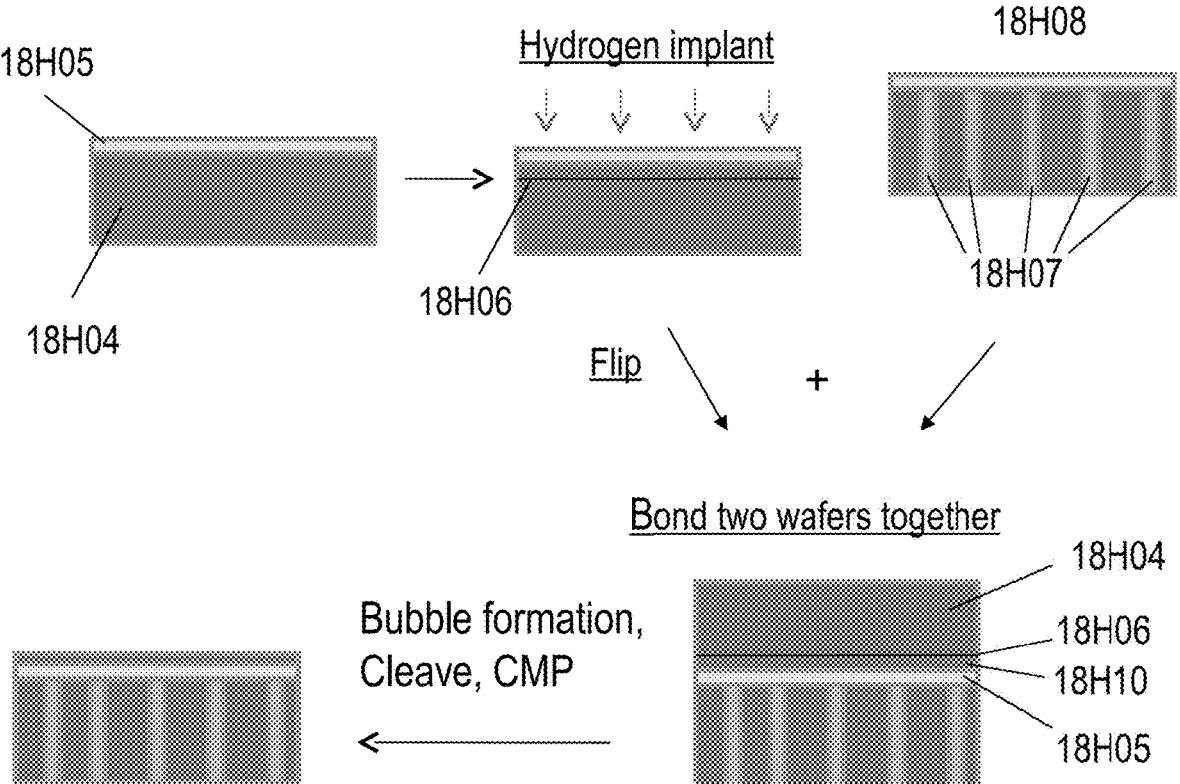
FIG. 18H is a drawing illustration of a process flow for making custom SOI wafers.

A process flow as illustrated in FIG. 18H may be utilized to manufacture these custom SOI wafers. Such a flow may be used by a wafer supplier. A silicon donor wafer 18H04 is taken and its surface 18H05 may be oxidized. An atomic species, such as, for example, hydrogen, may then be implanted at a certain depth 18H06. Oxide-to-oxide bonding as described in other embodiments may then be used to bond this wafer with an acceptor wafer 18H08 having pre-processed NuVias 18H07. The NuVias 18H07 may be constructed with a conductive material, such as tungsten or doped silicon, which can withstand high-temperature processing. An insulating barrier, such as, for example, silicon oxide, may be utilized to electrically isolate the Nu Via 18H07 from the silicon of the acceptor wafer 18H08. Alternatively, the wafer supplier may construct Nu Vias 18H07 with silicon oxide. The integrated device manufacturer or foundry etches out this oxide after the high-temperature (more than 400° C.) transistor fabrication is complete and may replace this oxide with a metal such as copper or aluminum. This process may allow a low-melting point, but highly conductive metal, like copper to be used. Following the bonding, a portion 18H10 of the donor silicon wafer 18H04 may be cleaved at 18H06 and then chemically mechanically polished as described in other embodiments.

Figure 18I:
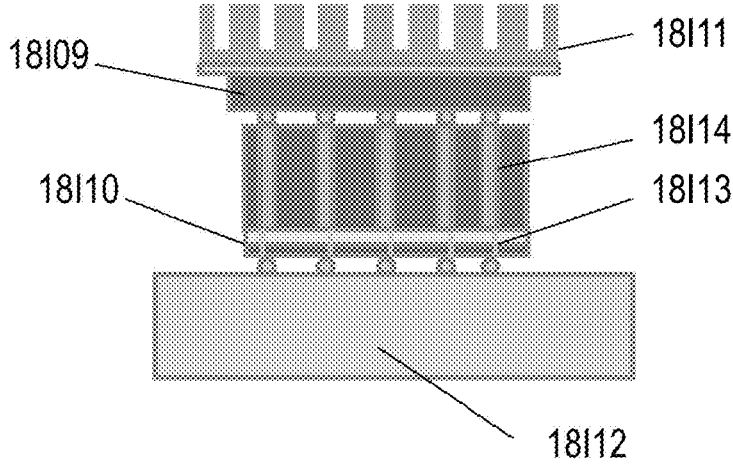
FIG. 18I is a drawing illustration of a processor-DRAM stack.
Figure 18J:
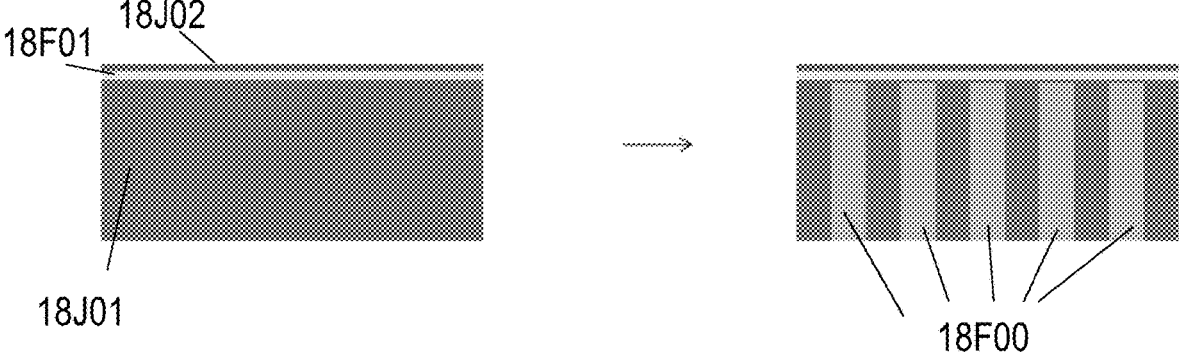
FIG. 18J is a drawing illustration of a process flow for making custom SOI wafers.

FIG. 18J depicts another technique to manufacture custom SOI wafers. A standard SOI wafer with substrate 18J01, box 18F01, and top silicon layer 18J02 may be taken and Nu Vias 18F00 may be formed from the back-side up to the oxide layer. This technique might have a thicker buried oxide 18F01 than a standard SOI process.

FIG. 18I depicts how a custom SOI wafer may be used for 3D stacking of a processor 18I09 and a DRAM 18I10. In this configuration, a processor's power distribution and I/O connections have to pass from the substrate 18I12, go through the DRAM 18I10 and then connect onto the processor 18I09. The above described technique in FIG. 18F may result in a small contact area on the DRAM active silicon, which is very convenient for this processor-DRAM stacking application. The transistor area lost on the DRAM die due to the through-silicon connection 18I13 and 18I14 is very small due to the tens of nanometer diameter of NuContact 18I13 in the active DRAM silicon. It is difficult to design a DRAM when large areas in its center are blocked by large through-silicon connections. Having small size through-silicon connections may help tackle this issue. Persons of ordinary skill in the art will appreciate that this technique may be applied to building processor-SRAM stacks, processor-flash memory stacks, processor-graphics-memory stacks, any combination of the above, and any other combination of related integrated circuits such as, for example, SRAM-based programmable logic devices and their associated configuration ROM/PROM/EPROM/EE-PROM devices, ASICs and power regulators, microcontrollers and analog functions, etc. Additionally, the silicon on insulator (SOI) may be a material such as polysilicon, GaAs, GaN, etc. on an insulator. Such skilled persons will appreciate that the applications of Nu Via and NuContact technology are extremely general and the scope of the invention is to be limited only by the appended claims.

In another embodiment of the present invention the foundation substrate 1302 could additionally carry re-drive cells (often called buffers). Re-drive cells are common in the industry for signals which is routed over a relatively long path. As the routing has a severe resistance and capacitance penalty it is helpful to insert re-drive circuits along the path to avoid a severe degradation of signal timing and shape. An advantage of having re-drivers in the foundation 1302 is that these re-drivers could be constructed from transistors who could withstand the programming voltage. Otherwise isolation transistors such as 1401 and 1402 or other isolation scheme may be used at the logic cell input and output.

An additional embodiment of the invention may be a modified TSV (Through Silicon Via) flow. This flow may be for wafer-to-wafer TSV and may provide a technique whereby the thickness of the added wafer may be reduced to about 1 micrometer (micron). FIGS. 19 A to D illustrate such a technique. The first wafer 1902 may be the base on top of which the 'hybrid' 3D structure may be built. A second wafer 1904 may be bonded on top of the first wafer 1902. The new top wafer may be face-down so that the circuits 1905 may be face-to-face with the first wafer 1902 circuits 1903.

The bond may be oxide-to-oxide in some applications or copper-to-copper in other applications. In addition, the bond may be by a hybrid bond wherein some of the bonding surface may be oxide and some may be copper.

Figures 19A, 19B:
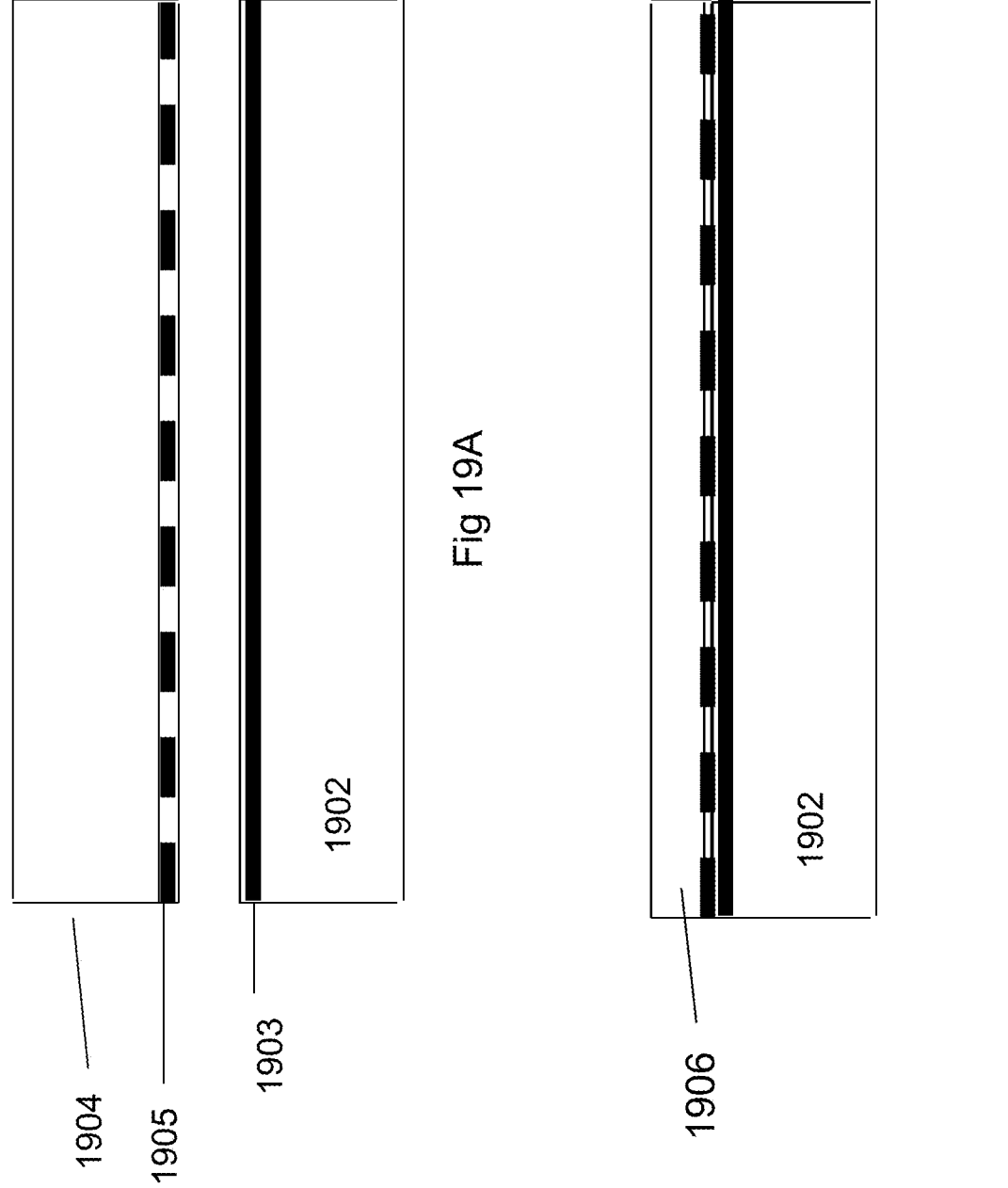
FIGS. 19A-19D are drawing illustrations of an advanced TSV flow.

After bonding, the top wafer 1904 may be thinned down to about 60 micron in a conventional back-lap and CMP process. FIG. 19B illustrates the now thinned wafer 1906 bonded to the first wafer 1902.

Figures 19C, 19D:
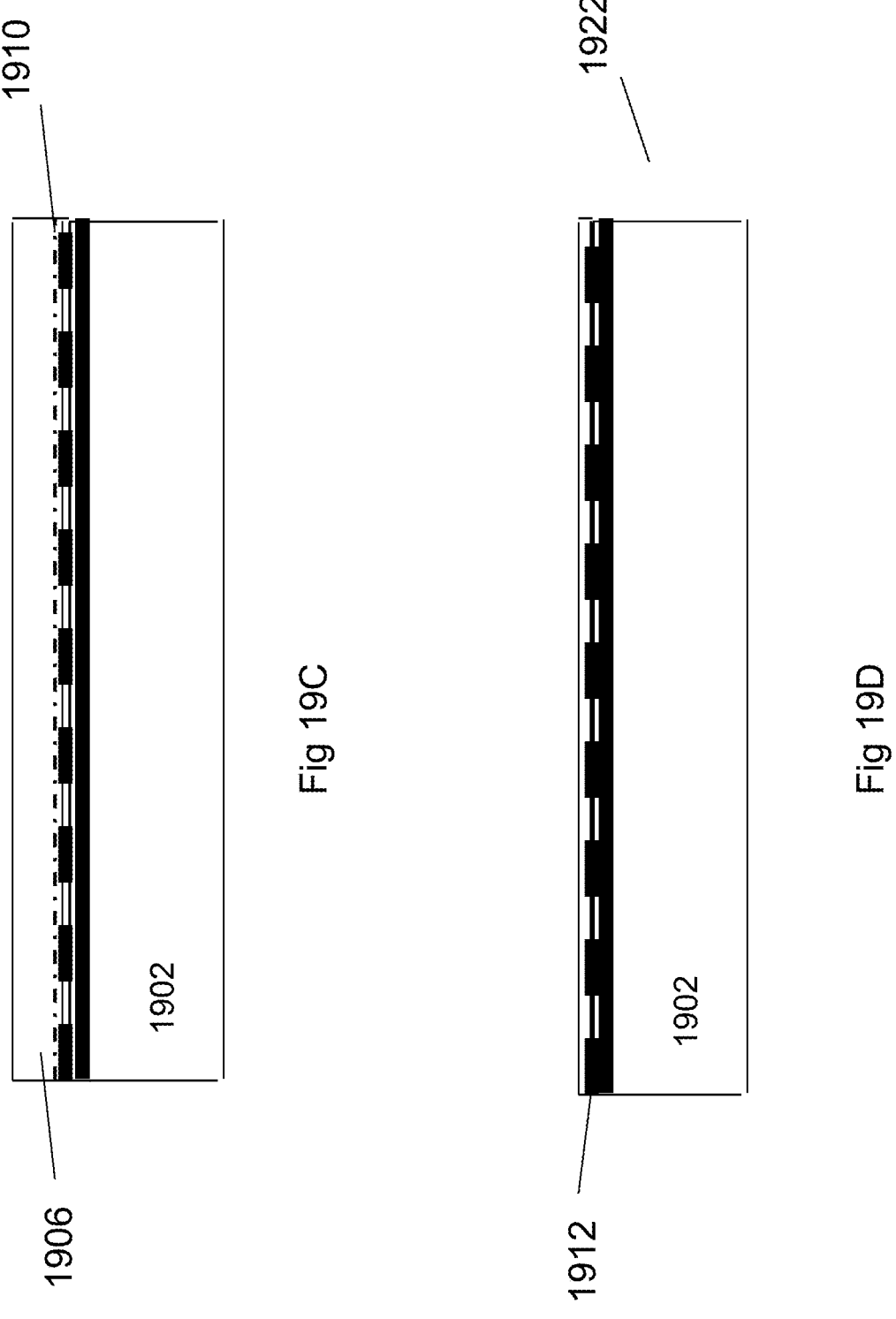

The next step may comprise a high accuracy measurement of the top wafer 1906 thickness. Then, using a high power 1-4 MeV H+ implant, a cleave plane 1910 may be defined in the top wafer 1906. The cleave plane 1910 may be positioned approximately 1 micron above the bond surface as illustrated in FIG. 19C. This process may be performed with a special high power implanter such as, for example, the implanter used by SiGen Corporation for their PV (Photo Voltaic) application.

Having the accurate measure of the top wafer 1906 thickness and the highly controlled implant process may enable cleaving most of the top wafer 1906 out thereby leaving a very thin layer 1912 of about 1 micron, bonded on top of the first wafer 9302 as illustrated in FIG. 19D.

An advantage of this process flow may be that an additional wafer with circuits could now be placed and bonded on top of the bonded structure 1922 in a similar manner. But first a connection layer may be built on the back of 1912 to allow electrical connection to the bonded structure 1922 circuits. Having the top layer thinned to a single micron level may allow such electrical connection metal layers to be fully aligned to the top wafer 1912 electrical circuits 1905 and may allows the vias through the back side of top layer 1912 to be relatively small, of about 100 nm in diameter.

The thinning of the top layer 1912 may enable the modified TSV to be at the level of 100 nm vs. the 5 microns necessary for TSVs that need to go through 50 microns of silicon. Unfortunately the misalignment of the wafer-to-wafer bonding process may still be quite significant at about +/−0.5 micron. Accordingly, as described elsewhere in this document in relation to FIG. 75 of incorporated by reference parent U.S. application Ser. No. 12/900,379 (U.S. Pat. No. 8,395,191), a landing pad of approximately 1×1 microns may be used on the top of the first wafer 1902 to connect with a small metal contact on the face of the second wafer 1904 while using copper-to-copper bonding. This process may represent a connection density of approximately 1 connection per 1 square micron.

It may be desirable to increase the connection density using a concept as illustrated in FIG. 80 and the associated explanations of incorporated by reference parent U.S. application Ser. No. 12/900,379 (U.S. Pat. No. 8,395,191). In the modified TSV case, it may be much more challenging to do so because the two wafers being bonded may be fully processed and once bonded, only very limited access to the landing strips may be available. However, to construct a via, etching through all layers may be needed. FIG. 20 illustrates a method and structures to address these issues.

Figures 20A, 20B:
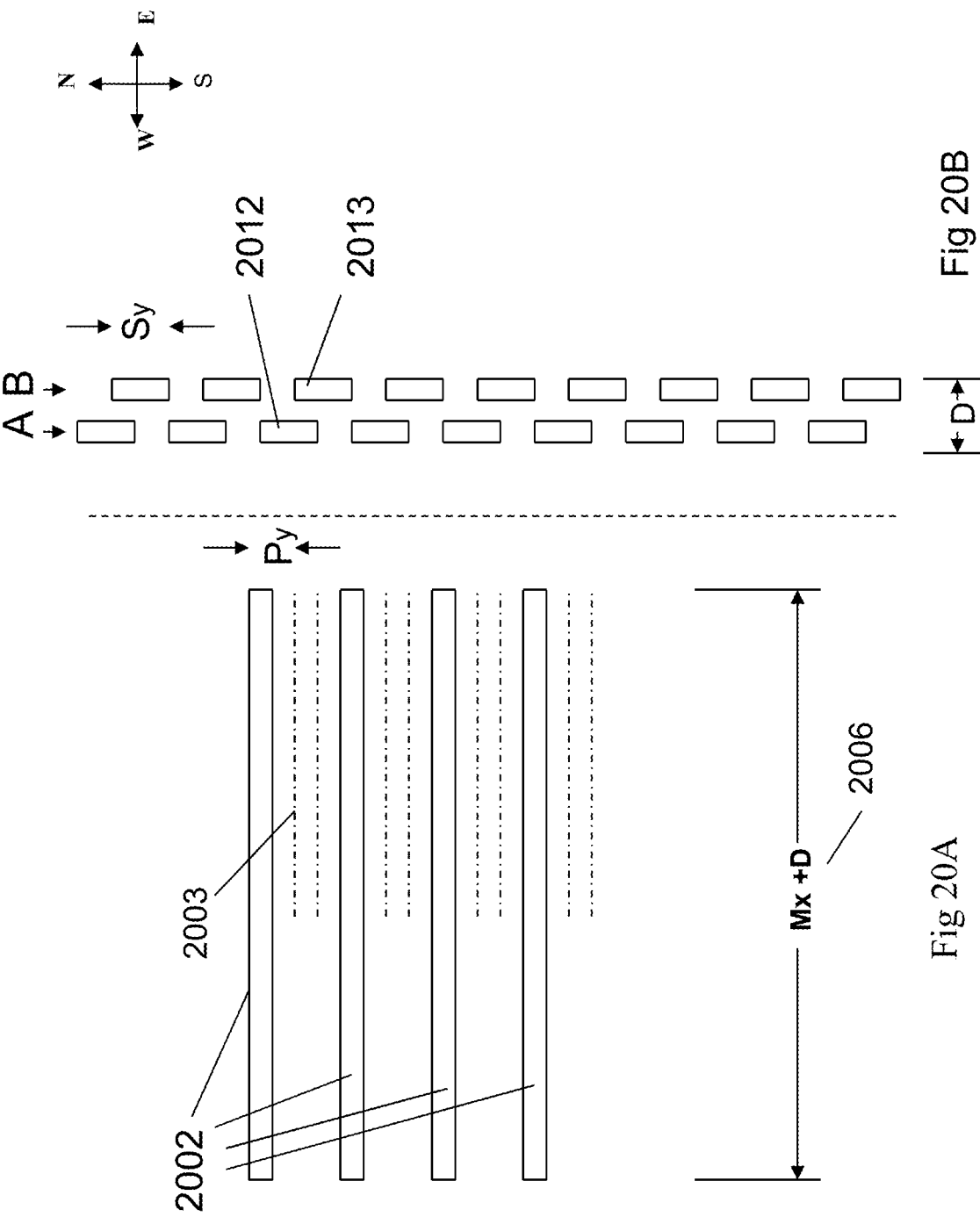
FIGS. 20A-20C are drawing illustrations of an advanced TSV multi-connections flow.

FIG. 20A illustrates four metal landing strips 2002 exposed at the upper layer of the first wafer 1902. The landing strips 2002 may be oriented East-West at a length 2006 of the maximum East-West bonding misalignment Mx plus a delta D, which will be explained later. The pitch of the landing strip may be twice the minimum pitch Py of this upper layer of the first wafer 1902. 2003 may indicate an unused potential room for an additional metal strip.

FIG. 20B illustrates landing strips 2012, 2013 exposed at the top of the second wafer 1912. FIG. 20B also shows two columns of landing strips, namely, A and B going North to South. The length of these landing strips is 1.25Py. The two wafers 1902 and 1912 may be bonded copper-to-copper and the landing strips of FIG. 20A and FIG. 20B may be designed so that the bonding misalignment does not exceed the maximum misalignment Mx in the East-West direction and My in the North-South direction. The landing strips 2012 and 2013 of FIG. 20B may be designed so that they may never unintentionally short to landing strips 2002 of 20A and that either row A landing strips 2012 or row B landing strips 2013 may achieve full contact with landing strips 2002. The delta D may be the size from the East edge of landing strips 2013 of row B to the West edge of A landing strips 2012. The number of landing strips 2012 and 2013 of FIG. 20B may be designed to cover the FIG. 20A landing strips 2002 plus My to cover maximum misalignment error in the North-South direction.

Figure 20C:
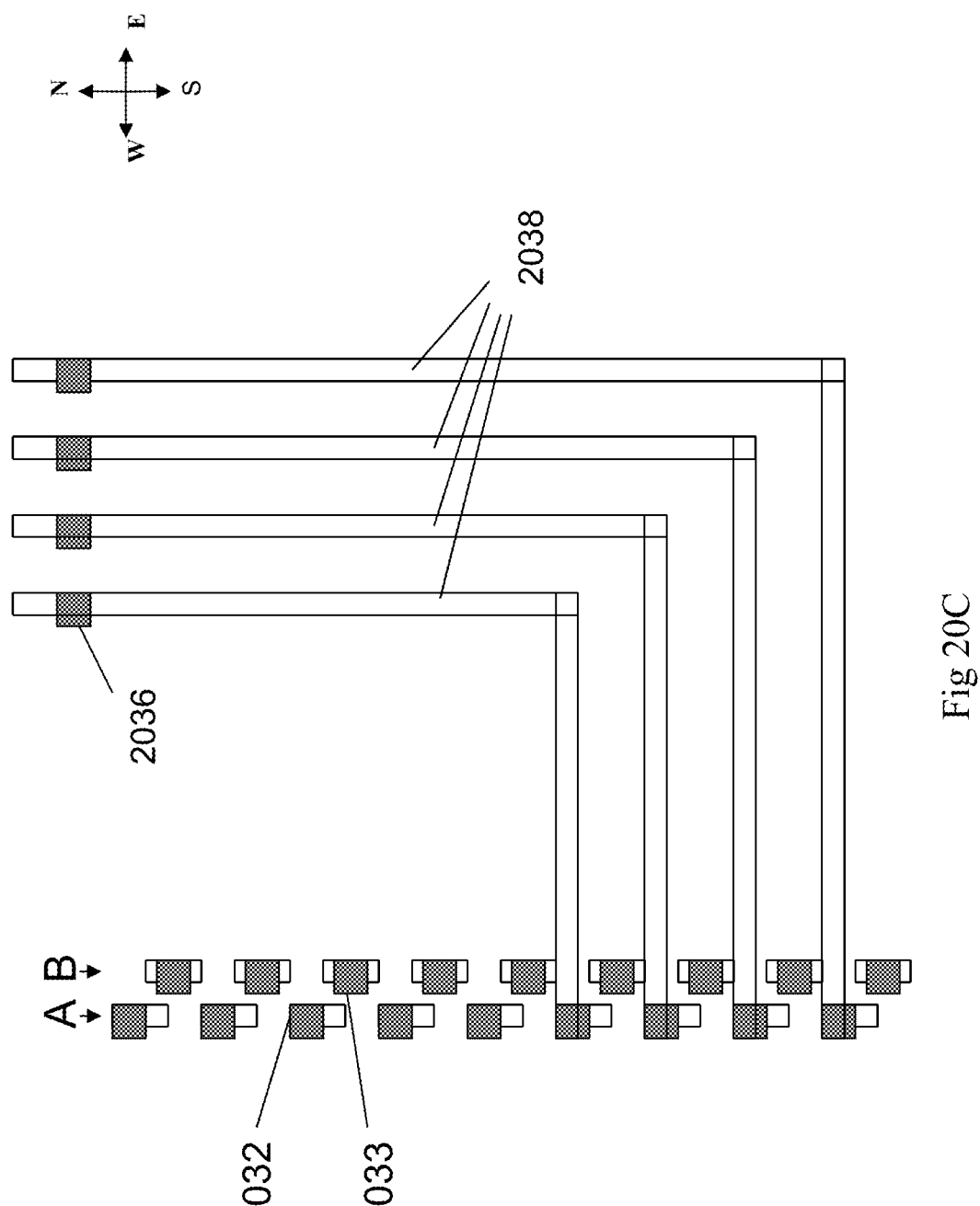

Substantially all the landing strips 2012 and 2013 of FIG. 20B may be routed by the internal routing of the top wafer 1912 to the bottom of the wafer next to the transistor layers. The location on the bottom of the wafer is illustrated in FIG. 19D as the upper side of the 1922 structure. Now new vias 2032 may be formed to connect the landing strips to the top surface of the bonded structure using conventional wafer processing steps. FIG. 20C illustrates all the via connections routed to the landing strips of FIG. 20B, arranged in row A 2032 and row B 2033. In addition, the vias 2036 for bringing in the signals may also be processed. All these vias may be aligned to the top wafer 1912.

As illustrated in FIG. 20C, a metal mask may now be used to connect, for example, four of the vias 2032 and 2033 to the four vias 2036 using metal strips 2038. This metal mask may be aligned to the top wafer 1912 in the East-West direction. This metal mask may also be aligned to the top wafer 1912 in the North-South direction but with a special offset that is based on the bonding misalignment in the North-South direction. The length of the metal structure 2038 in the North South direction may be enough to cover the worst case North-South direction bonding misalignment.

It should be stated again that the invention could be applied to many applications other than programmable logic such a Graphics Processor which may comprise many repeating processing units. Other applications might include general logic design in 3D ASICs (Application Specific Integrated Circuits) or systems combining ASIC layers with layers comprising at least in part other special functions. Persons of ordinary skill in the art will appreciate that many more embodiment and combinations are possible by employing the inventive principles contained herein and such embodiments will readily suggest themselves to such skilled persons. Thus the invention is not to be limited in any way except by the appended claims.

Yet another alternative to implement 3D redundancy to improve yield by replacing a defective circuit is by the use of Direct Write E-beam instead of a programmable connection.

An additional variation of the programmable 3D system may comprise a tiled array of programmable logic tiles connected with I/O structures that are pre fabricated on the base wafer 1302 of FIG. 13.

In yet an additional variation, the programmable 3D system may comprise a tiled array of programmable logic tiles connected with I/O structures that are pre-fabricated on top of the finished base wafer 1302 by using any of the techniques presented in conjunction to FIGS. 21-35 or FIGS. 39-40 of incorporated by reference parent U.S. application Ser. No. 12/900,379 (U.S. Pat. No. 8,395,191). In fact any of the alternative structures presented in FIG. 10 herein may be fabricated on top of each other by the 3D techniques presented in conjunction with FIGS. 21-35 or FIGS. 39-40 of incorporated by reference parent U.S. application Ser. No. 12/900,379 (U.S. Pat. No. 8,395,191). Accordingly many variations of 3D programmable systems may be constructed with a limited set of masks by mixing different structures to form various 3D programmable systems by varying the amount and 3D position of logic and type of I/Os and type of memories and so forth.

Additional flexibility and reuse of masks may be achieved by utilizing only a portion of the full reticle exposure. Modern steppers allow covering portions of the reticle and hence projecting only a portion of the reticle. Accordingly a portion of a mask set may be used for one function while another portion of that same mask set would be used for another function. For example, let the structure of FIG. 37 of incorporated by reference parent U.S. application Ser. No. 12/900,379 (U.S. Pat. No. 8,395,191) represent the logic portion of the end device of a 3D programmable system. On top of that 3×3 programmable tile structure I/O structures could be built utilizing process techniques according to FIGS. 21-35 or FIGS. 39-40 of incorporated by reference parent U.S. application Ser. No. 12/900,379 (U.S. Pat. No. 8,395,191). There may be a set of masks where various portions provide for the overlay of different I/O structures; for example, one portion comprising simple I/Os, and another of Serializer/Deserializer (Ser/Des) I/Os. Each set is designed to provide tiles of I/O that perfectly overlay the programmable logic tiles. Then out of these two portions on one mask set, multiple variations of end systems could be produced, including one with all nine tiles as simple I/Os, another with SerDes overlaying tile (0,0) while simple I/Os are overlaying the other eight tiles, another with SerDes overlaying tiles (0,0), (0,1) and (0,2) while simple I/Os are overlaying the other 6 tiles, and so forth. In fact, if properly designed, multiples of layers could be fabricated one on top of the other offering a large variety of end products from a limited set of masks. Persons of ordinary skill in the art will appreciate that this technique has applicability beyond programmable logic and may profitably be employed in the construction of many 3D ICs and 3D systems. Thus the scope of the invention is only to be limited by the appended claims.

In yet an additional alternative of the current invention, the 3D antifuse Configurable System, may also comprise a Programming Die. In some cases of FPGA products, and primarily in antifuse-based products, there is an external apparatus that may be used for the programming the device. In many cases it is a user convenience to integrate this programming function into the FPGA device. This may result in a significant die overhead as the programming process needs higher voltages as well as control logic. The programmer function could be designed into a dedicated Programming Die. Such a Programmer Die could comprise the charge pump, to generate the higher programming voltage, and a controller with the associated programming to program the antifuse configurable dies within the 3D Configurable circuits, and the programming check circuits. The Programming Die might be fabricated using a lower cost older semiconductor process. An additional advantage of this 3D architecture of the Configurable System may be a high volume cost reduction option wherein the antifuse layer may be replaced with a custom layer and, therefore, the Programming Die could be removed from the 3D system for a more cost effective high volume production.

It will be appreciated by persons of ordinary skill in the art, that the present invention is using the term antifuse as it is the common name in the industry, but it also refers in this invention to any micro element that functions like a switch, meaning a micro element that initially has highly resistive-OFF state, and electronically it could be made to switch to a very low resistance-ON state. It could also correspond to a device to switch ON-OFF multiple times—a re-programmable switch. As an example there are new innovations, such as the electro-statically actuated Metal-Droplet micro-switch introduced by C. J. Kim of UCLA micro & nano manufacturing lab, that may be compatible for integration onto CMOS chips.

It will be appreciated by persons skilled in the art that the present invention is not limited to antifuse configurable logic and it will be applicable to other non-volatile configurable logic. A good example for such is the Flash based configurable logic. Flash programming may also need higher voltages, and having the programming transistors and the programming circuits in the base diffusion layer may reduce the overall density of the base diffusion layer. Using various embodiments of the current invention may be useful and could allow a higher device density. It is therefore suggested to build the programming transistors and the programming circuits, not as part of the diffusion layer, but according to one or more embodiments of the present invention. In high volume production one or more custom masks could be used to replace the function of the Flash programming and accordingly save the need to add on the programming transistors and the programming circuits.

Unlike metal-to-metal antifuses that could be placed as part of the metal interconnection, Flash circuits need to be fabricated in the base diffusion layers. As such it might be less efficient to have the programming transistor in a layer far above. An alternative embodiment of the current invention is to use Through-Silicon-Via 916 to connect the configurable logic device and its Flash devices to an underlying structure 914 comprising the programming transistors.

In this document, various terms have been used while generally referring to the element. For example, "house" refers to the first mono-crystalline layer with its transistors and metal interconnection layer or layers. This first mono-crystalline layer has also been referred to as the main wafer and sometimes as the acceptor wafer and sometimes as the base wafer.

Some embodiments of the current invention may include alternative techniques to build IC (Integrated Circuit) devices including techniques and methods to construct 3D IC systems. Some embodiments of the present invention may enable device solutions with far less power consumption than prior art. These device solutions could be very useful for the growing application of mobile electronic devices such as mobile phones, smart phone, cameras and the like. For example, incorporating the 3D IC semiconductor devices according to some embodiments of the present invention within these mobile electronic devices could provide superior mobile units that could operate much more efficiently and for a much longer time than with prior art technology.

3D ICs according to some embodiments of the current invention could also enable electronic and semiconductor devices with much a higher performance due to the shorter interconnect as well as semiconductor devices with far more complexity via multiple levels of logic and providing the ability to repair or use redundancy. The achievable complexity of the semiconductor devices according to some embodiments of the present invention could far exceed what was practical with the prior art technology. These advantages could lead to more powerful computer systems and improved systems that have embedded computers.

Some embodiments of the current invention may also enable the design of state of the art electronic systems at a greatly reduced non-recurring engineering (NRE) cost by the use of high density 3D FPGAs or various forms of 3D array base ICs with reduced custom masks as been described previously. These systems could be deployed in many products and in many market segments. Reduction of the NRE may enable new product family or application development and deployment early in the product lifecycle by lowering the risk of upfront investment prior to a market being developed. The above advantages may also be provided by various mixes such as reduced NRE using generic masks for layers of logic and other generic mask for layers of memories and building a very complex system using the repair technology to overcome the inherent yield limitation. Another form of mix could be building a 3D FPGA and add on it 3D layers of customizable logic and memory so the end system could have field programmable logic on top of the factory customized logic. In fact there are many ways to mix the many innovative elements to form 3D IC to support the need of an end system, including using multiple devices wherein more than one device incorporates elements of the invention. An end system could benefits from memory device utilizing the invention 3D memory together with high performance 3D FPGA together with high density 3D logic and so forth. Using devices that use one or multiple elements of the invention would allow for better performance and or lower power and other advantages resulting from the inventions to provide the end system with a competitive edge. Such end system could be electronic based products or other type of systems that include some level of embedded electronics, such as, for example, cars, remote controlled vehicles, etc.

Some embodiments of the current invention may include alternative techniques to build IC (Integrated Circuit) devices including techniques and methods to construct 3D IC systems. Some embodiments of the present invention may enable device solutions with far less power consumption than prior art. These device solutions could be very useful for the growing application of mobile electronic devices such as mobile phones, smart phone, cameras and the like. For example, incorporating the 3D IC semiconductor devices according to some embodiments of the present invention within these mobile electronic devices could provide superior mobile units that could operate much more efficiently and for a much longer time than with prior art technology.

3D ICs according to some embodiments of the current invention could also enable electronic and semiconductor devices with much a higher performance due to the shorter interconnect as well as semiconductor devices with far more complexity via multiple levels of logic and providing the ability to repair or use redundancy. The achievable complexity of the semiconductor devices according to some embodiments of the present invention could far exceed what was practical with the prior art technology. These advantages could lead to more powerful computer systems and improved systems that have embedded computers.

Some embodiments of the current invention may also enable the design of state of the art electronic systems at a greatly reduced non-recurring engineering (NRE) cost by the use of high density 3D FPGAs or various forms of 3D array base ICs with reduced custom masks as been described previously. These systems could be deployed in many products and in many market segments. Reduction of the NRE may enable new product family or application development and deployment early in the product lifecycle by lowering the risk of upfront investment prior to a market being developed. The above advantages may also be provided by various mixes such as reduced NRE using generic masks for layers of logic and other generic mask for layers of memories and building a very complex system using the repair technology to overcome the inherent yield limitation. Another form of mix could be building a 3D FPGA and add on it 3D layers of customizable logic and memory so the end system could have field programmable logic on top of the factory customized logic. In fact there are many ways to mix the many innovative elements to form 3D IC to support the need of an end system, including using multiple devices wherein more than one device incorporates elements of the invention. An end system could benefits from memory device utilizing the invention 3D memory together with high performance 3D FPGA together with high density 3D logic and so forth. Using devices that use one or multiple elements of the invention would allow for better performance and or lower power and other advantages resulting from the inventions to provide the end system with a competitive edge. Such end system could be electronic based products or other type of systems that include some level of embedded electronics, such as, for example, cars, remote controlled vehicles, etc.

To improve the contact resistance of very small scaled contacts, the semiconductor industry employs various metal silicides, such as, for example, cobalt silicide, titanium silicide, tantalum silicide, and nickel silicide. The current advanced CMOS processes, such as, for example, 45 nm, 32 nm, and 22 nm employ nickel silicides to improve deep submicron source and drain contact resistances. Background information on silicides utilized for contact resistance reduction can be found in "NiSi Salicide Technology for Scaled CMOS," H. Iwai, et. al., Microelectronic Engineering, 60 (2002), pp 157-169; "Nickel vs. Cobalt Silicide integration for sub-50 nm CMOS", B. Froment, et. al., IMEC ESS Circuits, 2003; and "65 and 45-nm Devices—an Overview", D. James, Semicon West, July 2008, ctr_024377. To achieve the lowest nickel silicide contact and source/drain resistances, the nickel on silicon must be heated to at least 450° C.

Thus it may be desirable to enable low resistances for process flows in this document where the post layer transfer temperature exposures must remain under approximately 400° C. due to metallization, such as, for example, copper and aluminum, and low-k dielectrics present. The example process flow forms a Recessed Channel Array Transistor (RCAT), but this or similar flows may be applied to other process flows and devices, such as, for example, S-RCAT, JLT, V-groove, JFET, bipolar, and replacement gate flows.

It will also be appreciated by persons of ordinary skill in the art that the present invention is not limited to what has been particularly shown and described hereinabove. Rather, the scope of the present invention includes both combinations and sub-combinations of the various features described hereinabove as well as modifications and variations which would occur to such skilled persons upon reading the foregoing description. Thus the invention is to be limited only by the appended claims.

We claim:

1. A method to process a semiconductor device, the method comprising:

providing a substrate;

processing said substrate to form a first level comprising a first single crystal silicon layer and a plurality of first transistors;

forming a first metal layer;

forming a second metal layer, wherein interconnection of said plurality of first transistors comprises said first metal layer and said second metal layer;

processing a second level comprising a plurality of second transistors;

processing a third level comprising a plurality of third transistors, wherein said third level is disposed over said second level;

forming a third metal layer disposed over said third level;

forming a fourth metal layer disposed over said third metal layer;

processing a fourth level comprising a second single crystal silicon layer, wherein said fourth level is disposed over said fourth metal layer, wherein each of said plurality of second transistors comprises a metal gate, and wherein said second metal layer comprises a power delivery network; and forming a via disposed through said second level and through said third level, wherein each of said plurality of third transistors comprises a metal gate, wherein said second level comprises a first array of memory cells, wherein said third level comprises a second array of memory cells, wherein said first level comprises input and output ("IO") circuits, wherein connections of said device to external devices comprises said input and output ("IO") circuits, and wherein said second level is disposed over said first level; processing a connection path from said third metal layer to said second metal layer, wherein said connection path comprises said via; processing a power delivery to at least one of said plurality of second transistors, wherein said power delivery path comprises at least a part of said second metal layer.

2. The method according to claim 1, wherein at least one of said metal gates comprises tungsten.

3. The method according to claim 1, further comprising: processing memory control circuits, wherein said memory control circuits comprise a portion of said plurality of first transistors.

4. The method according to claim 1, further comprising: processing power control circuits, wherein said power control circuits comprise a portion of said plurality of first transistors.

5. The method according to claim 1, further comprising: processing another power delivery path to at least one of said plurality of second transistors, wherein said another power delivery path comprises said via.

6. A method to process a semiconductor device, the method comprising:

providing a substrate;

processing said substrate to form a first level comprising a first single crystal silicon layer and a plurality of first transistors;

forming a first metal layer;

forming a second metal layer, wherein interconnection of said plurality of first transistors comprises said first metal layer and said second metal layer;

processing a second level comprising a plurality of second transistors;

processing a third level comprising a plurality of third transistors, wherein said third level is disposed over said second level;

forming a third metal layer disposed over said third level;

forming a fourth metal layer disposed over said third metal layer;

processing a fourth level comprising a second single crystal silicon layer, wherein said fourth level is disposed over said fourth metal layer, wherein each of said plurality of second transistors comprises a metal gate, and wherein said second metal layer comprises a power delivery network; and forming a via disposed through said second level and through said third level, wherein each of said plurality of third transistors comprises a metal gate, wherein said second level comprises a first array of memory cells, wherein said third level comprises a second array of memory cells, wherein formation of said plurality of second transistors comprises a first lithography step, wherein formation of said plurality of third transistors comprises a second lithography step, wherein said first level comprises input and output ("IO") circuits, wherein connections of said device to external devices comprises said input and output ("IO") circuits, and wherein said second level is disposed over said first level; processing a connection path from said third metal layer to said second metal layer, wherein said connection path comprises said via.

7. The method according to claim 6, further comprising: processing a power delivery path to at least one of said plurality of second transistors, wherein said power delivery path comprises at least a part of said second metal layer.

8. The method according to claim 6, wherein at least one of said metal gates comprises tungsten.

9. The method according to claim 6, further comprising: processing memory control circuits, wherein said memory control circuits comprise a portion of said plurality of first transistors.

10. The method according to claim 6, further comprising: processing power control circuits, wherein said power control circuits comprise a portion of said plurality of first transistors.

11. The method according to claim 6, further comprising: processing a power delivery path to at least one of said plurality of second transistors, wherein said power delivery path comprises said via.

12. A method to process a semiconductor device, the method comprising:

providing a substrate;

processing said substrate to form a first level comprising a first single crystal silicon layer and a plurality of first transistors;

forming a first metal layer;

forming a second metal layer, wherein interconnection of said plurality of first transistors comprises said first metal layer and said second metal layer;

processing a second level comprising a plurality of second transistors;

processing a third level comprising a plurality of third transistors, wherein said third level is disposed over said second level;

forming a third metal layer disposed over said third level;

forming a fourth metal layer disposed over said third metal layer;

processing a fourth level comprising a second single crystal silicon layer, wherein said fourth level is disposed over said fourth metal layer, wherein each of said plurality of second transistors comprises a metal gate, and wherein said second metal layer comprises a power delivery network; and forming a via disposed through said second level and through said third level, wherein each of said plurality of third transistors comprises a metal gate, wherein said second level comprises a first array of memory cells, wherein said third level comprises a second array of memory cells, and wherein said first level comprises power control circuits controlling power delivery to said second transistors, wherein said power control circuits comprise a portion of said plurality of said first transistors, and wherein said second level is disposed over said first level; processing a power delivery to at least one of said plurality of second transistors, wherein said power delivery path comprises at least a part of said second metal layer.

13. The method according to claim 12, further comprising:

processing a connection path from said third metal layer and said second metal layer, wherein said connection path comprises said via.

14. The method according to claim 12, wherein at least one of said metal gates comprises tungsten.

15. The method according to claim 12, further comprising:

processing memory control circuits, wherein said memory control circuits comprise a portion of said plurality of first transistors.

16. The method according to claim 12, further comprising:

processing another power delivery path to at least one of said plurality of second transistors, wherein said another power delivery path comprises said via.

* * * * *